(12) United States Patent
Yasukawa et al.

(10) Patent No.: US 8,475,938 B2
(45) Date of Patent: Jul. 2, 2013

(54) ORGANIC ELECTROLUMINESCENT ELEMENT, LIGHTING DEVICE AND DISPLAY DEVICE

(75) Inventors: Noriko Yasukawa, Tokyo (JP); Rie Katakura, Tokyo (JP); Hideo Taka, Tokyo (JP)

(73) Assignee: Konica Minolta Holdings, Inc., Chiyoda-Ku (JP)

( * ) Notice: Subject to any disclaimer, the term of this patent is extended or adjusted under 35 U.S.C. 154(b) by 275 days.

(21) Appl. No.: 12/934,970

(22) PCT Filed: Apr. 7, 2009

(86) PCT No.: PCT/JP2009/057109
§ 371 (c)(1),
(2), (4) Date: Sep. 27, 2010

(87) PCT Pub. No.: WO2009/133753
PCT Pub. Date: Nov. 5, 2009

(65) Prior Publication Data
US 2011/0017988 A1      Jan. 27, 2011

(30) Foreign Application Priority Data

Apr. 30, 2008 (JP) .................................. 2008118285

(51) Int. Cl.
*H01L 51/54* (2006.01)
*C09K 11/00* (2006.01)

(52) U.S. Cl.
USPC ........... 428/690; 428/917; 313/504; 313/506; 252/301.16; 257/40; 257/E51.028; 257/E51.051

(58) Field of Classification Search
None
See application file for complete search history.

(56) References Cited

U.S. PATENT DOCUMENTS

2006/0280966 A1* 12/2006 Otsu et al. .................... 428/690

FOREIGN PATENT DOCUMENTS

| JP | 2851185 | 11/1998 |
|---|---|---|
| JP | 2004171858 | 6/2004 |
| JP | 200536223 | 2/2005 |
| JP | 200575948 | 3/2005 |
| JP | 2005259442 | 9/2005 |
| JP | 2006/114798 A * | 4/2006 |
| JP | 2006279007 | 10/2006 |
| JP | 200794619 | 4/2007 |
| JP | 2007197587 | 8/2007 |
| JP | 2009-267392 | 11/2009 |
| WO | 2006071411 | 7/2006 |
| WO | 2008044723 | 4/2008 |

OTHER PUBLICATIONS

English language machine translation of JP 2006/114798 A, 2006.*
English language machine translation of JP 2005/036223 A, 2005.*
Japanese Notice of Reasons for Refusal—Patent Application No. P2010-510068—date of drafting: Jan. 17, 2013.
English translation of Notice of Reasons for Refusal—Patent Application No. P2010-510068—date of drafting: Jan. 17, 2013.

\* cited by examiner

*Primary Examiner* — Michael H Wilson
(74) *Attorney, Agent, or Firm* — Lucas & Mercanti, LLP

(57) ABSTRACT

Disclosed is an organic EL device element having high external quantum efficiency and long life time. A lighting device and a display device each using the organic EL device element are also disclosed. The organic EL element comprises plural organic compound layers including a light-emitting layer and at least one hole transport layer, interposed between an anode and a cathode, and a phosphorescent light-emitting compound contained in the light-emitting layer emits light. The organic EL device is characterized in that at least one hole-transport layer contains two or more polymerizable compounds represented by general Formula (1) or two or more polymer compounds having a structural unit derived from a compound.

In the Formula (1) $L_1$ represents a divalent bonding group, $Ar_1$ through $Ar_4$ represent an aromatic group, provided that at least one of $Ar_1$ through $Ar_4$ represents a polymerizable group as a substituent.

20 Claims, 3 Drawing Sheets

ORGANIC ELECTROLUMINESCENT ELEMENT, LIGHTING DEVICE AND DISPLAY DEVICE

This is a 371 of PCT/JP2009/057109 filed Apr. 7, 2009 which in turn claimed the priority of Japanese Patent Application No. 2008-118285 filed Apr. 30, 2008, both applications are incorporated by reference herein.

TECHNICAL FIELD

The present invention relates to an electroluminescent element and a lighting device and a display device using the electroluminescent element.

BACKGROUND

An organic electroluminescent element (it is also referred to as an organic EL element hereafter) is a whole solid element comprised of an organic layer having a thickness between electrodes of only 0.1 µm or so, and light emission van be attained by relatively low voltage such as 3 to 20 V, and is a technology expected to realize as a flat surface display or lighting device.

Further the an organic EL element utilizing phosphorescence emission recently found is considered to realize principally around four times emission efficiency in comparison to a conventional organic EL element utilizing fluorescence emission, and research and development of the emission element such as layer arrangement and electrodes in addition to the development of the materials around the world.

The constitution of the organic EL element has a simple constitution such that an organic layer is interposed by a transparent electrode and a counter electrode, and is composed of extreme less number of parts in comparison with a liquid crystal display which is representative of flat surface display, and therefore the production cost is expected to be lower. However the performance and cost are far from the liquid crystal display. It is considered that the low productivity is the cause of the cost in particular.

Almost of all commercialized organic EL is produced by so called a vapor deposition method in which a layer is formed by depositing by evaporation of a low molecule weight material. This method is very excellent in the efficiency and lifetime since the low molecular weight compounds easy to purify can be used for the organic EL material (that is, a high purity material is easy to obtain), and it is easy to produce laminate structure. However the apparatus for forming the layers is restricted since the evaporation is conducted under high vacuum condition of $10^{-4}$ Pa or lower, and this method has deficiency of low through put because that it can be only applied to a substrate having small area and takes long time for forming layers of multiple layer lamination.

It is problematic in case of applying the lighting usage or large area electronic display, and this is one of causes not to utilize in these applications.

Coating method in which an organic layer is produced by such a process as spin coating, ink jet, printing, and spray coating can form films in the normal pressure, and further is suitable to form a uniform film in large area.

The coating method has characteristics that non-uniform light emitting is not apt to generate for large format element, as multiple organic materials can be precisely mixed and it is easy to adjust, for example, the ratio of the dopant to the light emission material, since necessary materials such as polymer materials and or low molecular materials are coated to form a thin layer by making them solution or dispersion. Therefore, it is very advantageous in production cost.

Materials used in the coating method include those of high molecular weight materials and low molecular weight materials, and the high molecular weight materials are difficult to use since it is difficult to purify and very slight amount of impurity causes large reduction in emission lifetime, particular in the organic electroluminescence element.

Conventionally known low molecular weight hole transport materials applicable to a hole transport layer are disclosed in, for example Patent Document 1. Hole transport layer was formed via coating method employing these compounds and the performance of the element was evaluated. They are found to have problems that working voltage rises in comparison with elements produced by evaporation method, and further, an upper layer can not be formed on the lower layer as the hole transport layer of the lower layer was dissolved by solvent of the upper layer when the upper layer is applied by coating method by an examination of these material. To dissolve the problems, for example, a technology using triarylamine derivative having a polymerizable functional group is disclosed in, for example, Patent Document 2 and Patent Document 3.

It was found that there remains a problem that durability against solvent is insufficient and the upper layer can not be laminated since cross linking density between the compounds in the layer becomes low when the number of the polymerizable functional group is small, as a result of a study in detail by the inventor of the invention. On the other side, when the number of the polymerizable functional groups is increased, energy at the cross linking by light or heat becomes large and inclination of remaining the polymerizable functional groups without relating to cross linking, and therefore it is one of the cause to deteriorate the lifetime of the element since the remaining polymerizable functional groups have high activity.

Examples using a combination of triaryl amine having polymerizable functional group and a compound polymerizable compound having structure other than triarylamine in the hole transport layer is disclosed in, for example, Patent Document 4. However there is a problem that the transport activity having the hole transport layer is inhibited and the carrier transport in the hole transport layer is restrained when large amount of the compound polymerizable compound having structure other than triarylamine is used mixed.

PRIOR ART DOCUMENT

Patent Document (Patent Document 1) JP Patent No. 2851185
(Patent Document 2) JP A 2005-36223
(Patent Document 3) JP A 2007-94619,
(Patent Document 4) JP A 2005-36223

SUMMARY OF THE INVENTION

Problem to be Dissolved by the Invention

An object of the invention is to provide an organic EL element having high external quantum efficiency and long life time, and comprising hole transport layer which is cross linked sufficiently for shorter time and lower temperature, has less damage due to ultra violet ray and heat, and has higher smoothness of the surface than a conventional organic EL element material, and further to provide a lighting device and a display device using the organic EL element.

Technical Means to Dissolve the Problems

The above described object of the invention is attained by as follows.

1. An organic EL element comprising plural organic compound layers including a light-emitting layer and at least one hole transport layer interposed between an anode and a cathode, a phosphorescent light-emitting compound contained in the light-emitting layer emitting light, wherein, at least one hole-transport layer contains two or more polymerizable compounds represented by Formula (1) or a polymer compound having a structural unit derived from two or more of the polymerizable compounds,

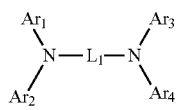

Formula (1)

in Formula (1), $L_1$ represents a divalent bonding group containing an aromatic ring, $Ar_1$ through $Ar_4$ represent an aromatic group, provided that at least two of $Ar_1$ through $Ar_4$ contain a polymerizable group as a substituent.

2. The organic electroluminescent element described in above mentioned 1, wherein above mentioned polymerizable group is represented by any one of Formula (a-1) through (a-3).

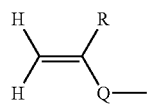

Formula (a-1)

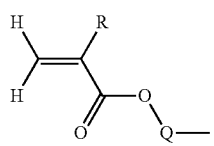

Formula (a-2)

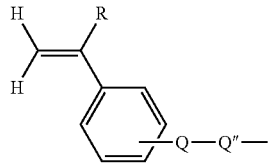

Formula (a-3)

In Formula (a-1) through (a-3), R represents a hydrogen atom or a methyl group. Q represents a single bond, a bonding group represented by —$(CH_2)_n$— or —O—, or a 2-valent bonding group composed of plural groups of —$(CH_2)_n$— or —O—. Q' represents a bonding group of —$(CH_2)_n$— or —O—, or a 2-valent bonding group composed of plural groups of —$(CH_2)_n$— or —O—, wherein n represents an integer of 1 or more.

3. The organic electroluminescent element described in above mentioned 1 or 2, wherein $L_1$ is a biphenylene group in Formula (1).

4. The organic electroluminescent element described in above mentioned 3, wherein above mentioned Formula (1) is represented by Formula (3).

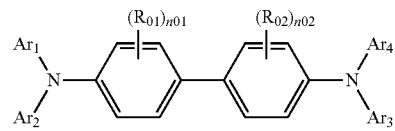

Formula (3)

In the Formula, $Ar_1$ to $Ar_4$ represents an aromatic group. $R_{01}$ and $R_{02}$ represent a substituent, and n01 and n02 each represent an integer of 0 to 4, provided that at least two of $Ar_1$ to $Ar_4$ have a polymerizable group as a substituent.

5. The organic electroluminescent element described in above mentioned 1 or 2, wherein $L_1$ in the above mentioned Formula (1) is a phenylene group.

6. The organic electroluminescent element described in above mentioned 1 or 2, wherein the above mentioned Formula (1) is represented by Formula (6) described below.

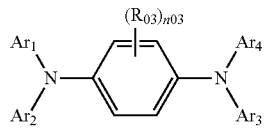

Formula (6)

In the Formula, $Ar_1$ to $Ar_4$ represent an aromatic group, provided that at least two of $Ar_1$ to $Ar_4$ have a polymerizable group as a substituent. $R_{03}$ represents a substituent, and n03 represent an integer of 0 through 4.

7. The organic electroluminescent element described in any one of above mentioned 1 to 6, wherein $Ar_1$ and $Ar_3$ represent an aromatic group having a polymerizable group as a substituent in above mentioned Formula (1), Formula (3) and Formula (6).

8. The organic electroluminescent element described in any one of above mentioned 1 to 7, wherein the aromatic group having a polymerizable group as a substituent among $Ar_1$ to $Ar_4$ is a phenyl group.

9. The organic electroluminescent element described in any one of above mentioned 1 to 8, wherein at least one of the above mentioned hole-transport layer contains two or more polymerizable compounds represented by Formula (1) or a polymer compound having a structural unit derived from two or more of the polymerizable compounds.

10. The organic electroluminescent element described in any one of above mentioned 1 to 9, wherein above mentioned polymerizable group is represented by above mentioned Formula (a-1).

11. The organic electroluminescent element described in any one of above mentioned 1 to 10, wherein Q in the above mentioned Formula (a-1) is a single bond.

12. The organic electroluminescent element described in any one of above mentioned 1 to 11, wherein the above mentioned hole transport layer is manufactured via a wet process forming a film.

13. The organic electroluminescent element described in any one of above mentioned 1 to 12, wherein the above mentioned hole transport layer is manufactured via processes in which after film forming by two or more polymerizable compounds represented by above mentioned Formula (1) by a wet process, the polymerizable compounds are polymerized to form the hole transport layer.

14. The organic electroluminescent element described in any one of above mentioned 1 to 13, wherein the above mentioned light-emitting layer is manufactured via a wet process forming a film.

15. The organic electroluminescent element described in any one of above mentioned 1 to 14, wherein at least one of the phosphorescent light-emitting compounds contained in the above mentioned light-emitting layer is represented by Formula (2).

Formula (2)

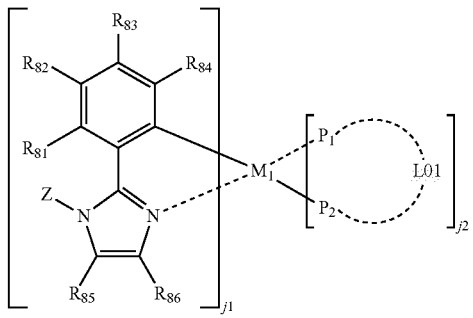

In the Formula, Z represents a hydrocarbon ring group, an aromatic heterocyclic ring group or a heterocyclic group. $R_{81}$ through $R_{86}$ represent a hydrogen atom or a substituent. $P_1$-L01-$P_2$ represents a 2-dentate ligand, $P_1$ and $P_2$ are independently a carbon atom, a nitrogen atom or oxygen atom. L01 represents an atomic group forming a 2-dentate ligand together with $P_1$ and $P_2$. j1 represents an integer of 1 to 3, and j2 represent an integer of 0 to 2 wherein j1+j2 is 2 or 3; and $M_1$ is a metal element of 8 to 10 group in the periodic table.

16. The organic electroluminescent element described in any one of above mentioned 1 to 15, wherein the above mentioned phosphorescent light-emitting compound is an iridium complex.

17. The organic electroluminescent element described in any one of above mentioned 1 to 16, which emits white light.

18. A lighting device comprising the organic electroluminescent element described in any one of above mentioned 1 to 17.

19. A display device comprising the organic electroluminescent element described in any one of above mentioned 1 to 17.

Advantage of the Invention

The inventors have found that it is possible to manufacture a film cross linked sufficiently for shorter time and lower temperature by employing two or more kinds of polymerizable compounds having a specific structure simultaneously than the case employing a single kind solely as a result of their earnest study. Therefore, small energy is required for cross linking and it is possible to restrain damages due to UV ray or heat. Further it has bee found that the obtained film has high amorphous property and very high surface smoothness by mixing two or more compounds.

Further, it is possible to form plural layers via coating method because the polymerizable compounds represented by Formula (1) in relation to the invention are used for the hole transport layer and therefore, an organic EL element having high performance, such as high external quantum efficiency, long life time can be provided with high cost performance.

A lighting device and a display device employing the organic EL element can be provided in addition thereto.

EMBODIMENTS TO PRACTICE THE INVENTION

Figure 1:
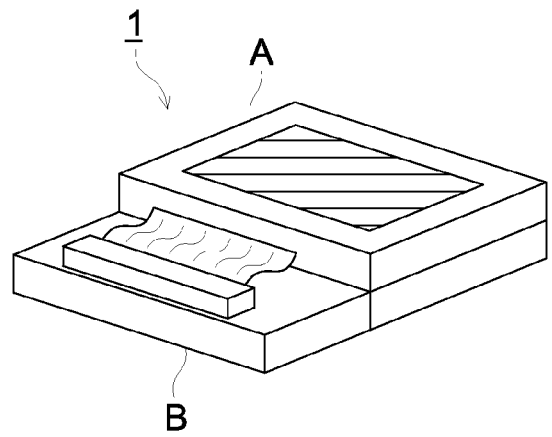
FIG. 1: A schematic view of an example of a display device composed of an organic EL element.

The invention will be described in detail.
<<Layer Arrangement of Organic EL Element, Organic Compound Layer>>

The layer arrangement of the organic EL element, Organic compound layer and the like of the invention are described. Preferable concrete examples of the layer are shown below, though the invention is not limited to them.
(i) Anode/hole transport layer/Light-emitting layer/Electron transport layer/Cathode
(ii) Anode/hole transport layer/Light-emitting layer/hole blocking layer/Electron transport layer/Cathode
(iii) Anode/hole transport layer/Light-emitting layer/hole blocking layer/Electron transport layer/Cathode buffer layer/Cathode
(iv) Anode/Anode buffer layer/hole transport layer/Light-emitting layer/hole blocking layer/Electron transport layer/Cathode buffer layer/Cathode
(v) Anode/Anode buffer layer/hole transport layer/Light-emitting layer/Electron transport layer/Cathode buffer layer/Cathode It is preferable to contain plural organic compound layers as composing layers in an organic EL element of the invention, and examples of the organic compound layer include, for example, a hole transport layer, a light-emitting layer, a hole blocking layer, an electron transport layer and the like among the composing layers. In addition thereto, a composing layer containing an organic compound such as an anode buffer layer, a cathode buffer layer and the like is defined as the organic compound layer in relation to the invention.

Further when an organic compound is used in the anode buffer layer, cathode buffer layer and like, these layers are regarded as composing the organic compound layer respectively.

The above mentioned an organic compound layer includes a layer containing "an organic EL element material applicable for composing layers of the organic element".

It is preferable that the maximum emission wavelength of the blue light emitting layer is 430 to 480 nm, the maximum emission wavelength of the green light emitting layer is 510 to 550 nm, and the maximum emission wavelength of the red light emitting layer is 6000 to 640 nm, as well as the display device employing these is preferable. It is also allowed to laminating at least these three layers to form a white light emitting layer. A non-emitting intermediate layer may be provided between the emitting layers.

The organic EL element of the invention is preferably a white light emitting layer and a lighting device employing these is preferable.

Each layer composing the organic EL element of the present invention will now be described.

<Injection Layer: Electron Injection Layer, Hole Injection Layer>

An injection layer is listed as an example of the anode buffer layer and cathode buffer layer. The injection layer is provided when it is required and includes an electron injection layer and a hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a hole injection layer (an anode buffer layer) and an electron injection layer (a cathode buffer layer).

An anode buffer layer (a hole injection layer) is also detailed in such as JP-A H09-45479, H09-260062 and H08-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A H06-325871, H09-17574 and H10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide. The above-described buffer layer (injection layer) is preferably a very film, and the layer thickness is preferably in a range of 0.1 nm to 5 μm although it depends on a raw material.

<<Hole Transport Layer>>

Hole transport layer is composed of a hole transport material having a function of hole transport, and includes hole injection layer, electron blocking layer and hole transport layer, in a broad meaning. The hole transport layer can be provided as a single layer or plural layers.

Hole transport layer composing the organic EL element of the present invention is obtained by polymerization reacting of two or more kinds of polymerizable compound represented by Formula (1) by applying heat or ultra violet ray. It is important to mix two or more to cross link sufficiently with shorter time and lower temperature and obtain stable layer having high amorphous property and improved surface condition of the hardened layer, and further hole transports smooth in comparison with the case employing one polymerizable compound. Further, damage due to ultra violet ray or heat is inhibited since energy required for crosslinking is smaller than the case of singly used.

(Polymerizable Compound Represented by Formula (1) and Polymer Compound Derived from the Compound)

In Formula (1), Ar1 to Ar4 represent substituted or non-substituted an aromatic group, which may be same or different each other. The aromatic group includes an aromatic hydrocarbon group and an aromatic heterocyclic ring group, and practically a phenyl group, a naphthyl group, a phenanthryl group, a biphenyl group, a pyridyl group, a fluorenyl group, a carbazolyl group, a dibenzofuranyl group, a dibenzothiophenyl group and the like. A substituent which may substitutes the above mentioned group includes an alkyl group (such as methyl group, ethyl group and i-propyl group), an alkenyl group (such as vinyl group), alkenylcarboxy group (such as vinylcarbonyloxy group), halogen atom (such as fluorine atom, chlorine atom and bromine atom), a cycloalkyl group (such as cyclohexyl group), alkoxy group (such as methoxy group and ethoxy group), aryloxy group (such as benzoxy group), aralkyloxy group (such as benzyloxy group), aryl group (such as phenyl group) and the like, and further these may be substituted with the substituent. The aromatic group represented by $Ar_1$ to $Ar_4$ is preferably an aromatic hydrocarbon ring, and more preferably at least one of $Ar_1$ to $Ar_4$ is a phenyl group.

At least two of $Ar_1$ to $Ar_4$ have a polymerizable group as a substituent, and more preferably at least one of $Ar_1$ and $Ar_2$, as well as at least one of $Ar_1$ and $Ar_4$ have a polymerizable group as a substituent. It is preferable that $Ar_1$ to $Ar_4$ substituted by a polymerizable group is a phenyl group. $L_1$ represents a 2-valent bonding group. The 2-valent bonding group includes a phenylene group, a biphenylene group, a 2,7-9,9-dimethyl fluorenylene group, a terphenylene group, a quarterphenylene group, 3,6-dibenzofuran group, 3,6-dibenzothiophenylene, and the like, and it is preferable that at least one of the polymerizable compound represented by Formula (1) is represented by Formula (3)

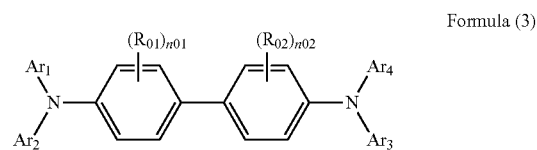

Formula (3)

In Formula (3), $Ar_1$ to $Ar_4$ are the same as $Ar_1$ to $Ar_4$ in Formula (1). $R_{O1}$ and $R_{O2}$ represent a substituent, and examples of the substituent include those same as a substituent listed as for Formula (1), and those adjacent to each other may form a ring by bonding. n01 and n02 each represent an integer of 0 to 4.

It is preferable that polymerizable compound represented by Formula (3), or a polymer compound derived from the compound is contained in the hole transport layer in ratio of 50% or more by weight, more preferably 75% or more and particularly preferably 90% or more.

It is preferable that the compound represented by Formula (3) is more preferably those represented by Formula (4).

Formula (4)

In Formula (4), $Ar_1$ and $Ar_3$ represent a condensed aromatic group (such as naphthyl group, phenanthryl group, fluorenyl group, carbazolyl group, dibenzofuranyl group and dibenzothiophenyl group). $R_{O1}$ to $R_{O2}$ represent a substituent, and examples of the substituents include the same substituents mentioned in Formula (1). $R_{O1}$ and $R_{O2}$, adjacent to each other may form a ring by bonding. n01 and n02 each represent an integer of 0 to 4. n03 and n04 each represent an integer of 0 to 5.

It is preferable that the compound represented by Formula (4) is one represented by Formula (5).

Formula (5)

In the Formula (5), $Ar_1$ and $Ar_3$, $R_{O1}$ to $R_{O4}$, and n01 to n04 represent the same as those in Formula (4). $X_1$ and $X_2$ represent a polymerizable group.

It is more preferable that at least one of the polymerizable compound represented by Formula (1) is those represented by Formula (3), and the another polymerizable compound represented by Formula (1) is one represented by Formula (6').

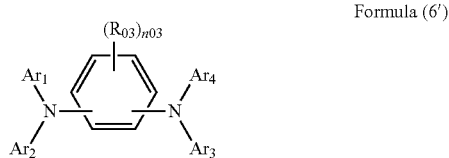

Formula (6')

In Formula (6'), $Ar_1$ to $Ar_4$ are the same as $Ar_1$ to $Ar_4$ in Formula (1). $R_{03}$ represent a substituent, and examples of the substituent include those same as a substituent listed as for Formula (1), and those adjacent to each other may form a ring by bonding. n03 each represent an integer of 0 to 4.

It is preferable that the compound represented by Formula (6') is one represented by Formula (6).

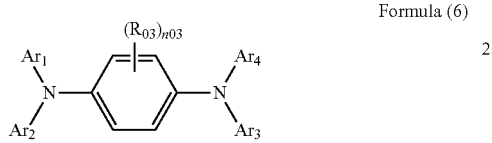

Formula (6)

In Formula (6), $Ar_1$ to $Ar_4$ are the same as $Ar_1$ to $Ar_4$ in Formula (1). $R_{03}$ represent a substituent, and examples of the substituent include those same as a substituent listed as for Formula (1), and those adjacent to each other may form a ring by bonding. n03 each represent an integer of 0 to 4.

It is further preferable that the compound represented by Formula (6) is one represented by Formula (7).

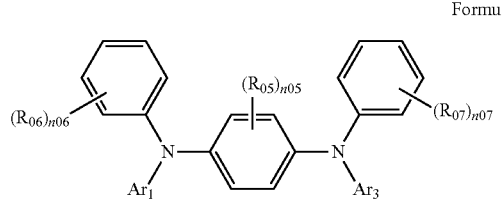

Formula (7)

In Formula (7), $Ar_1$ and $Ar_3$ represent a condensed aromatic group (such as phenyl group, naphthyl group, phenanthryl group, fluorenyl group, carbazolyl group, dibenzofuranyl group and dibenzothiophenyl group). $R_{05}$ to $R_{07}$ represent a substituent, and examples of the substituents include the same substituents mentioned in Formula (1). n06 and n07 each represent an integer of 0 to 5. n03 and n04 each represent an integer of 0 to 5. At least two of $R_{06}$ and $R_{07}$ or a substituent of $Ar_1$ and $Ar_3$ represent a polymerizable group It is preferable that the compound represented by Formula (7) is one represented by Formula (8).

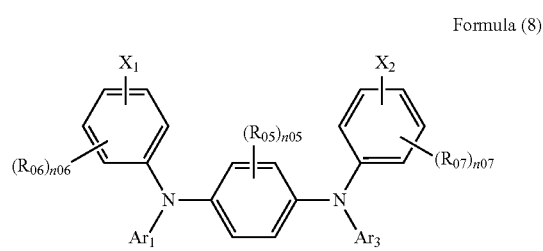

Formula (8)

In the Formula (8), $Ar_1$ and $Ar_3$, $R_{05}$ to $R_{07}$, and n05 to n07 represent the same as those in Formula (7). $X_1$ and $X_2$ represent a polymerizable group.

Example of the polymerizable group includes preferably one represented by Formula (a-1) through (a-3), and more preferably one represented by Formula (a-1). In any one of polymerizable groups represented by Formula (a-1) through (a-3), R represents a hydrogen atom or a methyl group. Q represents a single bond, or a bonding group represented by —$(CH_2)_n$— or —O—, or a 2-valent bonding group composed of plural groups of —$(CH_2)_n$— or —O—. Q' represents a bonding group of —$(CH_2)_n$— or —O—, or a 2-valent bonding group composed of plural groups of —$(CH_2)_n$— or —O—, wherein n represent an integer of 1 or more. Q preferably represents a single bond in Formula (a-1), which is more preferably a vinyl group.

Practical examples of the polymerizable compound represented by Formula (1) are shown below, however the invention is not restricted to these.

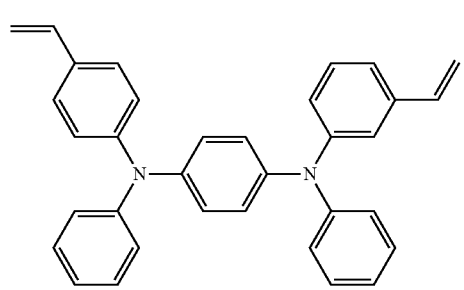

HT-001

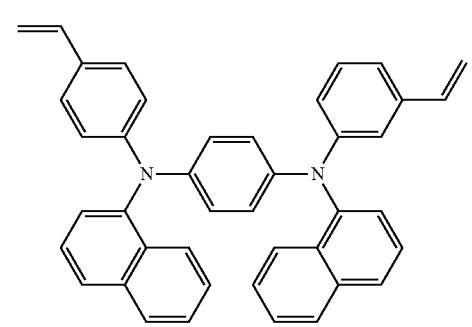

HT-002

-continued
HT-003
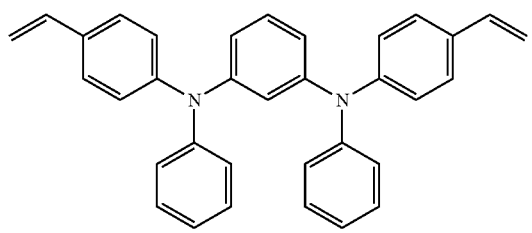
HT-004
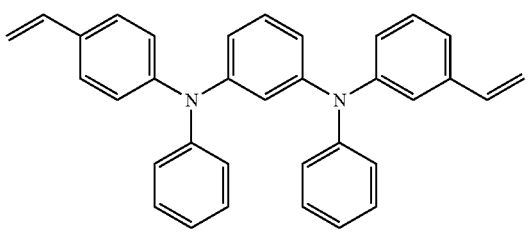
HT-005
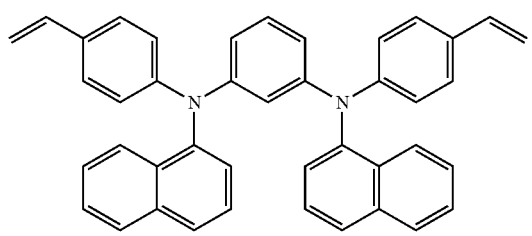
HT-006
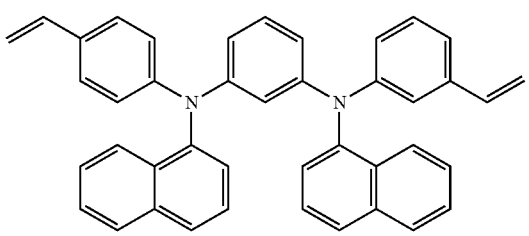
HT-007
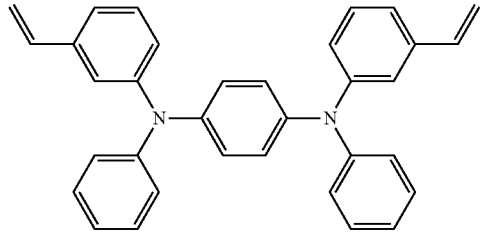
HT-008
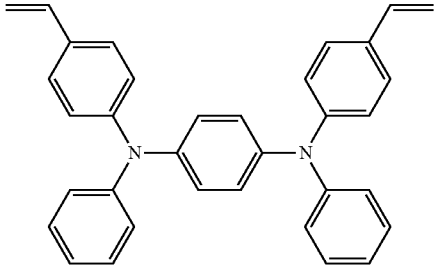
HT-009
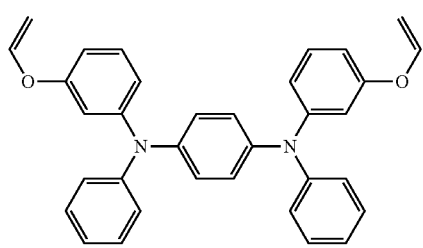
HT-010
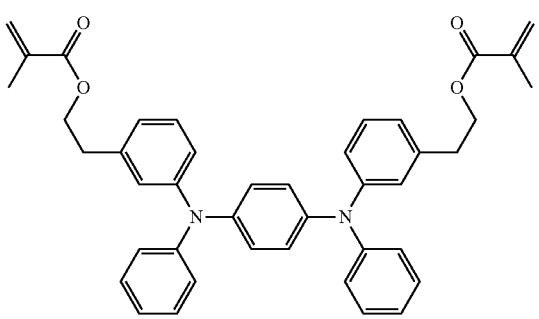
HT-011
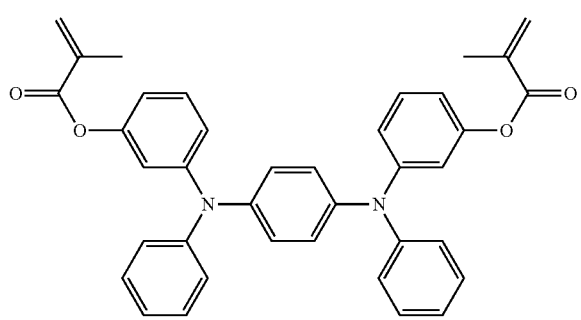
HT-012
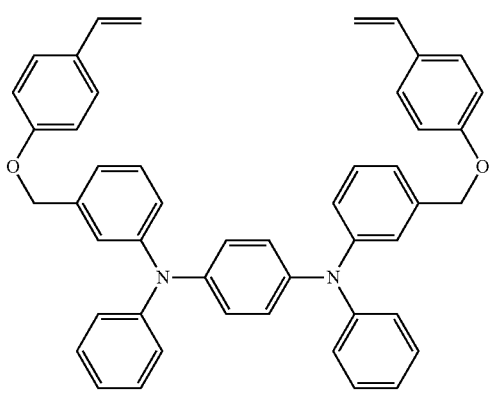

-continued
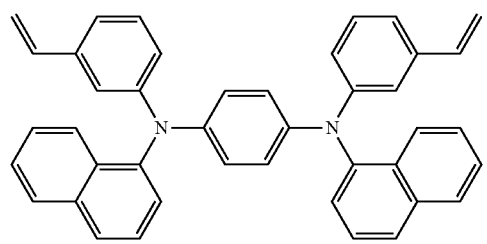
HT-013
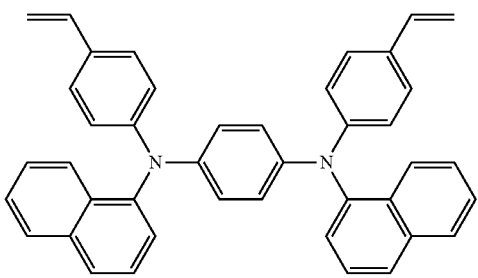
HT-014
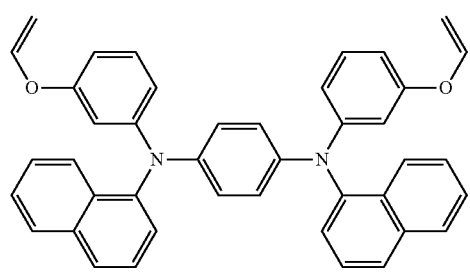
HT-015
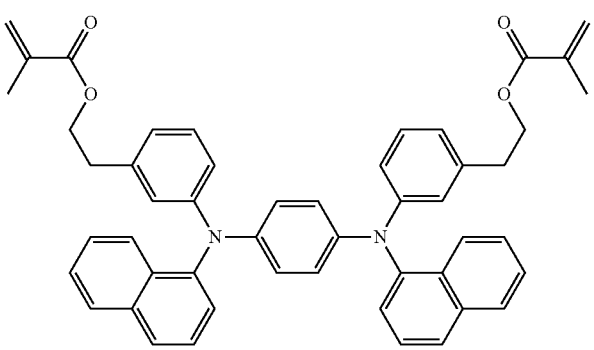
HT-016
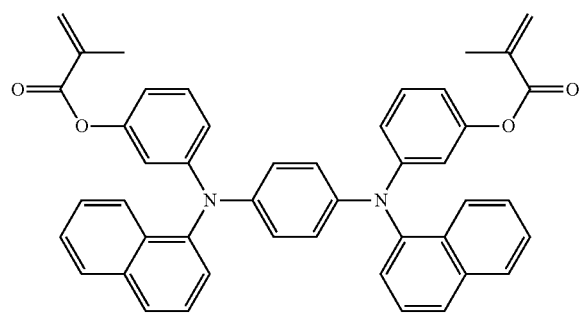
HT-017
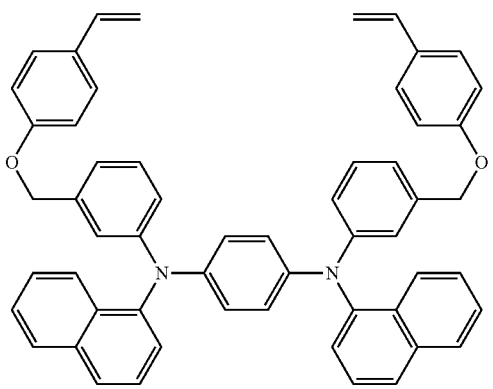
HT-018
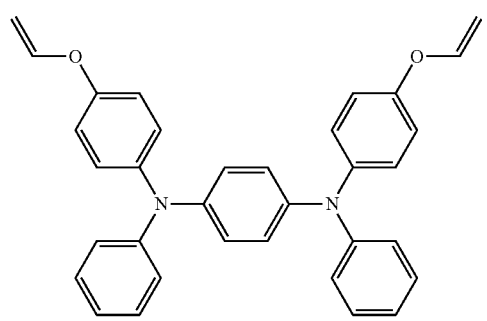
HT-019
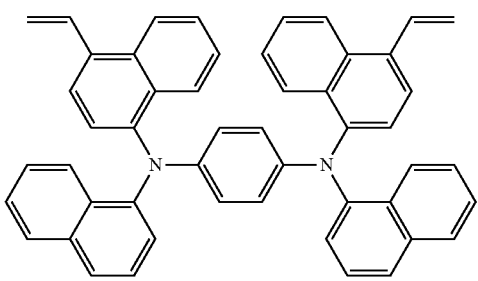
HT-020

-continued
HT-021
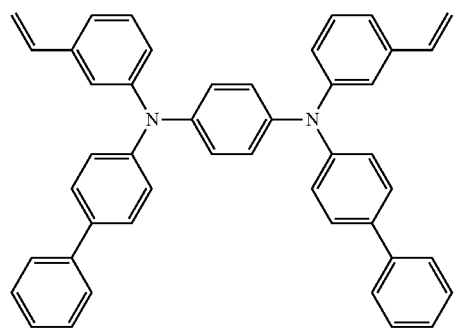
HT-022
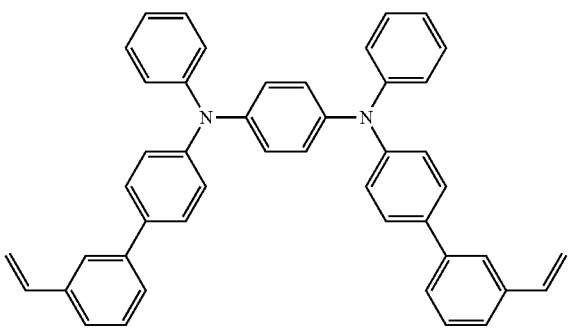
HT-023
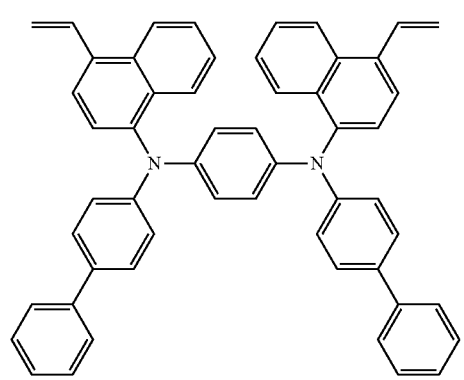
HT-024
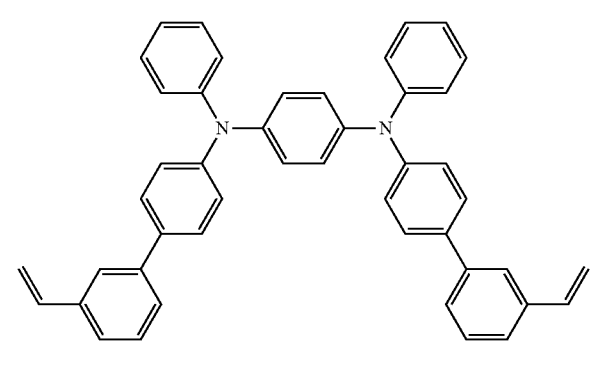
HT-025
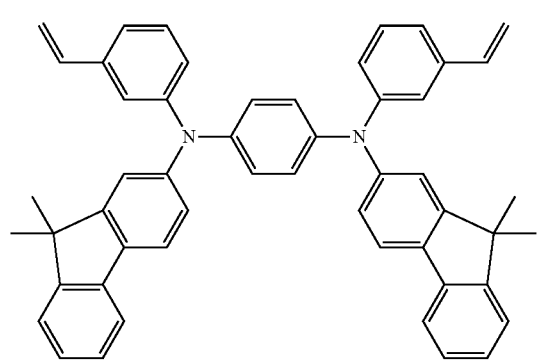
HT-026
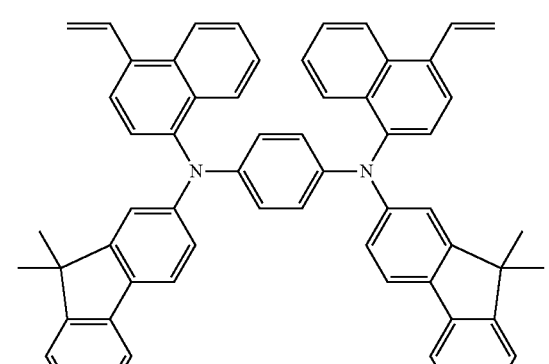
HT-027
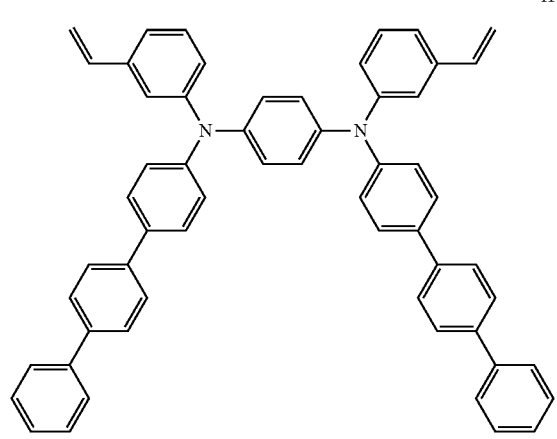
HT-028
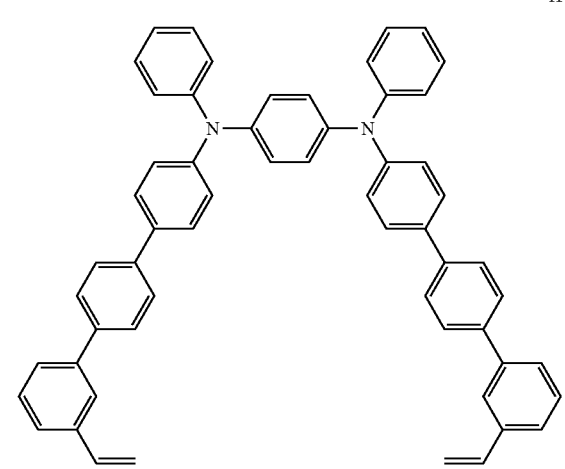

-continued
HT-029
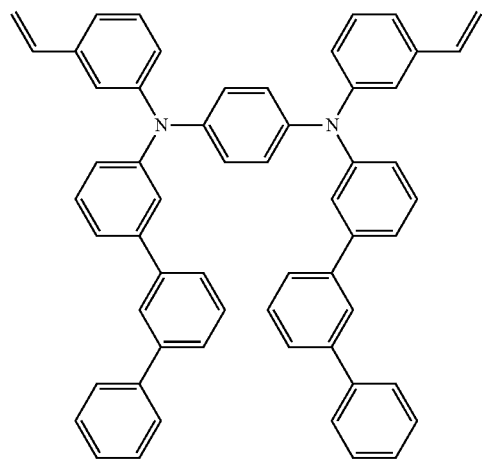
HT-030
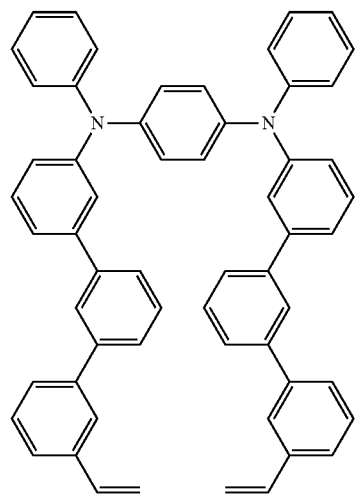
HT-031
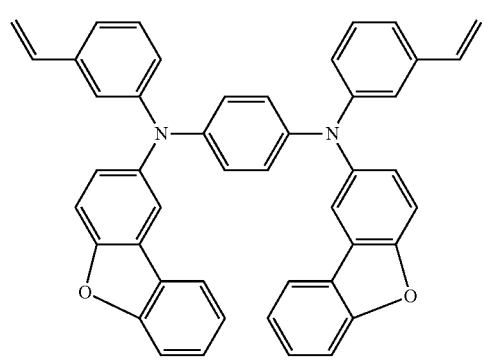
HT-032
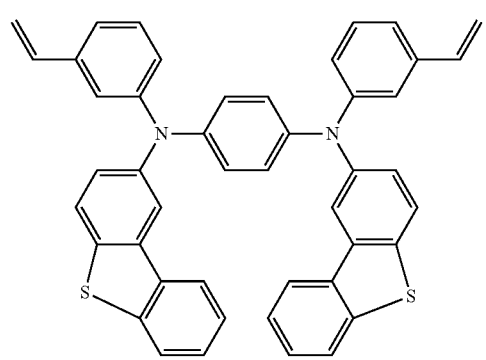
HT-033
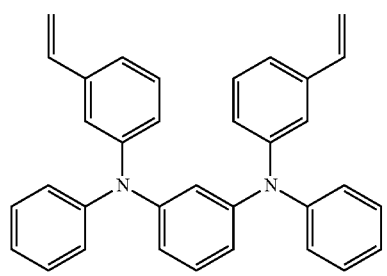
HT-034
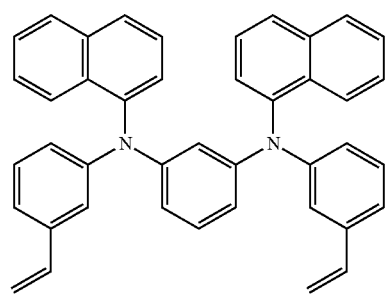
HT-035
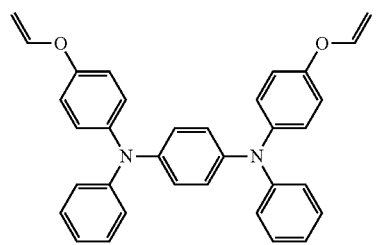
HT-036
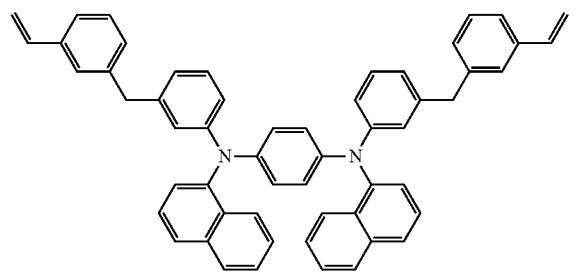

-continued
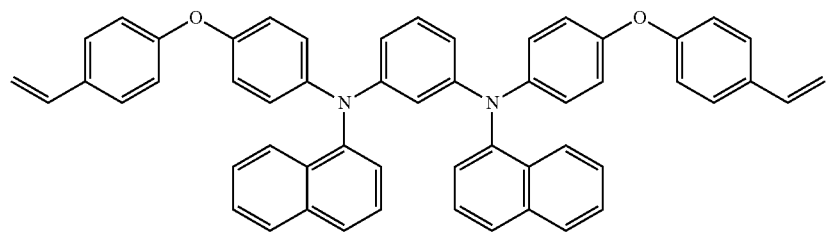
HT-037
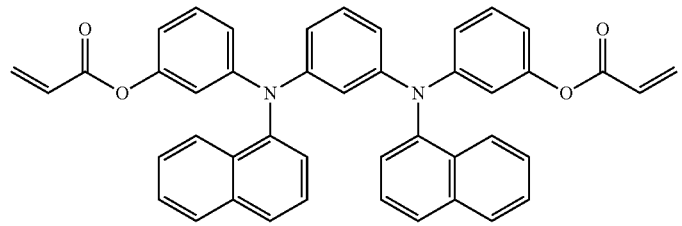
HT-038
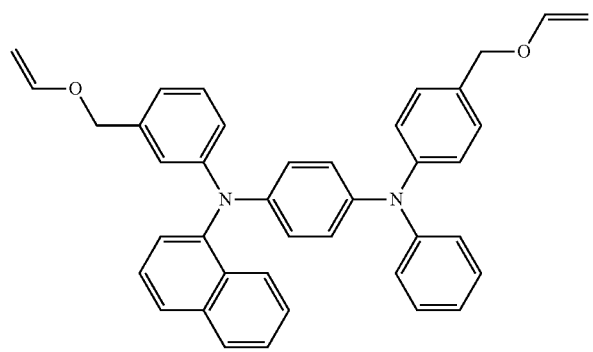
HT-039
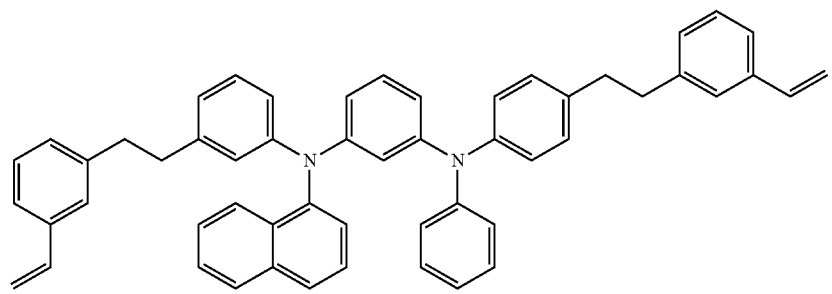
HT-040
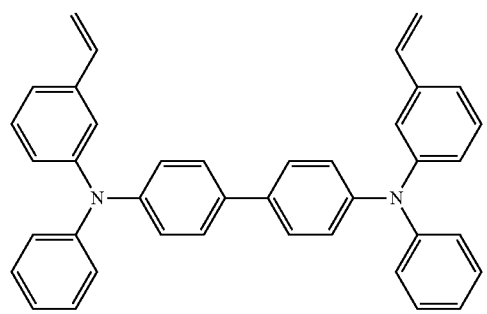
HT-041
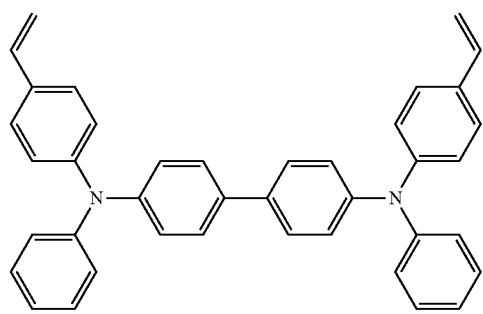
HT-042

-continued
HT-043
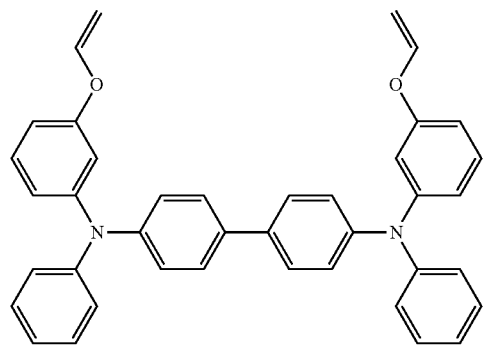
HT-044
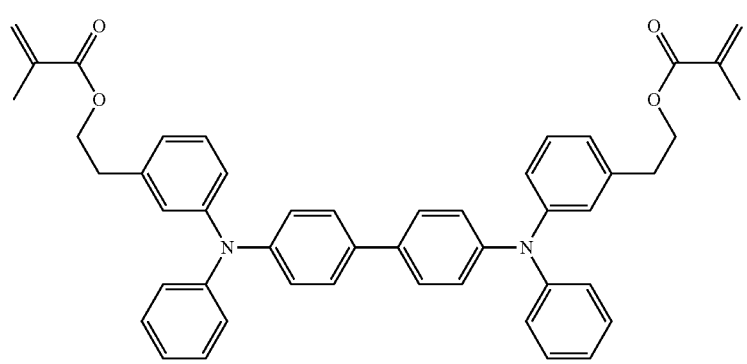
HT-045
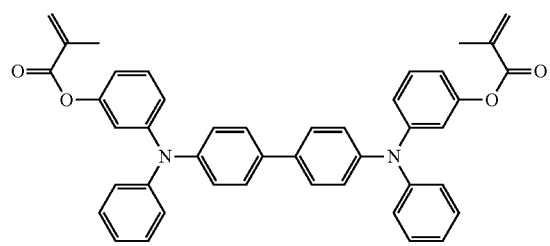
HT-046
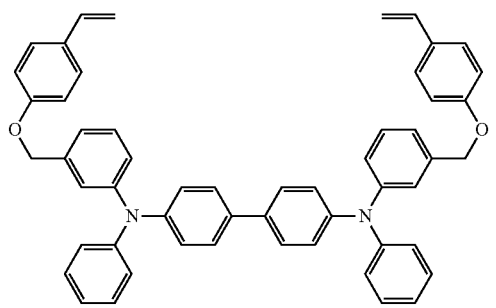
HT-047
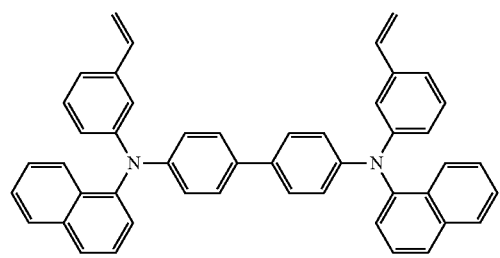
HT-048
HT-049
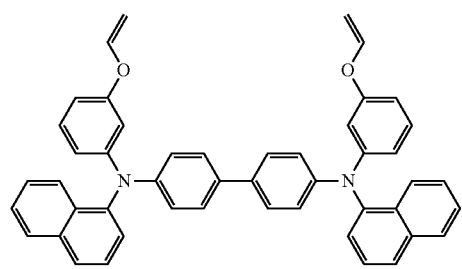
HT-050
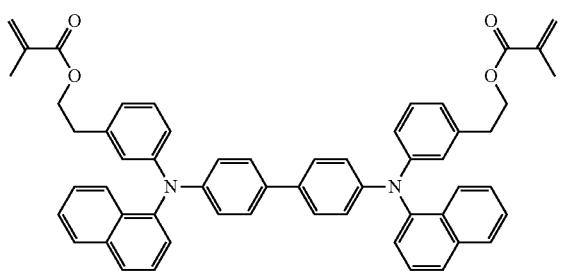

-continued
HT-051
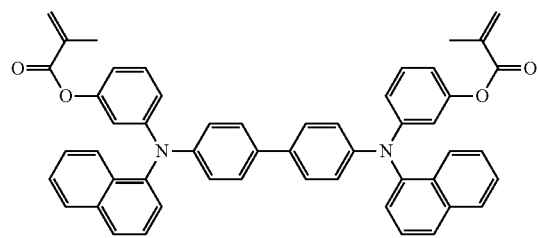
HT-052
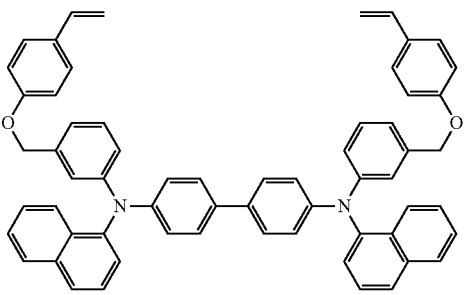
HT-053
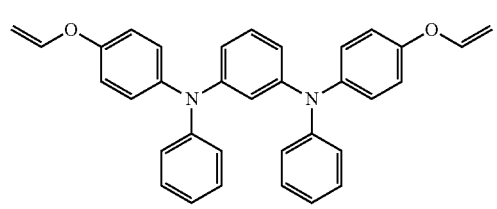
HT-054
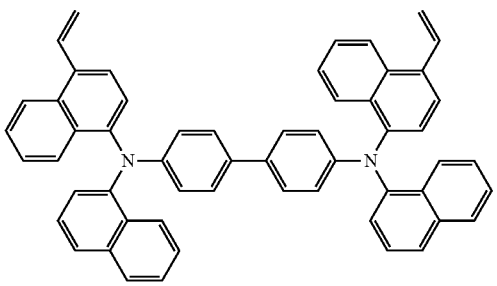
HT-055
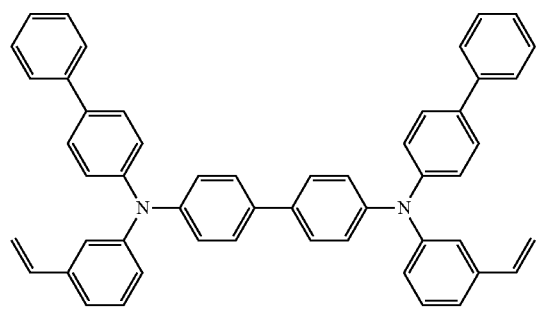
HT-056
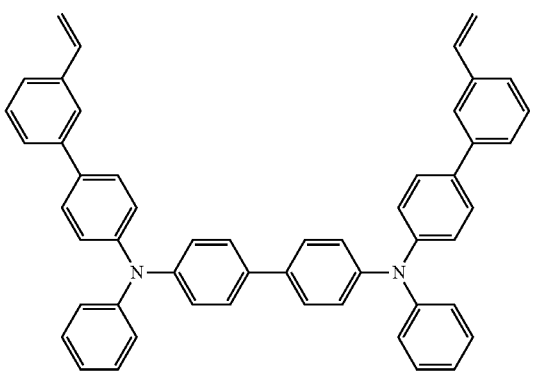
HT-057
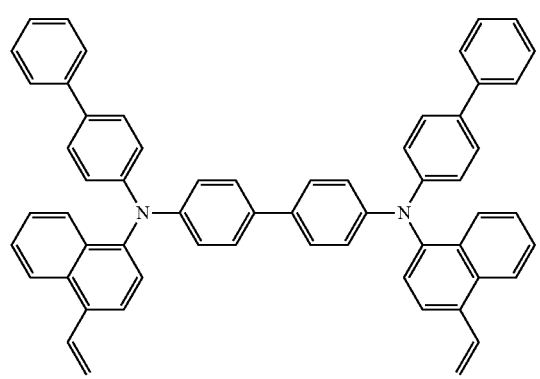
HT-058
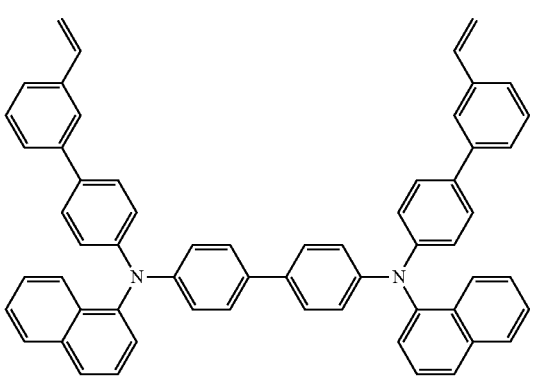

-continued
HT-059
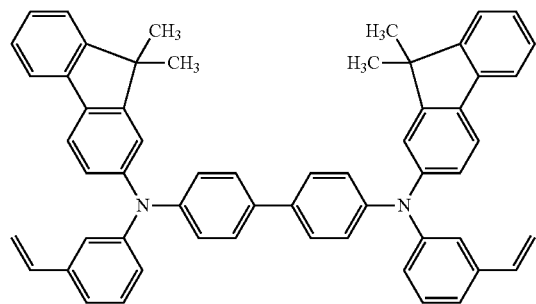
HT-060
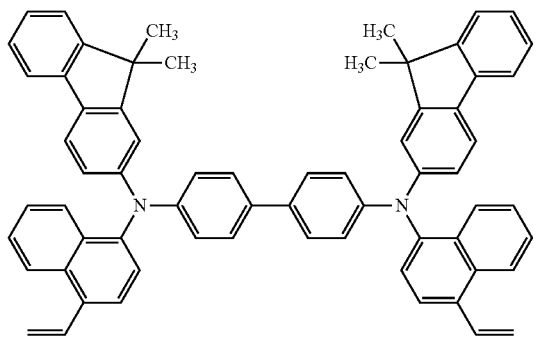
HT-061
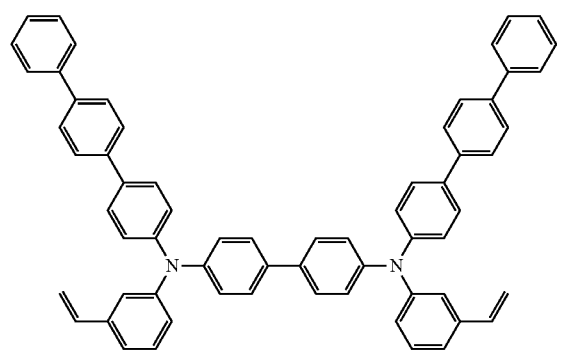
HT-062
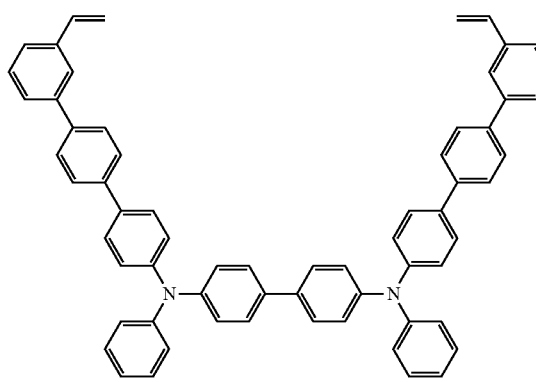
HT-063
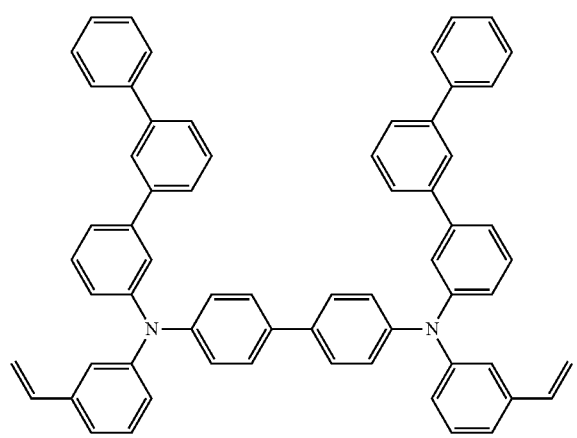
HT-064
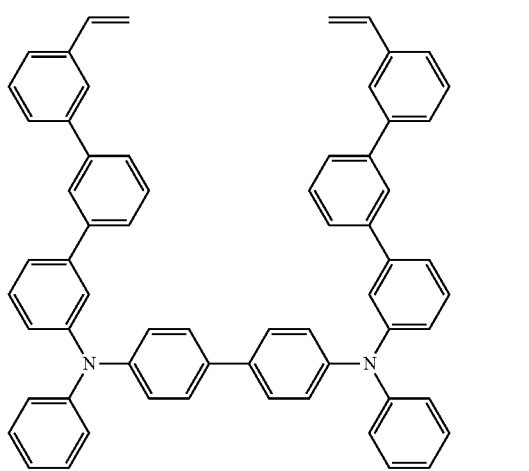
HT-065
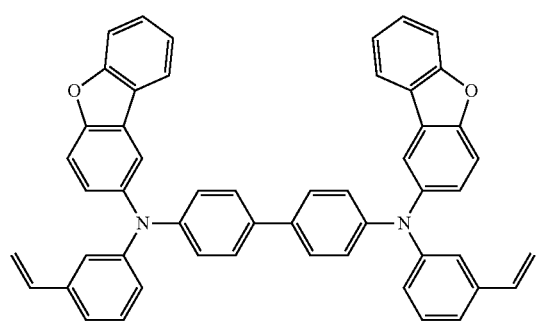
HT-066
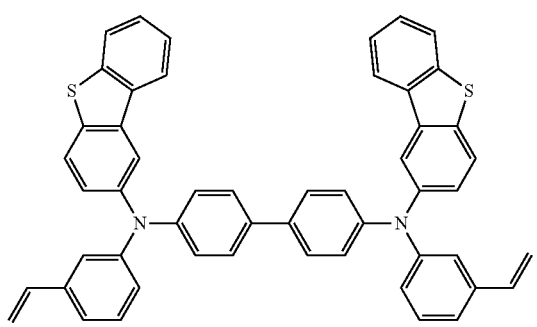

-continued
HT-067
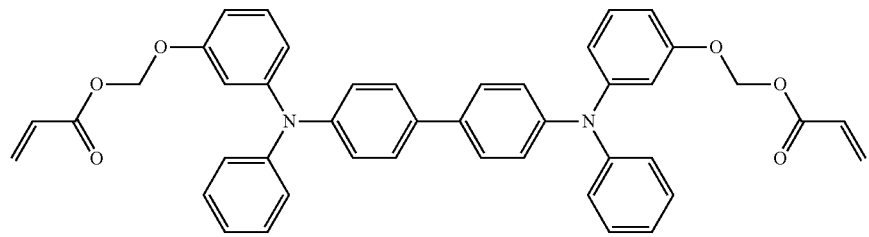
HT-068
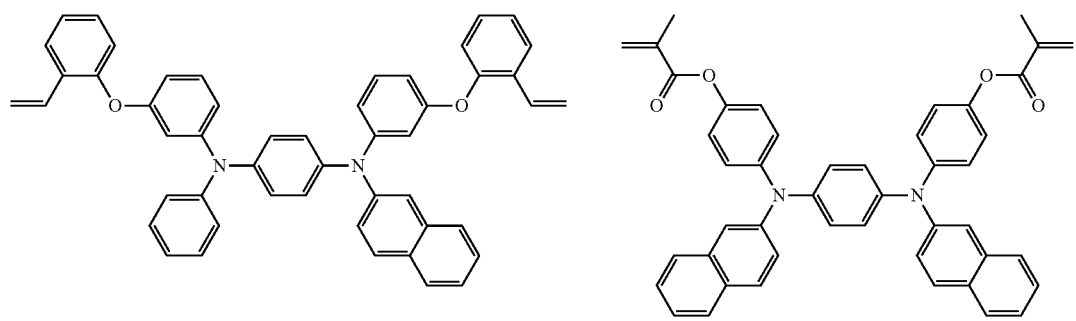
HT-069
HT-070
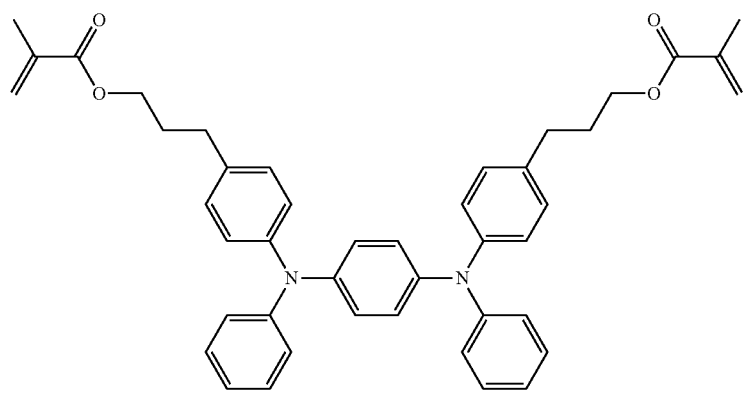
HT-071
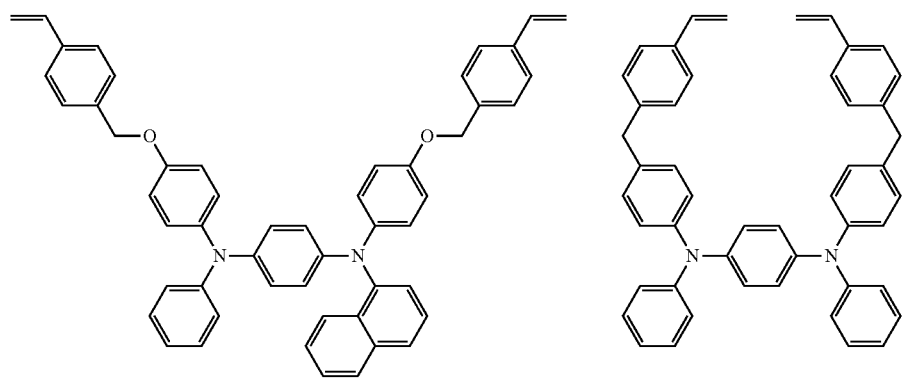
HT-072

-continued
HT-073
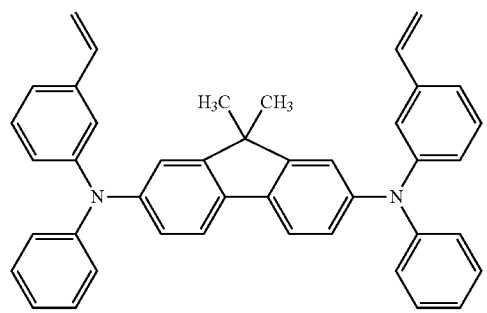
HT-074
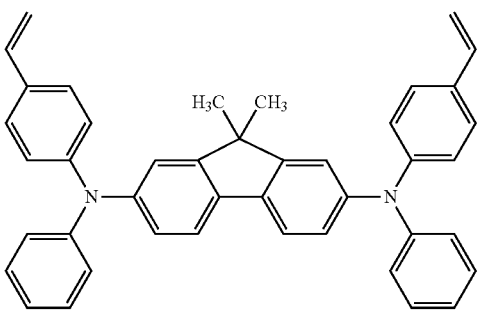
HT-075
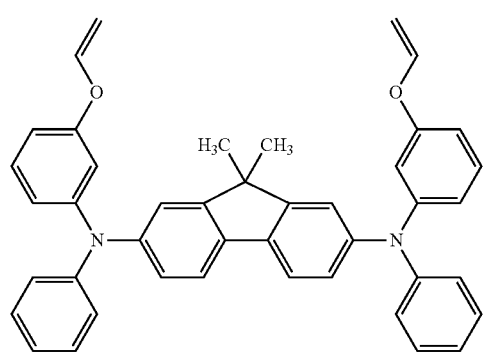
HT-076
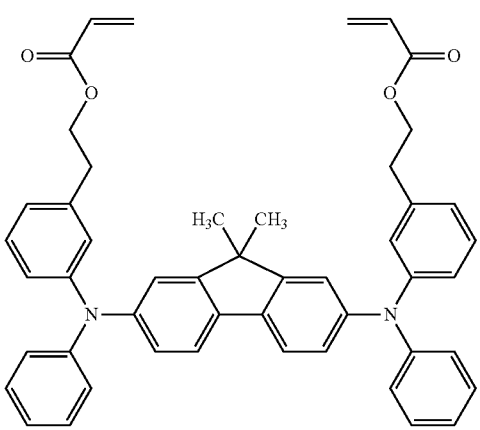
HT-077
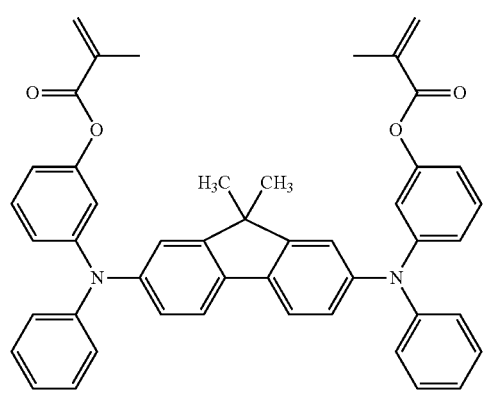
HT-078
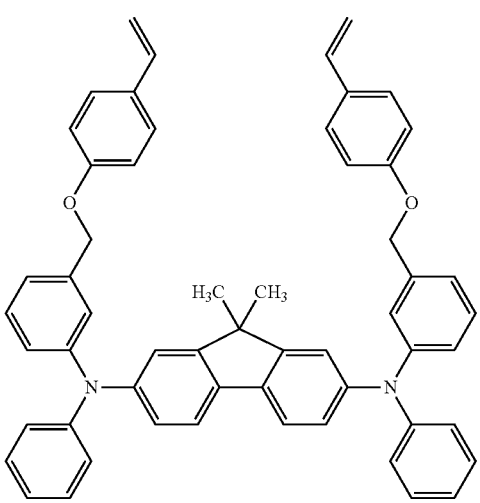
HT-079
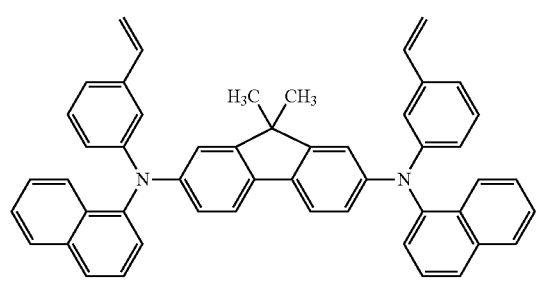
HT-080
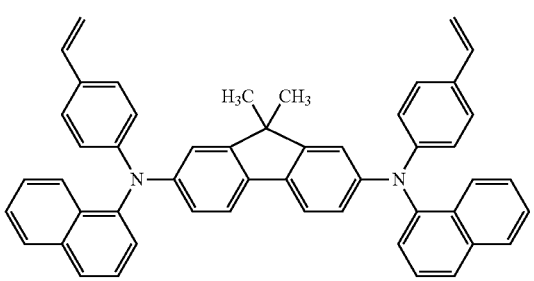

-continued
HT-081
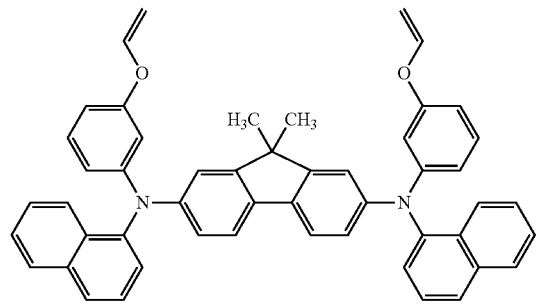
HT-082
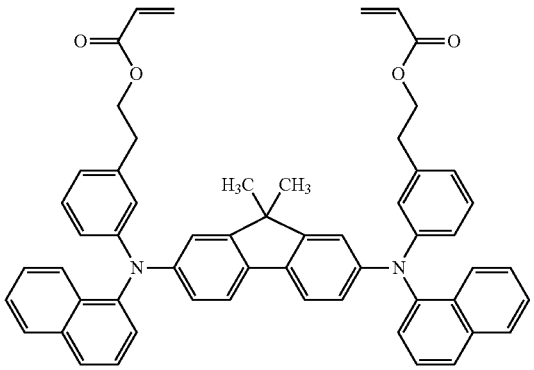
HT-083
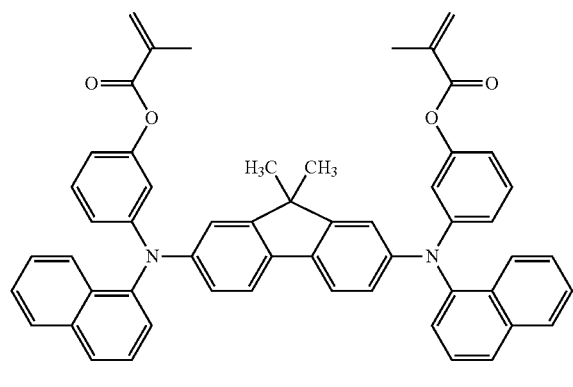
HT-084
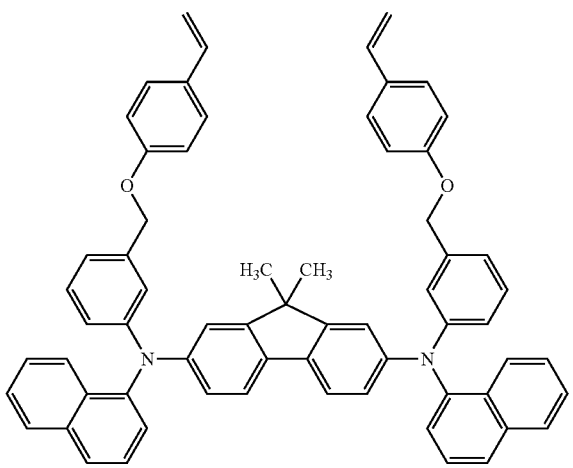
HT-085
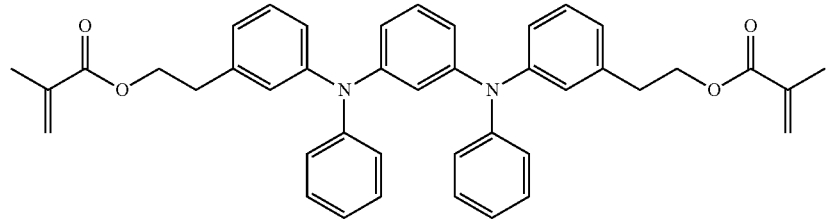
HT-086
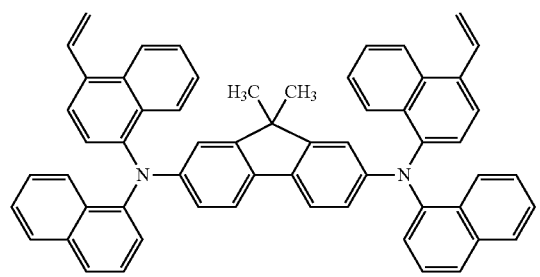
HT-087
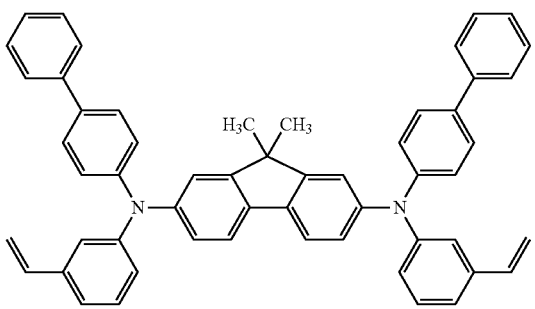

-continued
HT-088
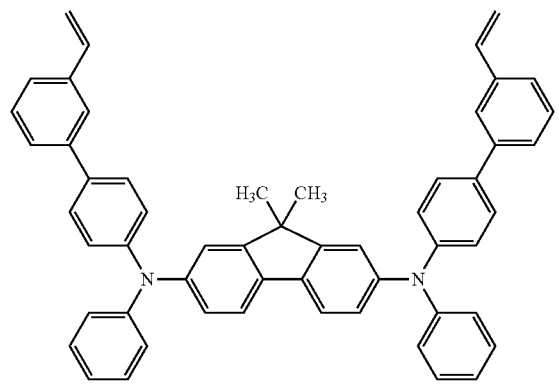
HT-089
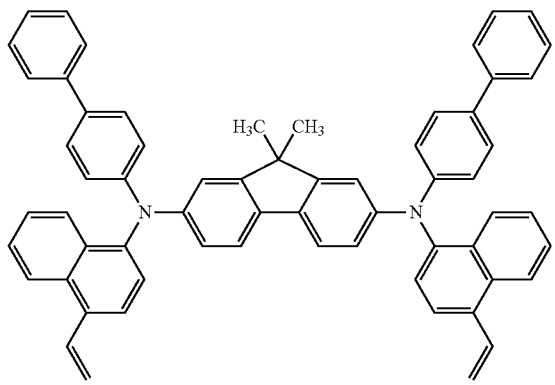
HT-090
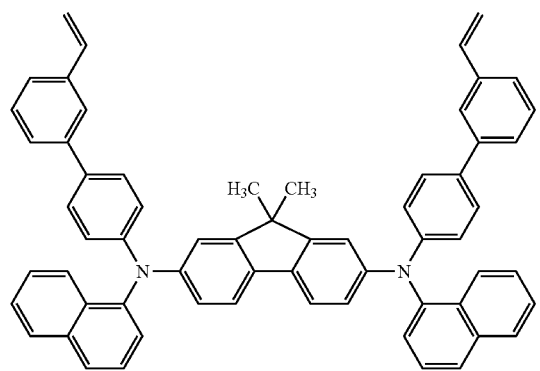
HT-091
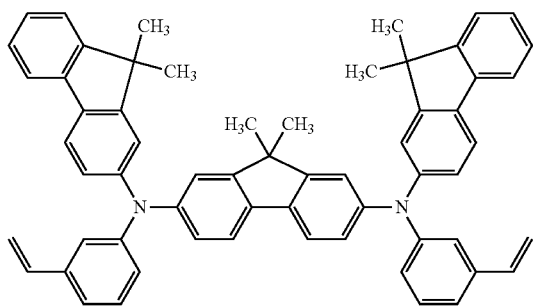
HT-092
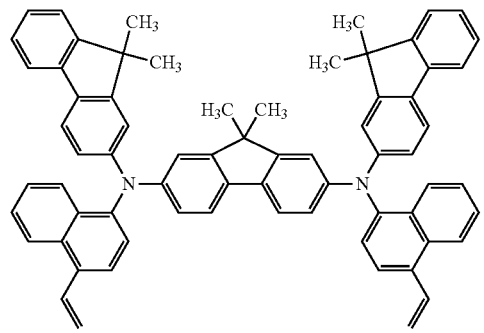
HT-093
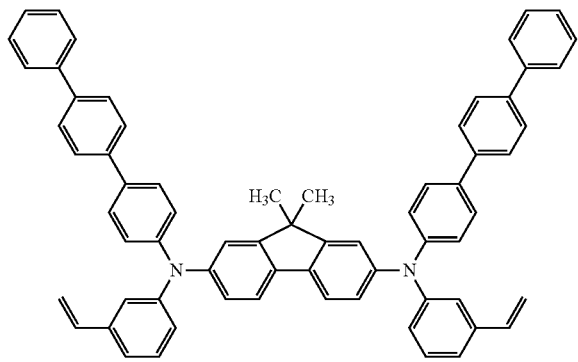
HT-094
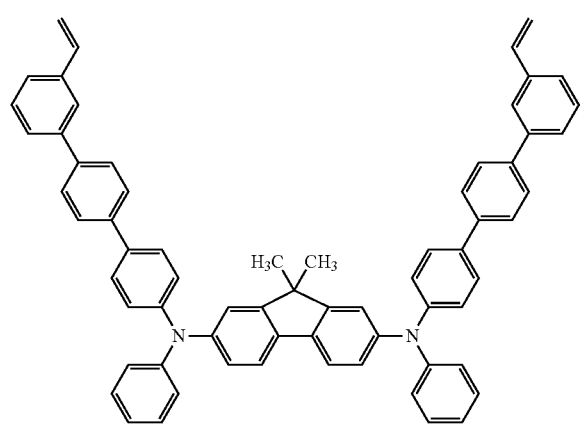
HT-095
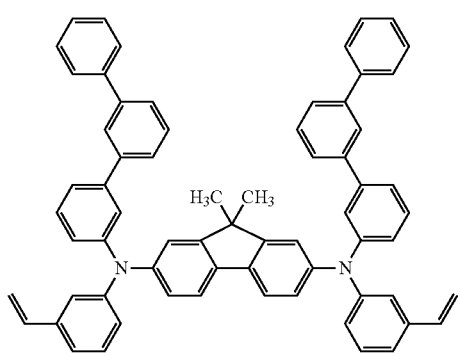

HT-096
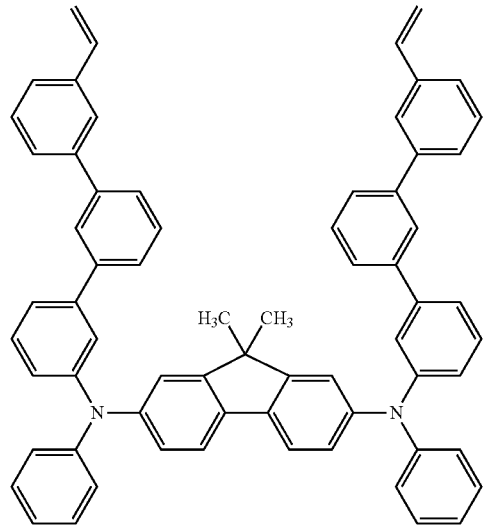
HT-097
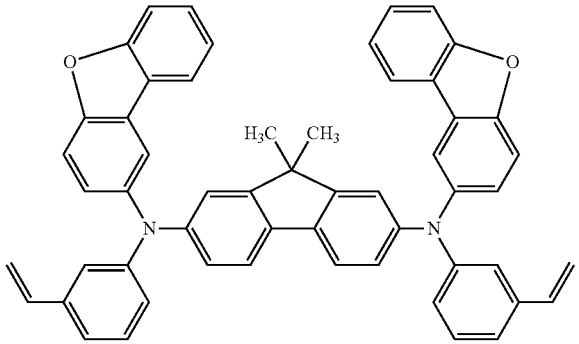
HT-098
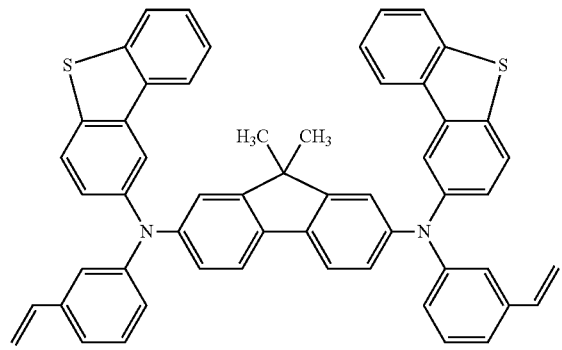
HT-099
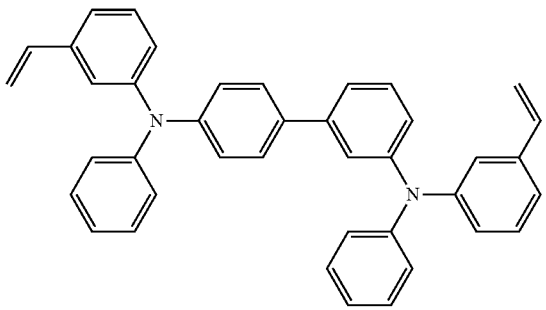
HT-100
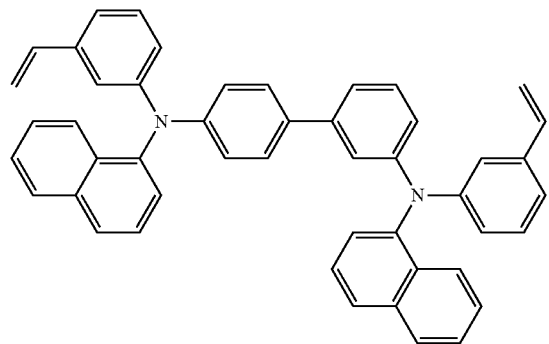
HT-101
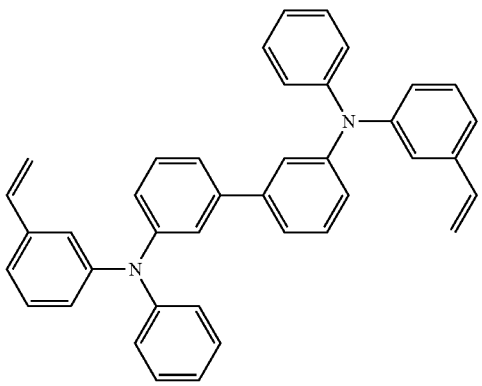

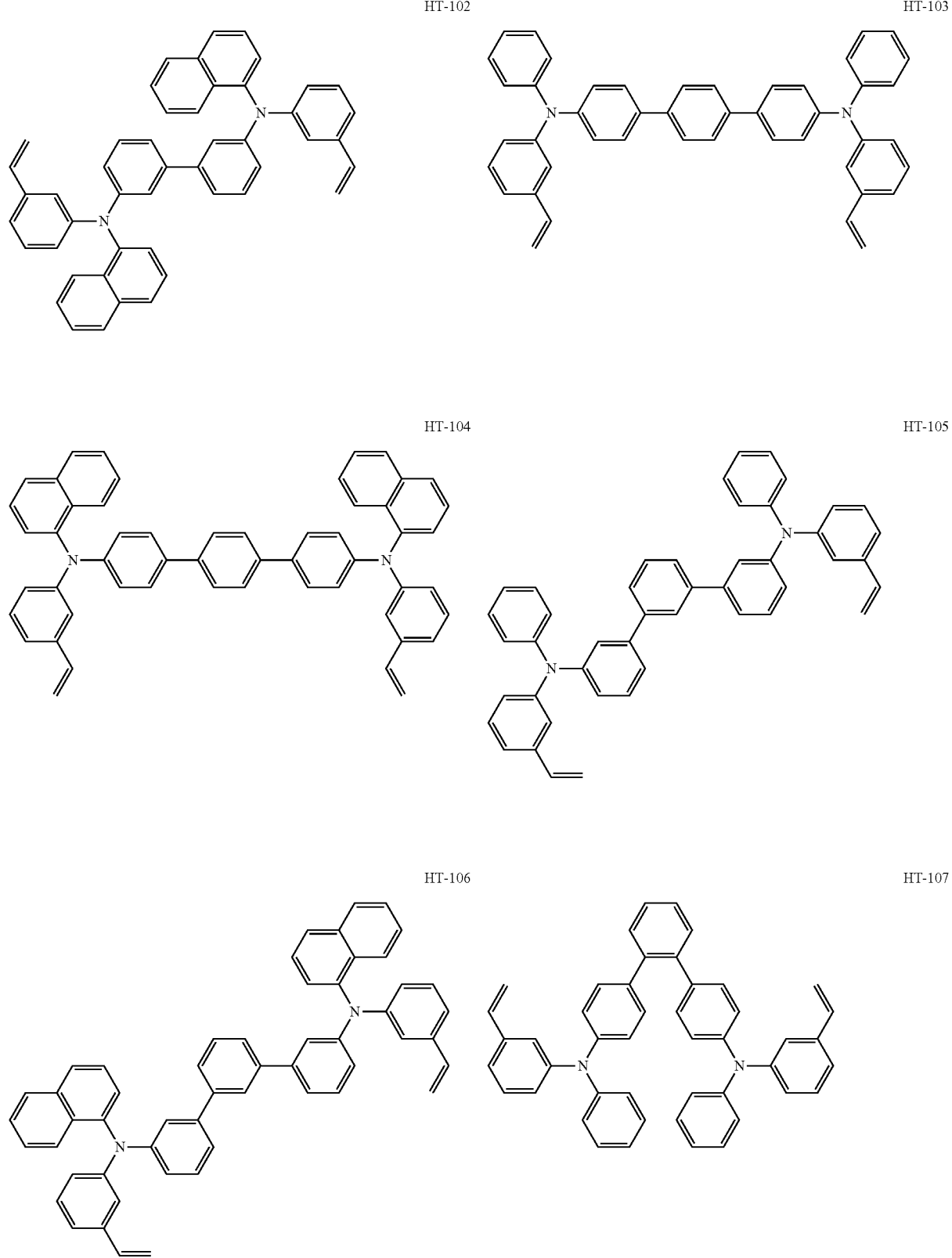

-continued
HT-108
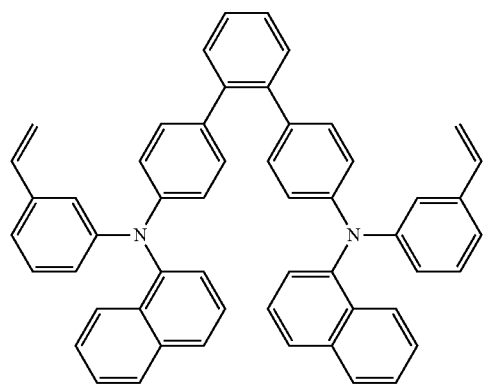
HT-109
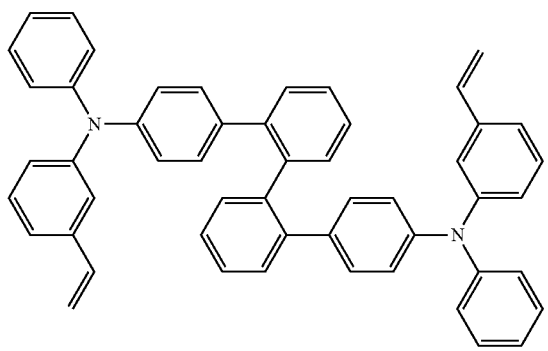
HT-110
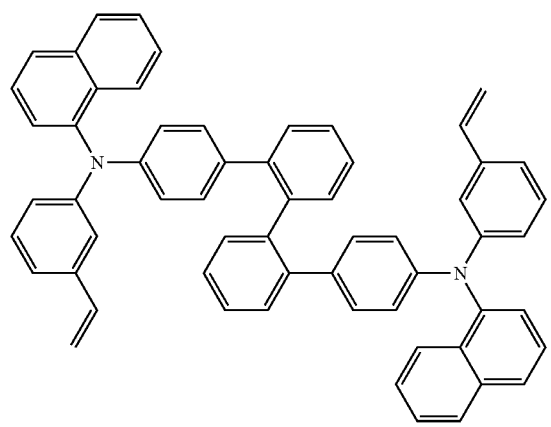
HT-111
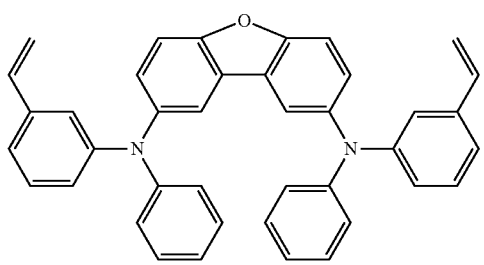
HT-112
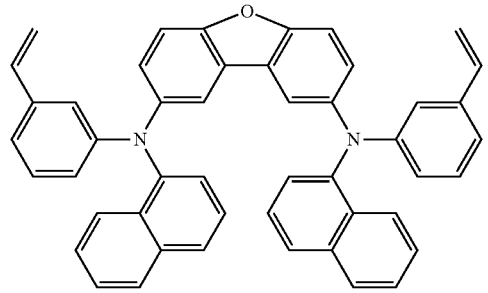
HT-113
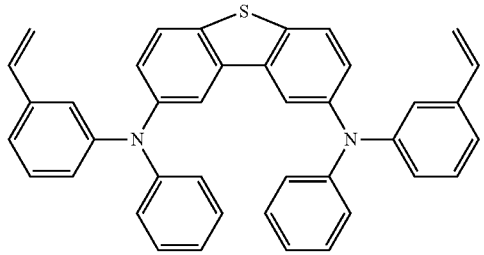
HT-114
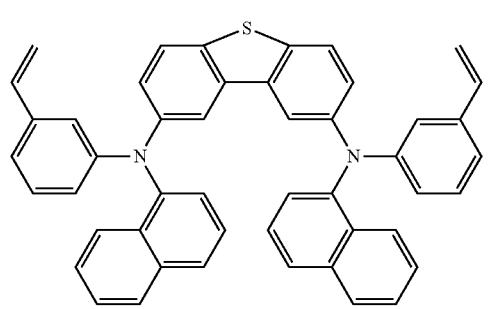
HT-115
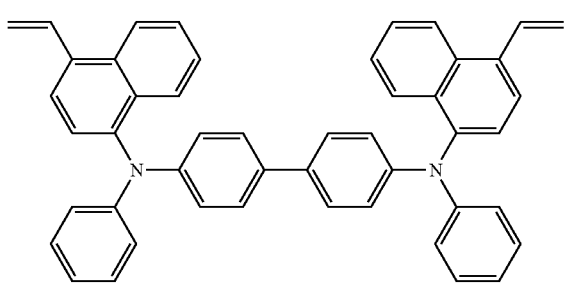

-continued
HT-116
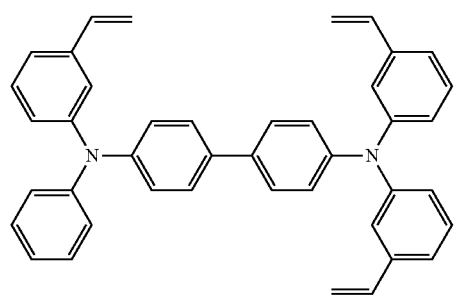
HT-117
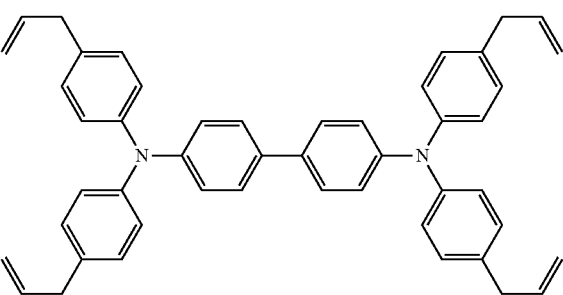
HT-118
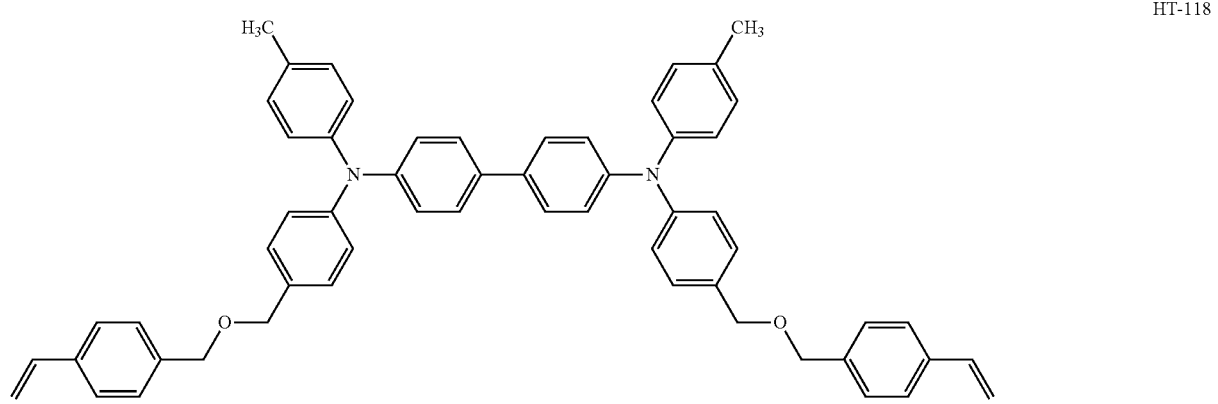
HT-119
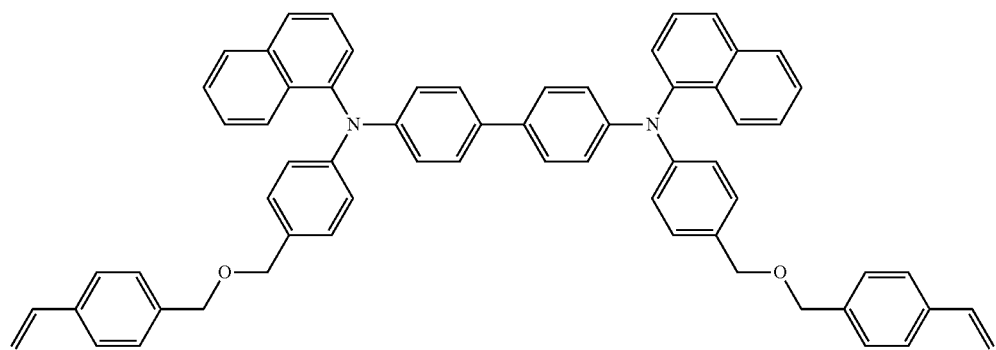
HT-120
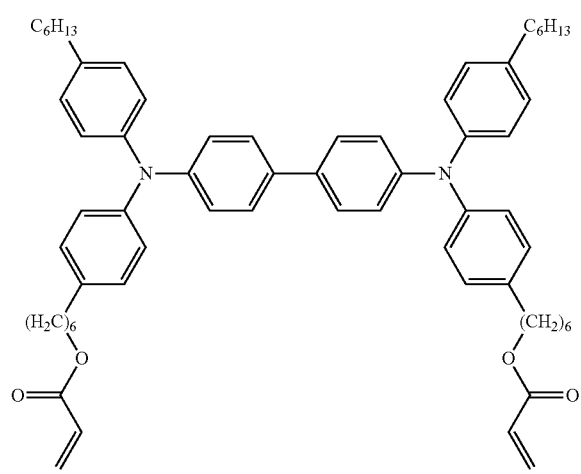
HT-121
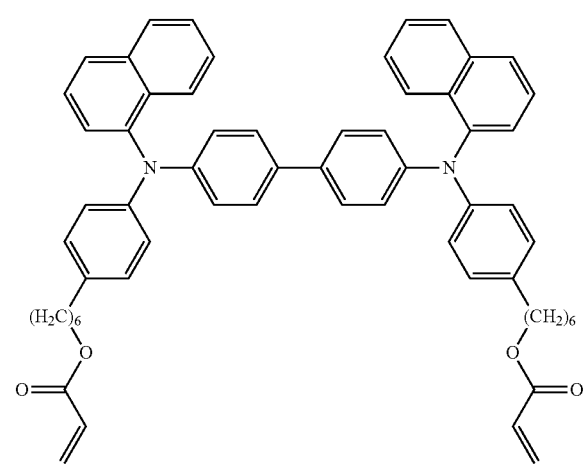

-continued
HT-122
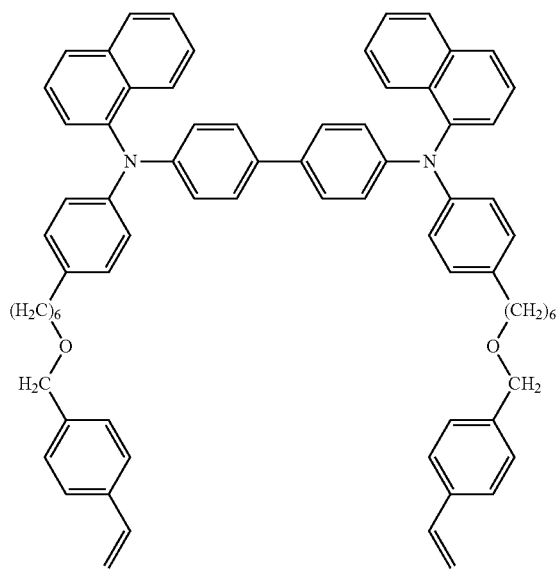
HT-123
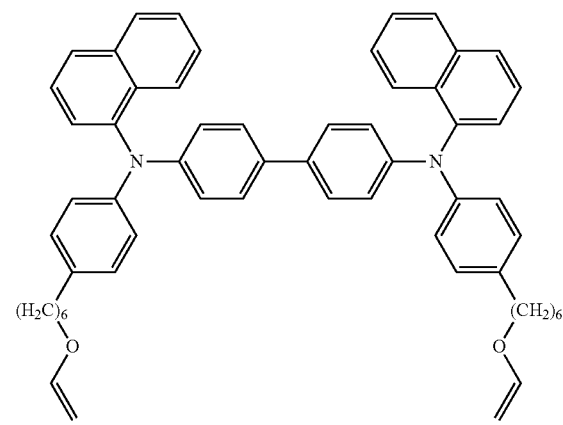
HT-124
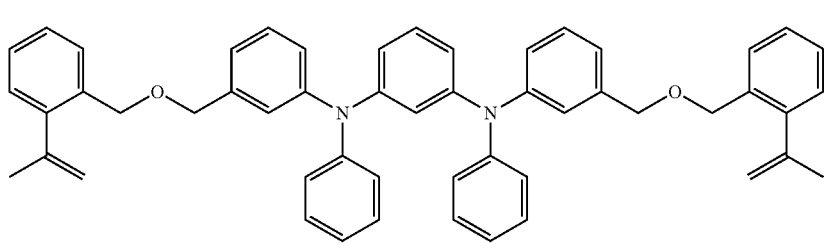
HT-125
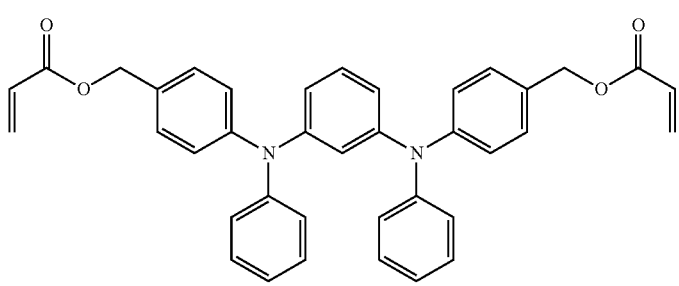
HT-126
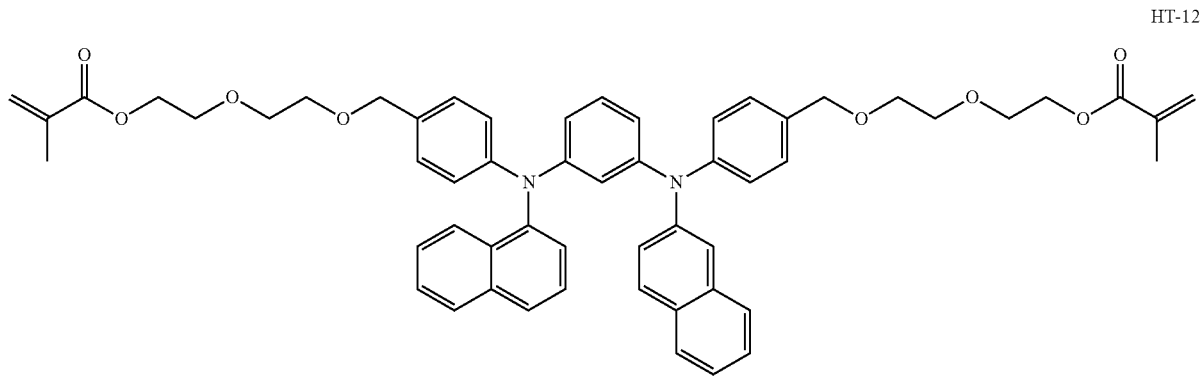

HT-127
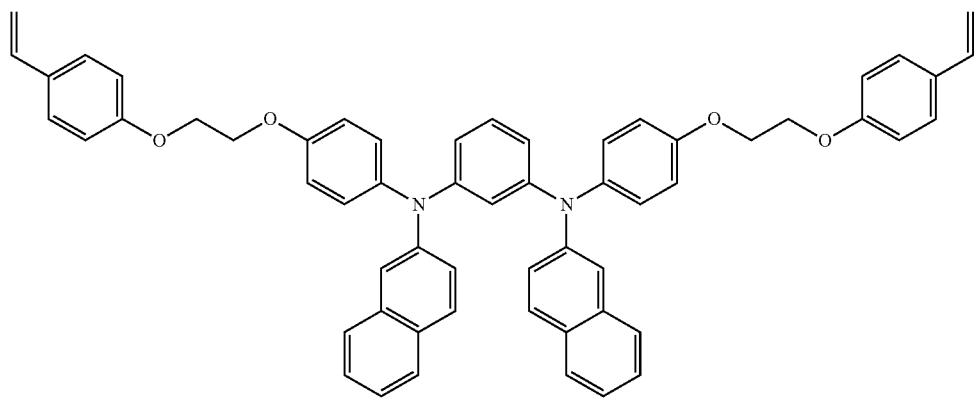
HT-128
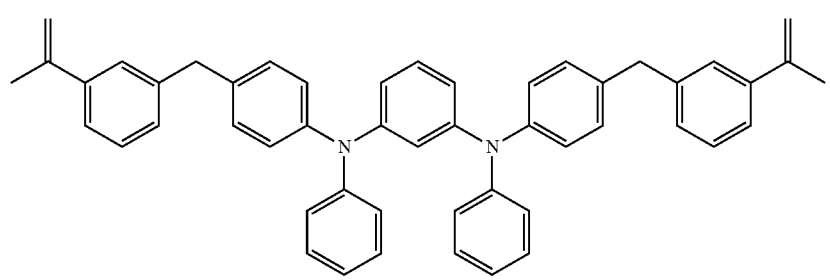
HT-129
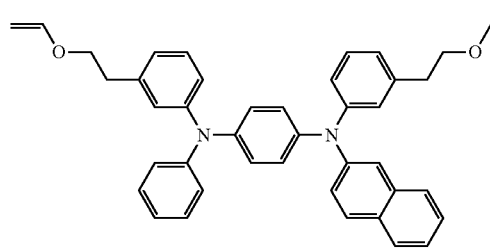
HT-130
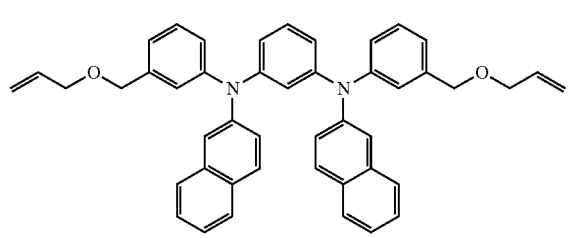
HT-131
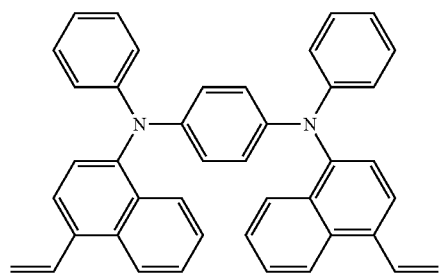
HT-132
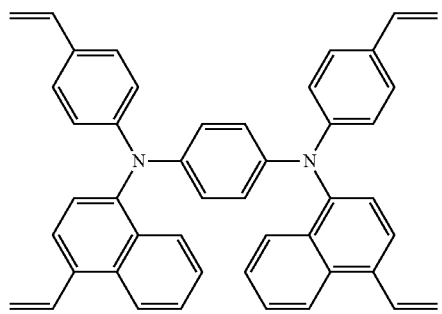
HT-133
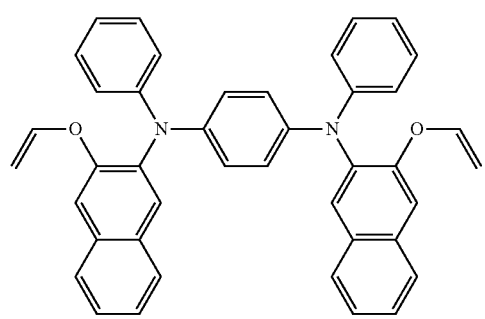

HT-134
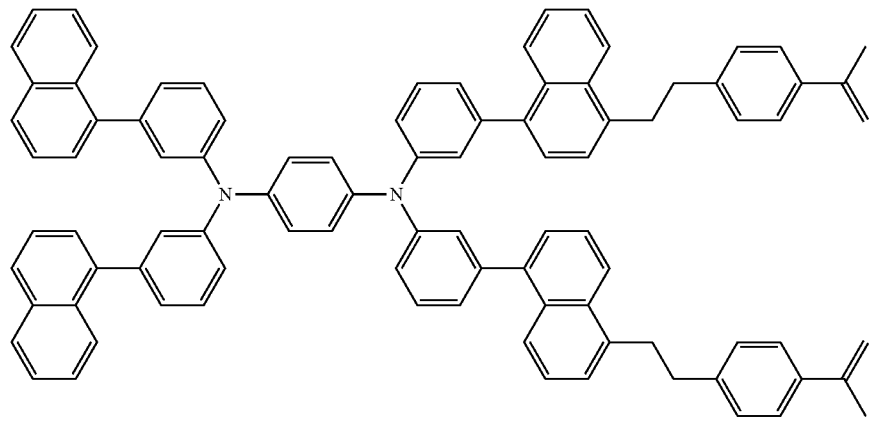
HT-135
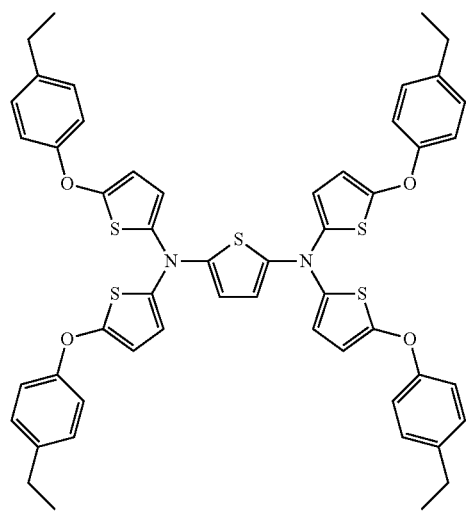
HT-136
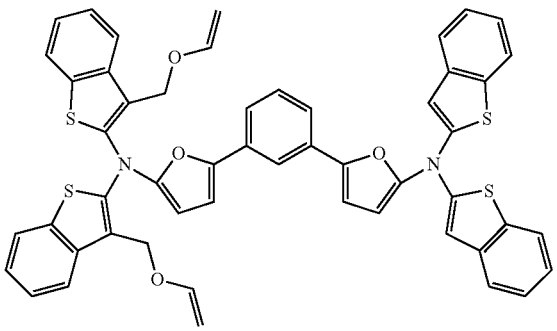
HT-137
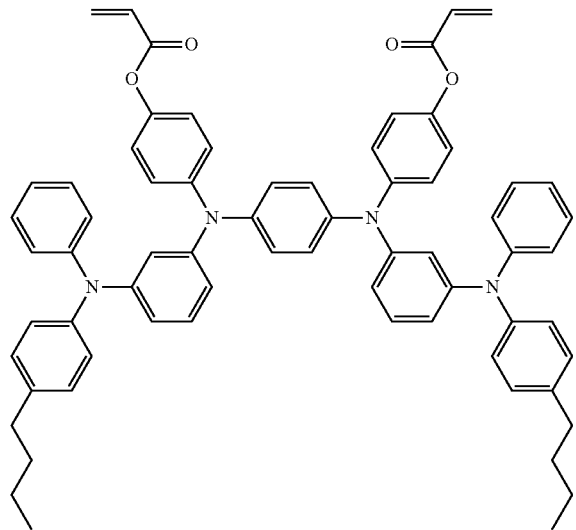

HT-138
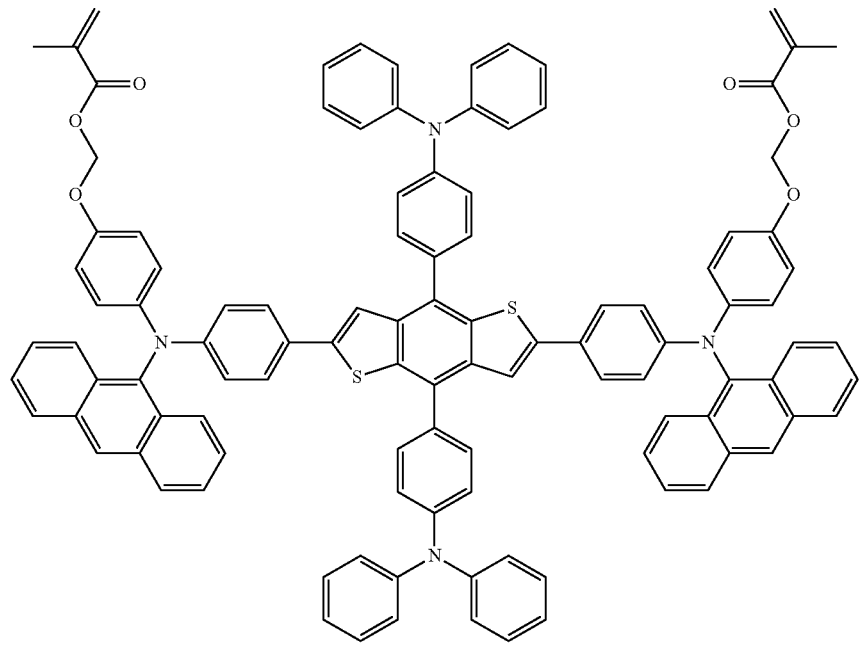
HT-139
HT-140
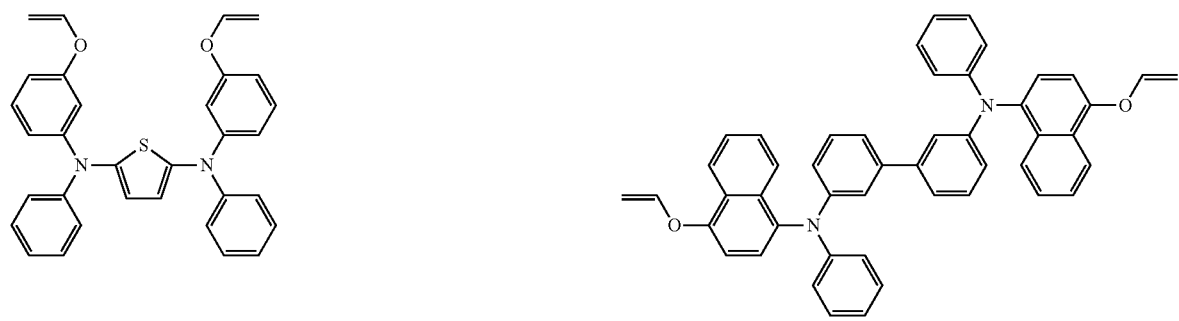
HT-141
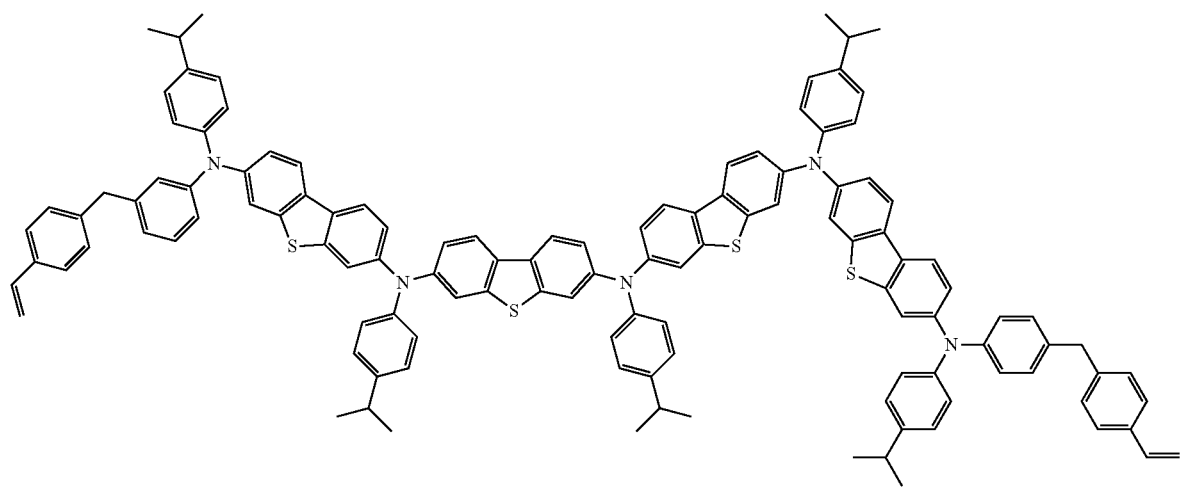

-continued
HT-142
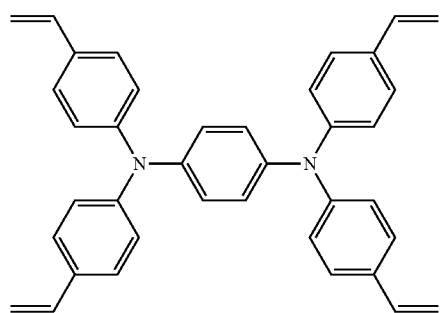
HT-143
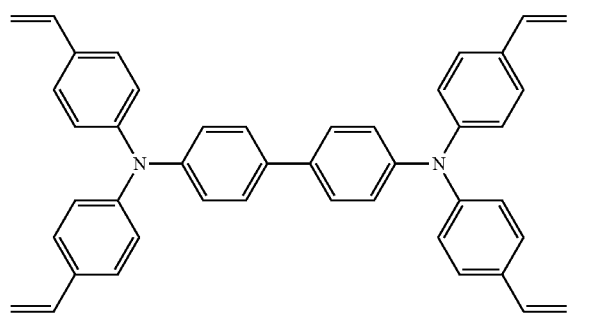
These compounds can be synthesized by, for example, the following methods.
DMF: N,N-Dimethylformamide
LDA: Lithium diisopropylamide
THF: Tetrahydrofuran
Synthesis of HT-001
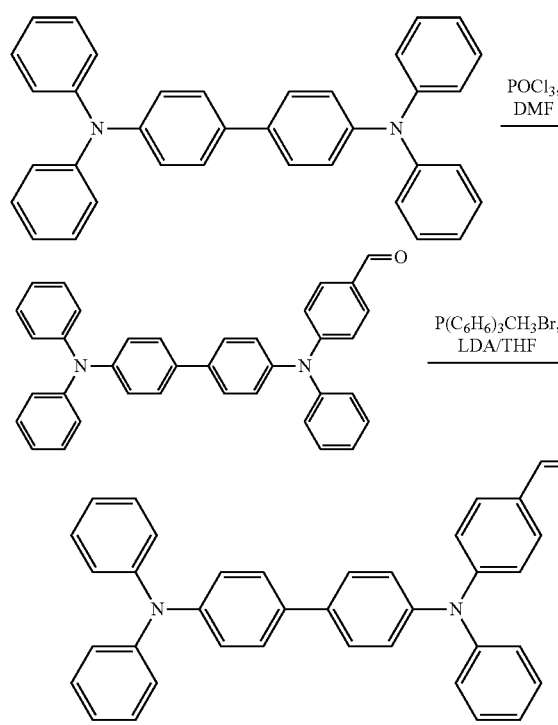
Synthesis of HT-042
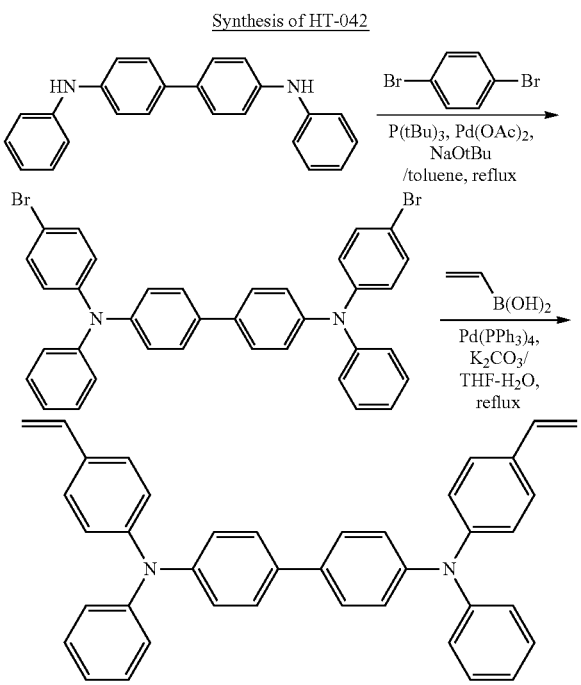
Synthesis of HT-057
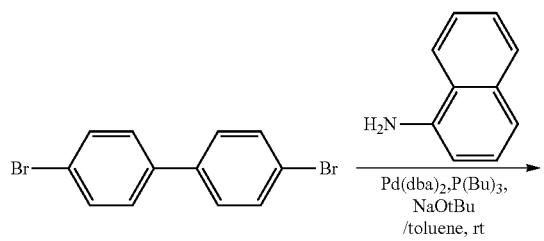

-continued

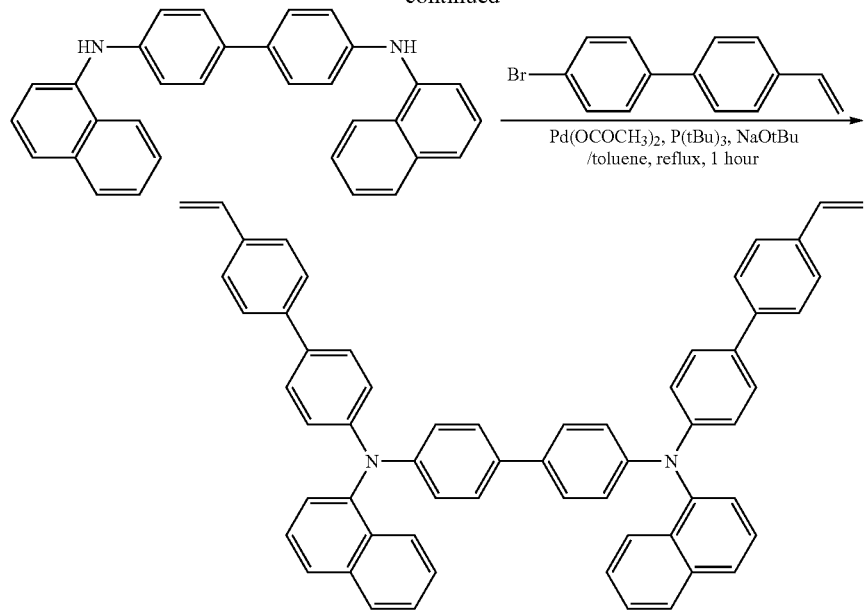

HT-057

The hole transport layer may further comprises other hole transport material, which is either an organic substance or an inorganic substance as long as it has a hole injecting ability, a hole transporting ability or an ability to form a bather to electrons. Examples thereof include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline based copolymer, and an electroconductive oligomer, specifically a thiophene oligomer.

This hole transport layer can be prepared by forming a film made of the above-described hole transport material according to a method known in the art such as a vacuum evaporation method, a spin coating method, a cast method, a printing method including an inkjet method and a LB method. It is preferable to prepared by a wet process in the invention. A thickness of the hole transport layer is not particularly limited, and usually 5 nm to 5 μm or so, preferably 5 to 200 nm.

Further, it is possible to employ a hole transport layer of a higher p-property which is doped with impurities. As its example, listed are those described in each of JP-A Nos. H04-297076, 2000-196140, 2001-102175, as well as in J. Appl. Phys., 95, 5773 (2004).

<<Light Emitting Layer>>

The light emitting layer of the present invention is a layer where electrons and holes, injected from electrodes, an electron transport layer or a hole transport layer, are recombined to emit light. The portions where light is emitted may be in the light emitting layer or at the interface between the light emitting layer and the layer adjacent thereto.

Total thickness of the light-emitting layer is not particularly limited, and it is preferable to adjust within 2 nm to 5 μm, more preferably 2 to 200 nm, and specifically preferably 10 to 20 nm, in view of uniform property of the layer, preventing unnecessary high voltage application at emitting time and improving stability of emitting light color depending on driving current.

This light emitting layer can be prepared by forming a film made of the light emitting dopant or a the host compound described later according to a method known in the art such as a vacuum evaporation method, a spin coating method, a cast method, an inkjet method and a LB method.

The light emitting layer of the present invention preferably contains at least one of a host compound and an emitting dopant (a phosphorescent light emitting dopant, fluorescent dopant and the like).

(Host Compound, Referred Also to as Light Emission Host)

The host compound used in the invention is described.

A host compound is defined as a compound of occupying the mass ratio among the compound in the light emitting layer of 20% or more, and having the quantum yield of phosphorescent light emission is less than 0.01 at 25° C. in the present invention. It is preferable to occupy the mass ratio among the compound in the light emitting layer of 20% or more.

A plurality of known host compounds may also be used in combination. Use of a plurality of host compounds makes the control of the transfer of electrons possible, and an organic EL element exhibiting higher light emission efficiency is obtained. Also, use of a plurality of phosphorescent compounds makes it possible to mix different colors of emitted light, and an arbitrary color of emitted light is obtained.

Among the known host compounds, preferable are the compounds having hole transporting ability, electron transporting ability, effect to prevent a shift of light emission to a longer wavelength side and a high Tg (a glass transition temperature).

Examples of the known host compounds include the compounds disclosed in the following documents:

JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837, and so on.

(Emitting Dopant))

The emitting dopant is described.

A fluorescent dopant and a phosphorescent emitting dopant (also referred to as a phosphorescent emitting compound) can be used as the light emitting dopant in the invention.

(Phosphorescent Emitting Compound, Phosphorescent Emitting Dopant)

The phosphorescent emitting compound of the invention is described.

The phosphorescent emitting compound of the present invention is a compound which emits light from the excited triplet, which can emit phosphorescence at room temperature (25° C.), and exhibits a phosphorescent quantum yield at 25° C. of not less than 0.01, and is preferably not less than 0.1.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The guest compound used of the present invention is a compound, in which the phosphorescent quantum yield measured employing any one of the solvents falls within the above-described range (not less than 0.01).

The light emission of the guest compound includes two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound.

It is required that energy in excited state of the phosphorescent light-emitting compound be lower than the energy in excited state the host compound in each type.

The phosphorescent light-emitting compound in relation to the invention can be optionally selected from those conventionally used in light-emitting layer of the organic EL element, and includes, for example, a compound represented by Formula (9).

Phosphorescent Light-Emitting Compound Represented by Formula (9)

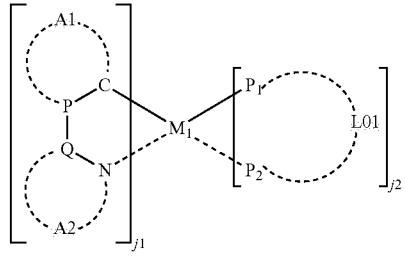

Formula (9)

In the Formula, P and Q each represent a carbon atom or a nitrogen atom. A1 represent an atomic group forming an aromatic hydrocarbon ring or an aromatic heterocyclic ring, together with P—C. A2 represents an atomic group forming aromatic heterocyclic ring, together with Q-N. P1-L01-P2 represents a 2-dentate ligand, P1, P2 are independently carbon atom, nitrogen atom or oxygen atom. L01 represents an atomic group forming a 2-dentate ligand together with P1 and P2. j1 represents an integer of 1 to 3, j2 represents an integer of 0 to 2, with proviso that sum of j1 and j2 are 2 or 3. M1 represents a transition metal element of 8 to 10 group in the periodic table.

Example of an aromatic hydrocarbon ring, formed by A1 together with P—C in Formula (9) includes benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoroanthrene ring, naphthacene ring, pentacene ring, perylene ring, pentaphene ring, picene ring, pyrene ring, pyranthrene ring, anthranthrene ring, and the like.

These rings may further have a substituent represented by $R_{81}$ to $R_{86}$ described later.

In the Formula (9), example of aromatic heterocyclic ring formed by A1, together with P—C includes furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, thiazole ring, indole ring, benzimidazole ring, benzothiazole ring, benzoxazole ring, quinoxaline ring, quinazoline ring, phthalazine ring, carbazole ring and azacarbazole ring.

The azacarbazole ring represents those in which one or more carbon atoms of benzene ring composing the above mentioned carbazole ring is substituted by nitrogen atom.

These rings may have a substituent represented by $R_{81}$ to $R_{86}$ described later.

In the Formula (9), example of aromatic heterocyclic ring formed by A1, together with Q-N includes oxazole ring, oxadiazole ring, oxatriazole ring, isooxazole ring, tetrazole ring, thiadiazole ring, thiatriazole ring, isothiazole ring, pyrrole ring, pyridine ring, pyridazine ring, pyrimidine ring, pyrazine ring, triazine ring, imidazole ring, pyrazole ring and triazole ring.

These rings may further have a substituent which above described A1 may have.

In the Formula (9), 2-dentate ligand represented by P1-L01-P2 includes, for example, substituted or non-substituted phenylpyridine, phenylpyrazole, phenylimidazole, phenyltriazole, phenyltetrazole, pyrazabol, acetylacetone, and picolinic acid.

In the Formula (9), j1 represent an integer of 1 to 3, and j2 represent an integer of 0 to 2, with proviso that sum of j1 and j2 is 2 or 3. In particular, j2 is preferably 0.

A transition metal element of 8 to 10 group in the periodic table (simply referred to as a transition metal) is used for M1 in the Formula (9) and iridium is preferable among them.

Further, a phosphorescent light-emitting compound represented by Formula (10) is preferably used among the phosphorescent light-emitting compounds represented by Formula (9).

(Phosphorescent Light-Emitting Compound Represented by Formula (10))

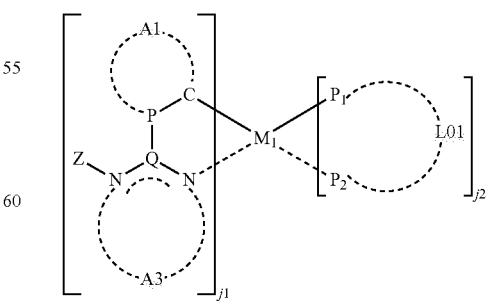

Formula (10)

In the Formula, Z represents a hydrocarbon ring group or a heterocyclic group. P and Q each represent a carbon atom or a nitrogen atom. A1 represents an atomic group forming an aromatic hydrocarbon ring or an aromatic heterocyclic ring, together with P—C. A3 represents —C($R_{001}$)=C($R_{002}$)—, —N=C($R_{002}$)—, —C($R_{001}$)=N— or —N=N—, $R_{001}$ and $R_{002}$ each represent a hydrogen atom or a substituent. $P_1$-L01-$P_2$ represents a 2-dentate ligand, $P_1$ and $P_2$ represent independently a carbon atom, a nitrogen atom, or an oxygen atom. L01 represents an atomic group forming a 2-dentate ligand together with $P_1$ and $P_2$. j1 represent an integer of 1 to 3, and j2 represent an integer of 0 to 2, with proviso that sum of j1 and j2 is 2 or 3. M1 represents a transition metal element of 8 to 10 group in the periodic table.

In the Formula (10), example of a hydrocarbon ring group represented by Z includes a non-aromatic hydrocarbon ring, and an aromatic hydrocarbon ring group, wherein a non-aromatic hydrocarbon ring group includes a cyclopropyl group, a cyclopentyl group, a cyclohexyl group and the like. These groups may be non-substituted or may have a substituent described later.

Examples of an aromatic hydrocarbon ring group (referred to as an aromatic hydrocarbon group, an aryl group or so) include, for example, phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenylyl group.

These groups may be non-substituted or have a substituent represented by $R_{81}$ to $R_{86}$ described later.

In the Formula (10), heterocyclic group represented by Z includes a non-aromatic heterocyclic ring group and an aromatic heterocyclic ring group, wherein the non-aromatic heterocyclic ring group includes, for example, a group derived from an epoxy ring, an aziridine ring, a thiirane ring, an oxetane ring, an azetidine ring, a thietane ring, a tetrahydrofuran ring, a dioxolan ring, a pyrrolidine ring, a pyrazolidine ring, a imidazolidine ring, an ioxazolidine ring, a tetrahydrothiophene ring, a sulfolane ring, a thiazolidine ring, an c-caprolactone ring, an c-caprolactam ring, a piperidine ring, a hexahydropyridazine ring, a hexahydropyrimidine ring, a piperazine ring, a morpholine ring, a tetrahydropyran ring, 1,3-a dioxane ring, 1,4-a dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, and the like.

These groups may be non-substituted or have a substituent represented by $R_{81}$ to $R_{86}$ described later.

Examples of the aromatic heterocyclic ring group include, for example, pyridyl group, a pyrimidinyl group, a furyl group, a pyrrolyl group, an imidazolyl group, a benzimidazolyl group, a pyrazolyl group, a pyrazinyl group, a triazolyl group (such as 1,2,4-triazole-1-yl group, 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, carbazolyl group, a carbonyl group, a diazacarbazolyl group (a group in which one of carbon atom in a carboline ring composing above mentioned carbonyl group is substituted by a nitrogen atom), a quinoxalinyl group, a pyridazinyl group, a triazinyl group, a quinazolyl group and a phthalazinyl group.

These groups may be non-substituted or have a substituent represented by $R_{81}$ to $R_{86}$ described later.

The group represented by Z is preferably an aromatic hydrocarbon ring group or aromatic heterocyclic ring group.

In the Formula (10), an aromatic hydrocarbon ring which is formed by A1 together with P—C includes, a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoroanthrene ring, a naphthacene ring, a pentacene ring, a perylene ring, a pentaphene ring, a picene ring, a pyrene ring, a pyranthrene ring and an anthranthrene ring.

These rings may further have a substituent represented by $R_{81}$ to $R_{86}$ described later.

In the Formula (10), aromatic heterocyclic ring which is formed by A1 together with P—C includes, a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a carbazole ring, a carboline ring and an azacarbazole ring.

The azacarbazole ring is a ring in which one or more of carbon atoms in a benzene ring composing above mentioned carbazole ring is substituted by a nitrogen atom.

These rings may further have a substituent represented by $R_{81}$ to $R_{86}$ described later.

In —C($R_{001}$)=C($R_{002}$)—, —N=C($R_{002}$)— and —C($R_{001}$)=N— represented by A in Formula (10), a substituent represented by $R_{001}$ and $R_{002}$ are the same as the substituent $R_{81}$ to $R_{86}$ described later.

In the Formula (10), 2-dentate ligand represented by P1-L01-P2 includes phenylpyridine, phenylpyrazole, phenylimidazole, phenyltriazole, phenyltetrazole, pyrazabol, acetylacetone and picolinic acid.

Here, j1 represents an integer of 1 to 3, j2 represent an integer of 0 to 2, and sum of j1 and j2 is 2 or 3. j2 is preferably 0.

In Formula (10), the transition metal element of 8 to 10 group in the periodic table represented by $M_1$ (referred also to as simply a transition metal) is the same as the transition metal element of 8 to 10 group in the periodic table represented by $M_1$ in Formula (10).

(Phosphorescent Light-Emitting Compound Represented by Formula (2))

A compound represented by Formula (2) is used as one of further preferable embodiments of the phosphorescent light-emitting compound represented by Formula (10).

In Formula (2), 2-dentate ligand represented by P1-L01-P2 includes, for example, substituted or non-substituted phenylpyridine, phenylpyrazole, phenylimidazole, phenyltriazole, phenyltetrazole, pyrazabol, acetylacetone and picolinic acid.

A transition metal element of 8 to 10 group in the periodic table (simply referred to as a transition metal) is used for M1 in the Formula (9), preferably iridium and platinum, and preferably iridium is more preferable among them.

The hydrocarbon ring group represented by Z includes, a non-aromatic hydrocarbon ring, an aromatic hydrocarbon ring group, a non-aromatic hydrocarbon ring group includes a cyclopropyl group, a cyclopentyl group, a cyclohexyl group and the like, which may be substituted or non-substituted. The aromatic hydrocarbon ring, group (referred to as also an aromatic hydrocarbon group, an aryl group and the like) includes, for example, a phenyl group, a p-chlorophenyl group, a mesityl group, a tolyl group, a xylyl group, a naphthyl group, a anthryl group, an azulenyl group, an acenaphthenyl group, a fluorenyl group, a phenanthryl group, an indenyl group, a pyrenyl group, a biphenylyl group. These may be substituted or non-substituted.

In Formula (2), $R_{81}$ to $R_{86}$ represent a hydrogen atom or a substituent, and examples of the substituents include, an alkyl group (for example, methyl group, ethyl group, propyl group, isopropyl group, t-butyl group, pentyl group, hexyl group, octyl group, dodecyl group, tridecyl group, tetradecyl group and pentadecyl group), a cycloalkyl group (for example, a cyclopentyl group and cyclohexyl group), an alkenyl group (for example, vinyl group and allyl group), an alkinyl group (for example, ethynyl group and propargyl group), an aromatic hydrocarbon group (referred to as also an aromatic hydrocarbon ring group, aromatic carbon ring group or aryl group, for example, phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group and biphenylyl group), an aromatic heterocyclic ring group (for example, pyridyl group, pyrimidinyl group, furyl group, pyrrolyl group, imidazolyl group, benzimidazolyl group, pyrazolyl group, pyrazinyl group, triazolyl group (for example, 1,2,4-triazole-1-yl group and 1,2,3-triazole-1-yl group), oxazolyl group, benzoxazolyl group, thiazolyl group, isooxazolyl group, isothiazolyl group, furazanyl group, thienyl group, quinolyl group, benzofuryl group, dibenzofuryl group, benzothienyl group, dibenzothienyl group, indolyl group, carbazolyl group, carbonyl group, diazacarbazolyl group (a group in which one of carbon atom in a carboline ring composing above mentioned carbonyl group is substituted by a nitrogen atom), quinoxalinyl group, pyridazinyl group, triazinyl group, quinazolyl group and phthalazinyl group), a heterocyclic group (for example, pyrrolidyl group, imidazolidyl group, morpholyl group and oxazolidyl group), an alkoxy group (for example, methoxy group, ethoxy group, propyloxy group, pentyloxy group, hexyloxy group, octyloxy group and dodecyloxy group), cycloalkoxy group (for example, cyclopentyloxy group and cyclohexyloxy group), an aryloxy group (for example, phenoxy group, naphthyloxy group), an alkylthio group (for example, methylthio group, ethylthio group, propylthio group, pentylthio group, hexylthio group, octylthio group and dodecylthio group), a cycloalkylthio group (for example, cyclopentylthio group and cyclohexyl thio group), an arylthio group (for example, phenylthio group and naphthylthio group), an alkoxycarbonyl group (for example, methyloxycarbonyl group, ethyloxycarbonyl group, butyloxycarbonyl group, octyloxycarbonyl group and dodecyloxycarbonyl group), an aryloxycarbonyl group (for example, phenyloxycarbonyl group and naphthyloxycarbonyl group), a sulfamoyl group (for example, aminosulfonyl group, methylaminosulfonyl group, dimethylaminosulfonyl group, butylaminosulfonyl group, hexylaminosulfonyl group, cyclohexyl aminosulfonyl group, octylaminosulfonyl group, dodecylaminosulfonyl group, phenylaminosulfonyl group, naphthylaminosulfonyl group and 2-pyridylaminosulfonyl group), an acyl group (for example, acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group and pyridylcarbonyl group), an acyloxy group (for example, acetyloxy group, ethylcarbonyloxy group, butylcarbonyloxy group, octylcarbonyloxy group, dodecylcarbonyloxy group and phenylcarbonyloxy group), an amide group (for example, methylcarbonylamino group, ethylcarbonylamino group, dimethylcarbonylamino group, propylcarbonylamino group, pentylcarbonylamino group, cyclohexylcarbonyl amino group, 2-ethylhexylcarbonylamino group, octylcarbonylamino group, dodecylcarbonylamino group, phenylcarbonylamino group and naphthylcarbonylamino group), a carbamoyl group (for example, aminocarbonyl group, methylaminocarbonyl group, dimethylaminocarbonyl group, propylaminocarbonyl group, pentylaminocarbonyl group, cyclohexyl aminocarbonyl group, octylaminocarbonyl group, 2-ethylhexylaminocarbonyl group, dodecylaminocarbonyl group, phenylaminocarbonyl group, naphthylaminocarbonyl group and 2-pyridylaminocarbonyl group), a ureido group (for example, methylureido group, ethylureido group, pentylureido group, cyclohexyl ureido group, octylureido group, dodecylureido group, phenylureido group, naphthylureido group and 2-pyridylaminoureido group), a sulfinyl group (for example, methylsulfinyl group, ethylsulfinyl group, butylsulfinyl group, cyclohexyl sulfinyl group, 2-ethylhexylsulfinyl group, dodecylsulfinyl group, phenylsulfinyl group, naphthylsulfinyl group and 2-pyridylsulfinyl group), an alkylsulfonyl group (for example, methylsulfonyl group, ethylsulfonyl group, butylsulfonyl group, cyclohexyl sulfonyl group and 2-ethylhexylsulfonyl group, dodecylsulfonyl group), an arylsulfonyl group or heteroarylsulfonyl group (for example, phenylsulfonyl group, naphthylsulfonyl group and 2-pyridylsulfonyl group), an amino group (for example, amino group, ethylamino group, dimethylamino group, butylamino group, cyclopentylamino group, 2-ethylhexylamino group, dodecylamino group, anilino group, naphthylamino group and 2-pyridylaminogroup), a halogen atom (for example, fluorine atom, chlorine atom and bromine atom), a fluorohydrocarbon group (for example, fluoromethyl group, trifluoromethyl group, pentafluoroethyl group and pentafluorophenyl group), a cyano group, a nitro group, a hydroxy group, a mercapto group, a silyl group (for example, trimethylsilyl group, triisopropylsilyl group, triphenylsilyl group, phenyldiethylsilyl group), and a phosphono group.

These may be further substituted by a substituent described above, and plural of these may form a ring by bonding each other.

Practical examples of the compound represented by Formula (2). The present invention is not restricted to these. These compounds can be synthesized according to a method described in Inorg. Chem., 40, 1704-1711.

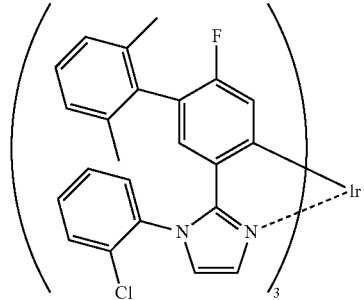

D-001

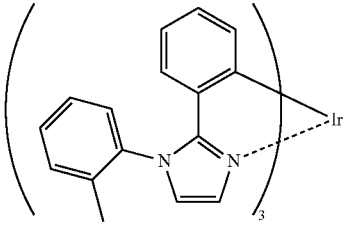

D-002

-continued
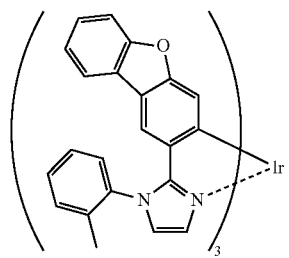
D-003
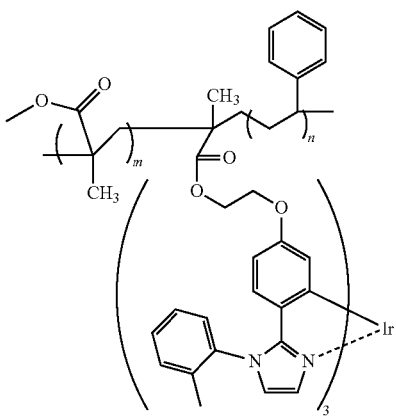
D-004
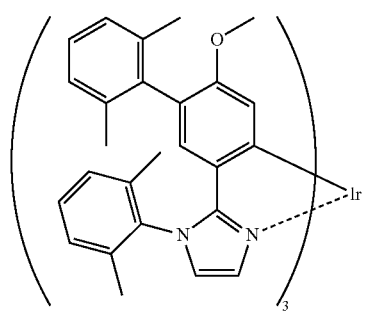
D-005
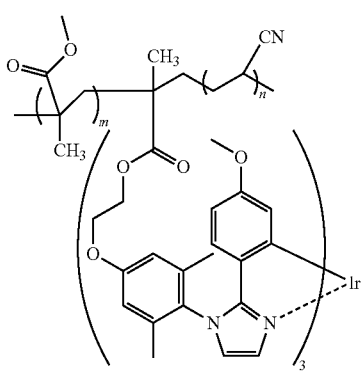
D-006
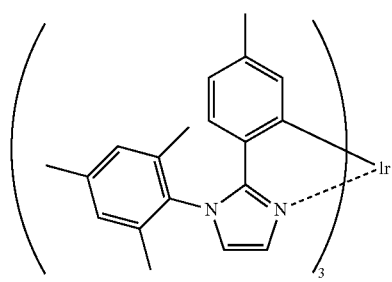
D-007
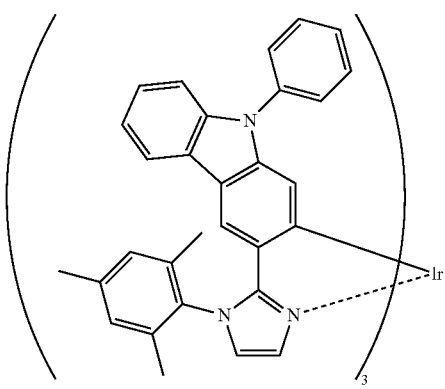
D-008
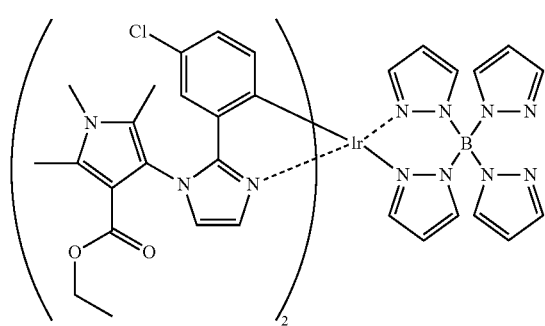
D-009
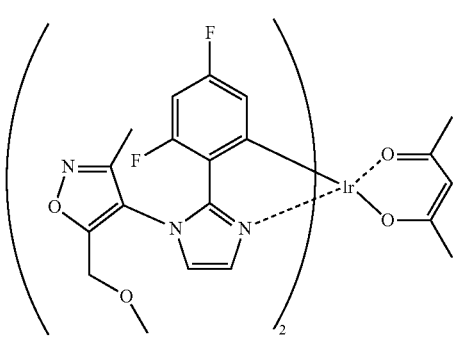
D-010

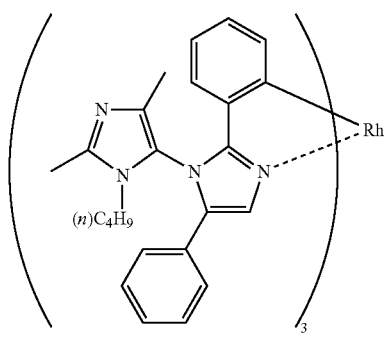
D-011
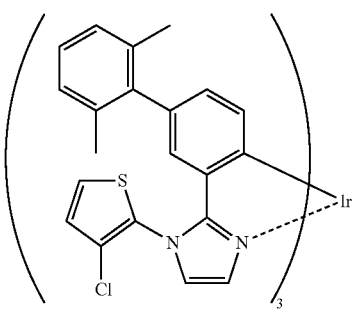
D-012
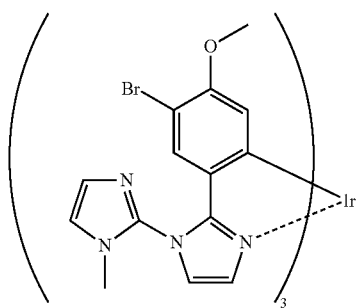
D-013
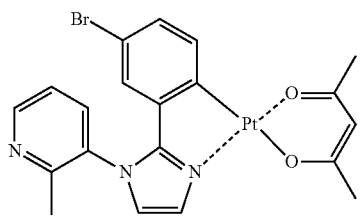
D-014
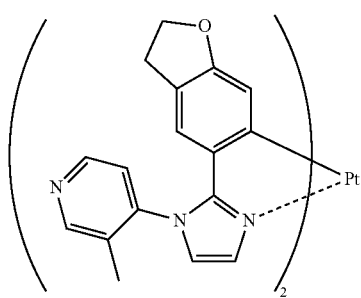
D-015
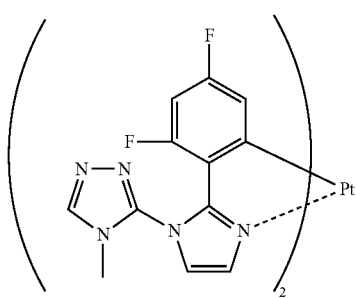
D-016
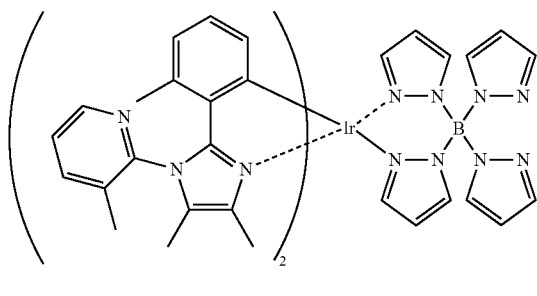
D-017
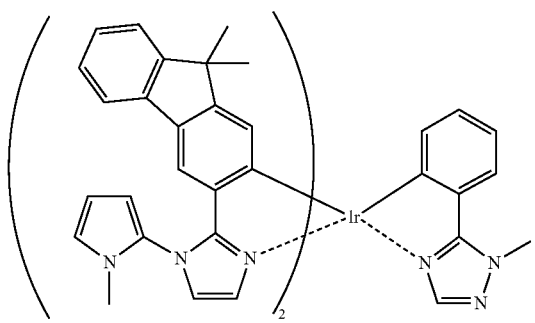
D-018

-continued
D-019
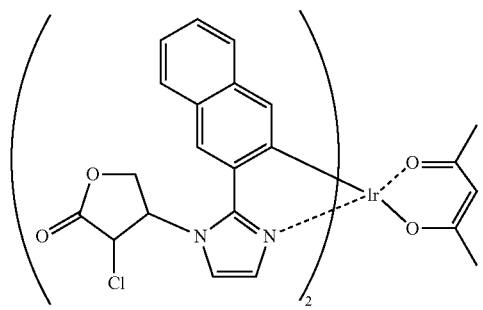
D-020
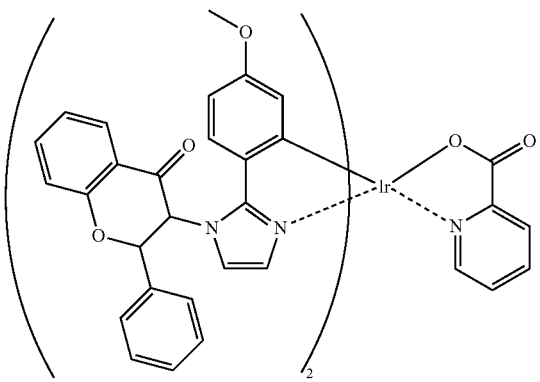
D-021
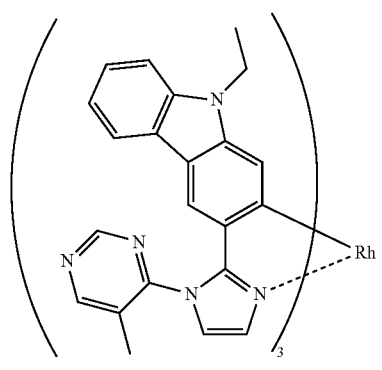
D-022
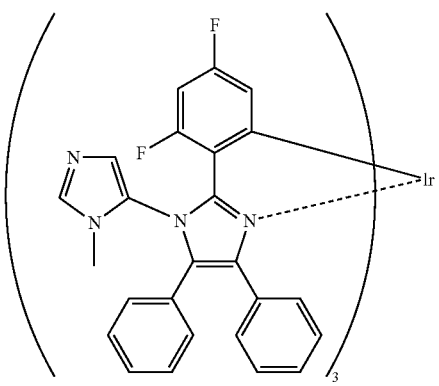
D-023
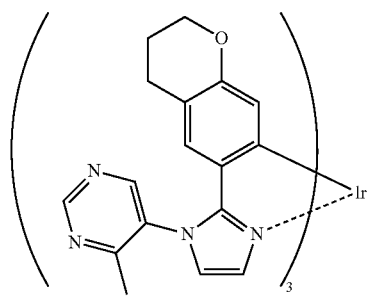
D-024
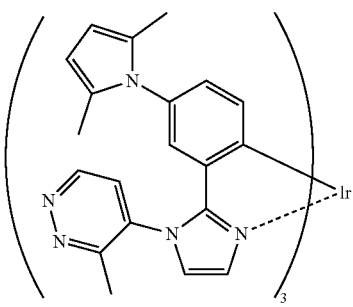
D-025
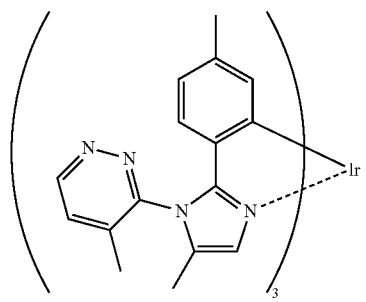
D-026
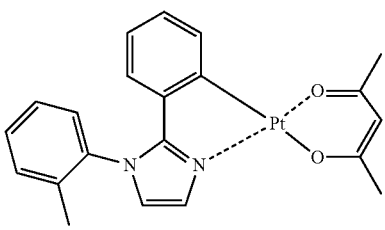

-continued
D-027
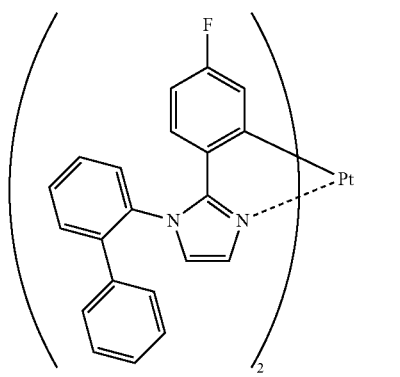
D-028
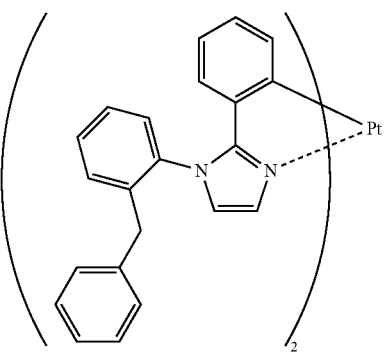
D-029
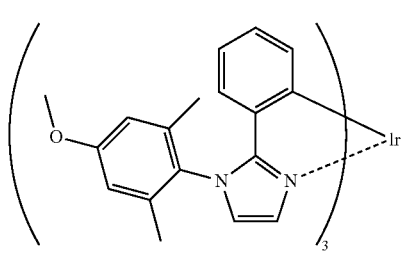
D-030
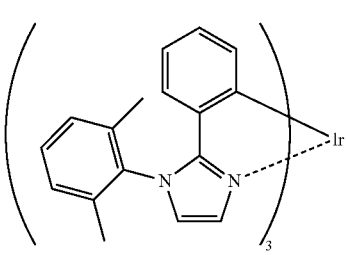
D-031
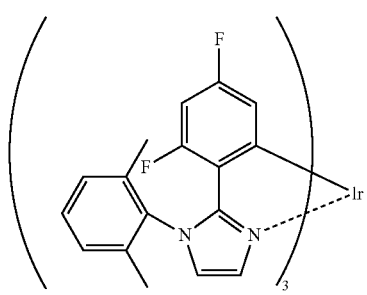
D-032
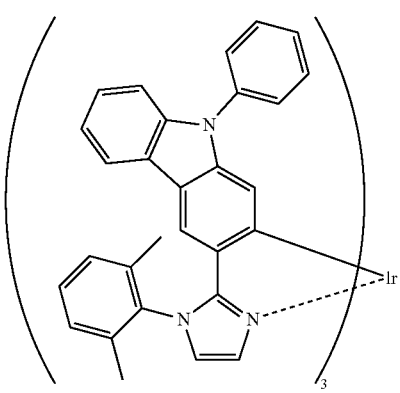
D-033
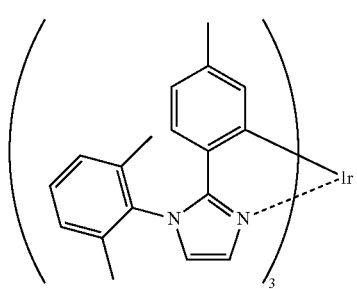
D-034
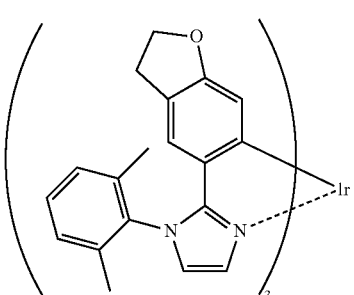
D-035
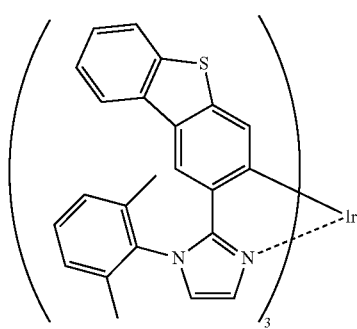
D-036
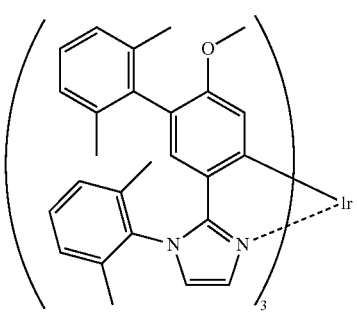

-continued
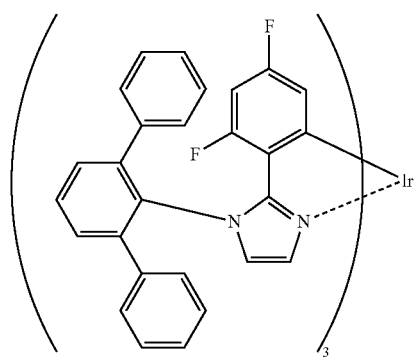
D-037
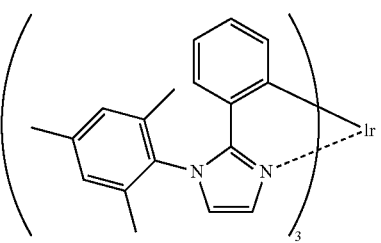
D-038
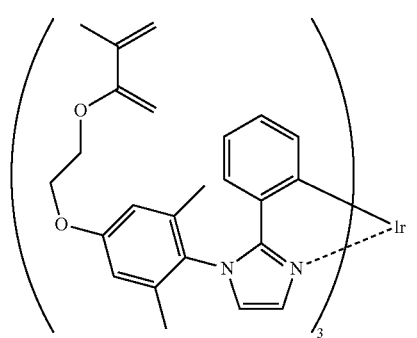
D-039
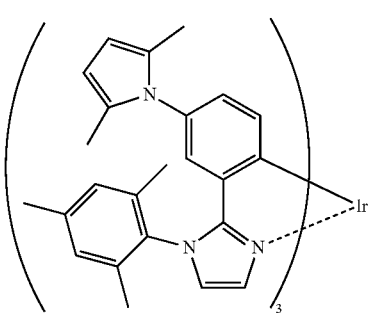
D-040
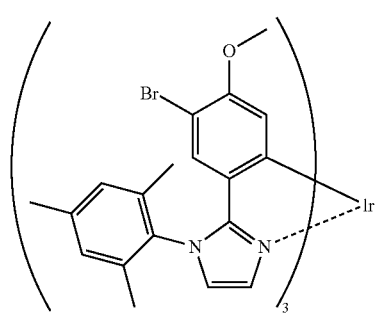
D-041
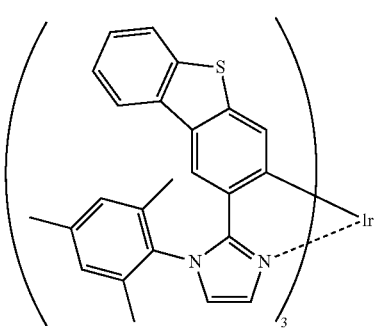
D-042
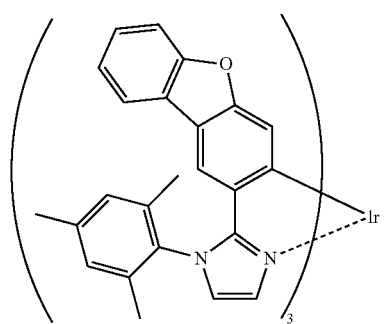
D-043
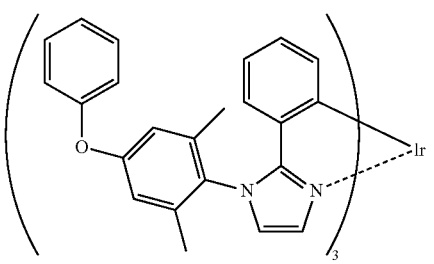
D-044

D-045 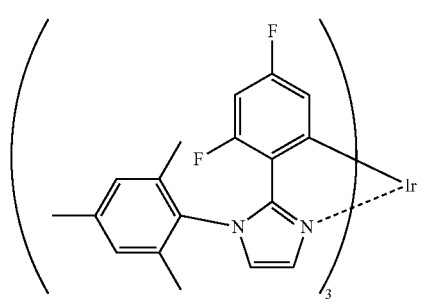
D-046 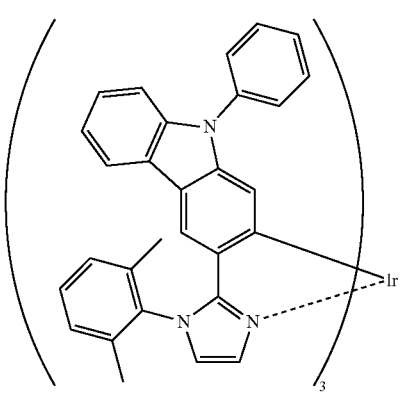
D-047 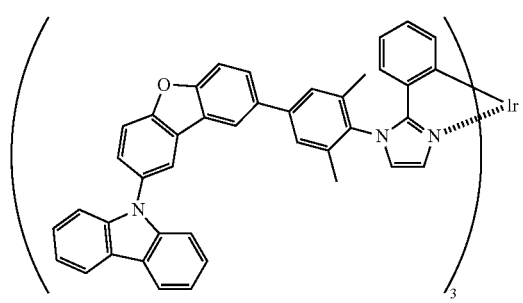
D-048 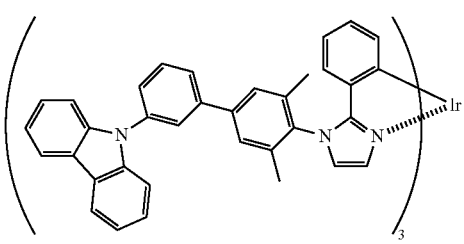
D-049 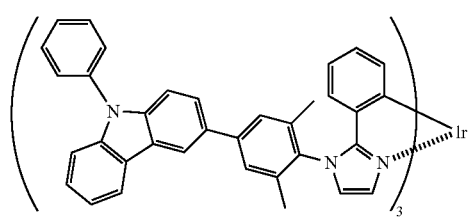
D-050 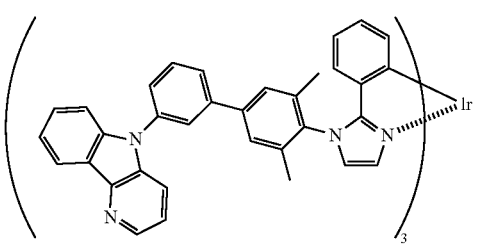
D-051 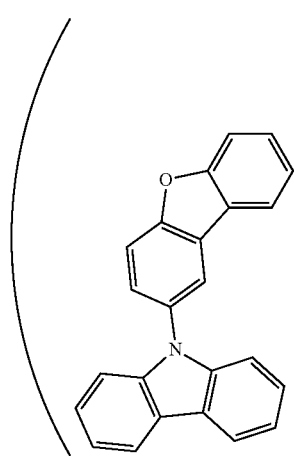

-continued
D-052
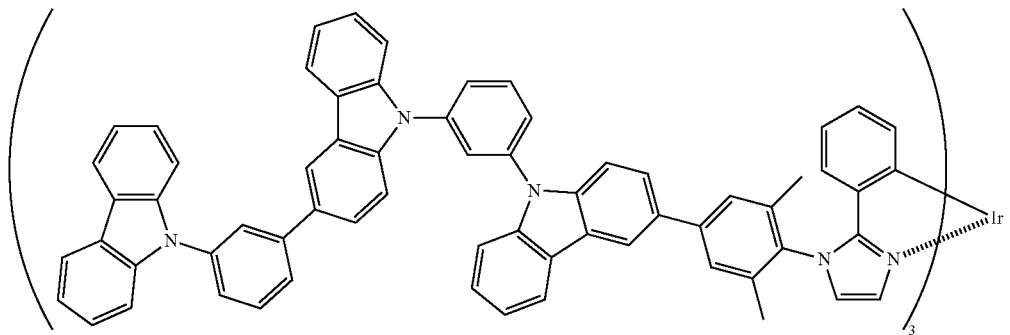
D-053
D-054
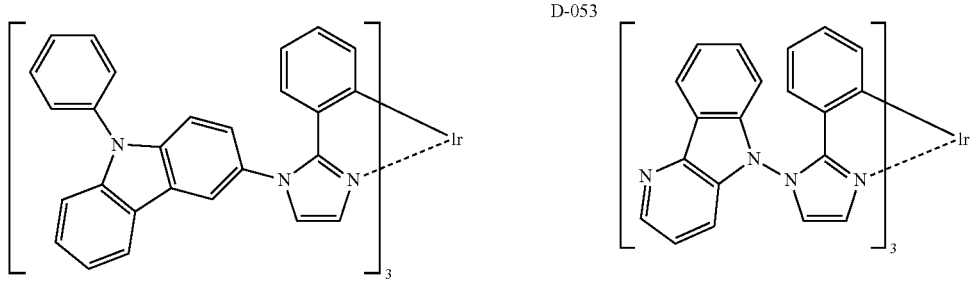
D-055
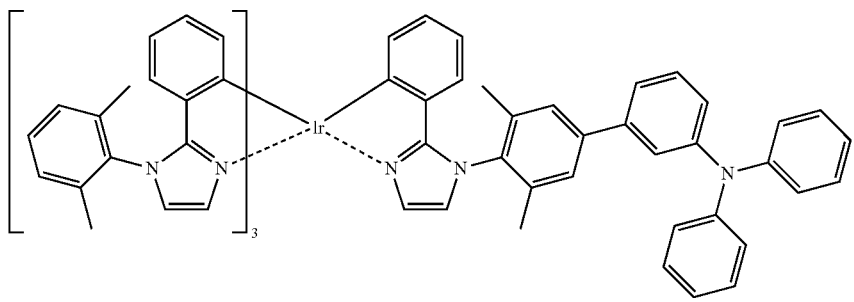
D-056
D-057
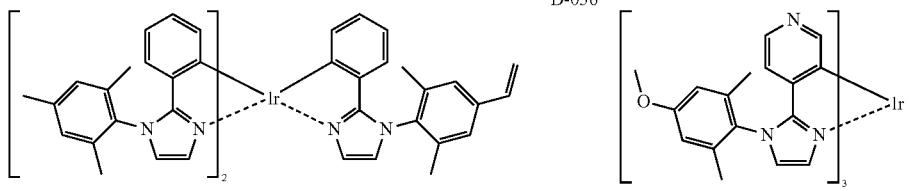
D-058
D-059
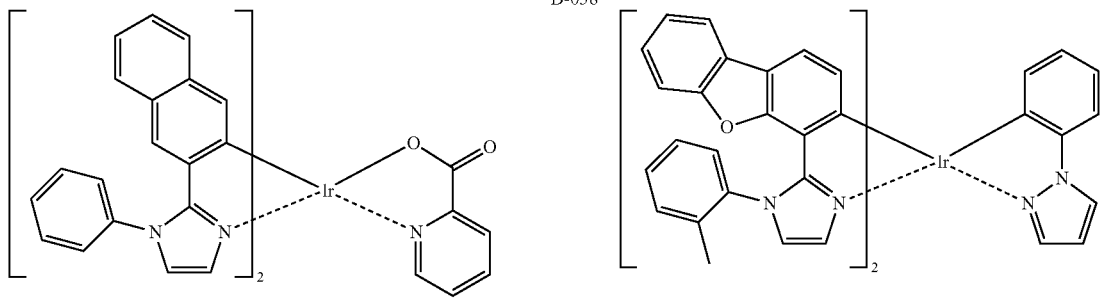

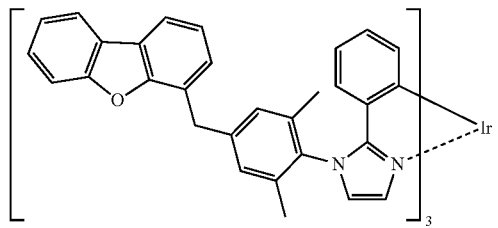
D-060
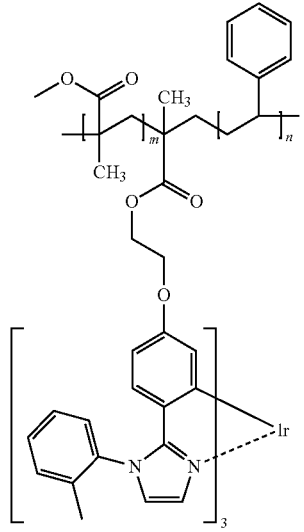
D-061
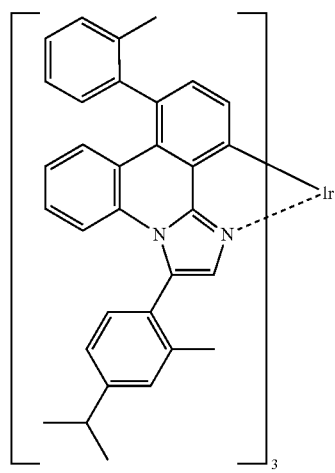
D-062
An organic EL element of the present invention can use another known phosphorescent light-emitting compound by selecting optionally together with the compound represented by Formula (2). Practical examples of the phosphorescent light-emitting compound can be used in combination with the compound of Formula (2) are shown below.
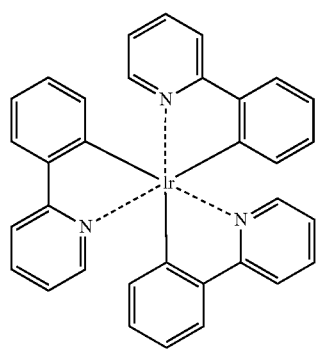
Ir-1
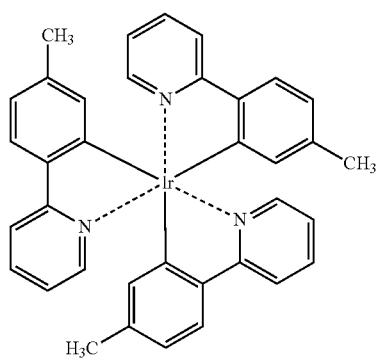
Ir-2

-continued
Ir-3
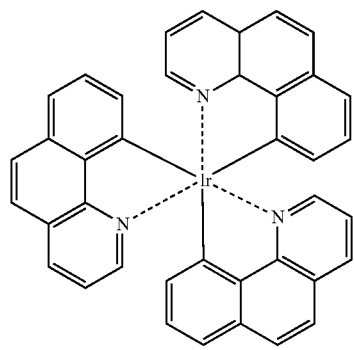
Ir-4
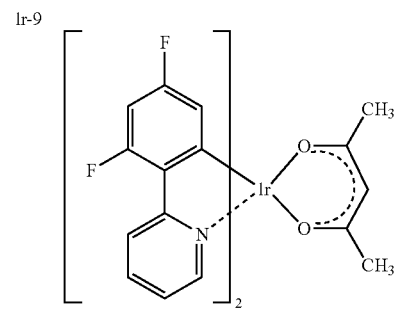
Ir-5
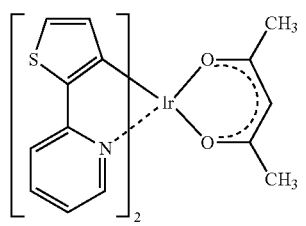
Ir-6
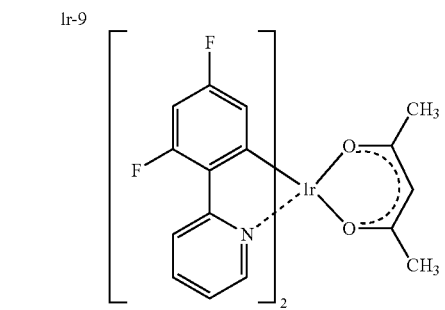
Ir-7
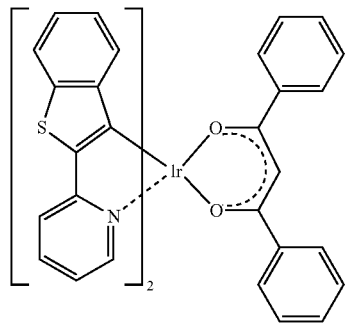
Ir-8
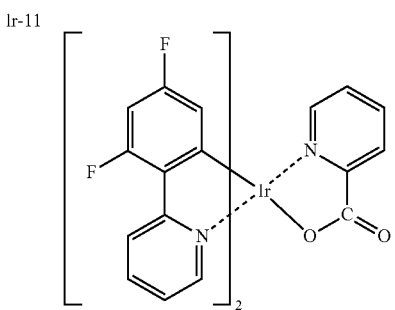
Ir-9
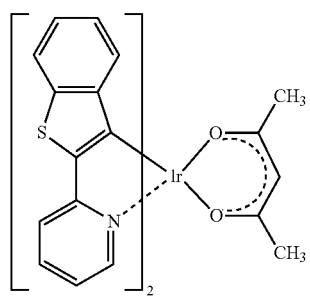
Ir-10
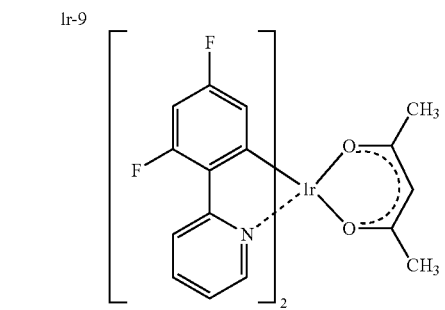
Ir-11
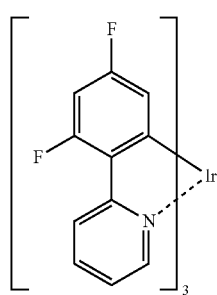
Ir-12
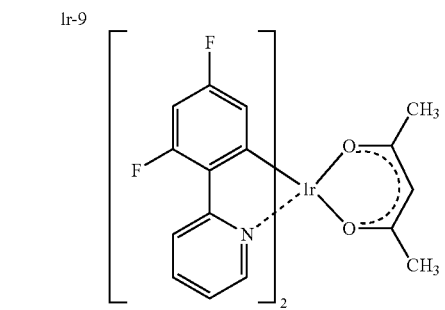

-continued
Ir-13 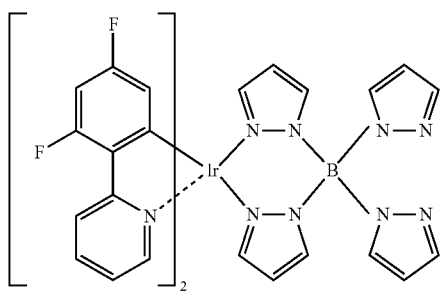 Ir-14 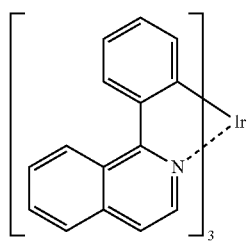
Ir-15 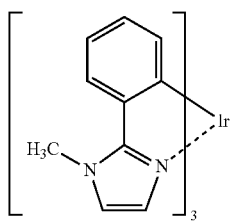 Ir-16 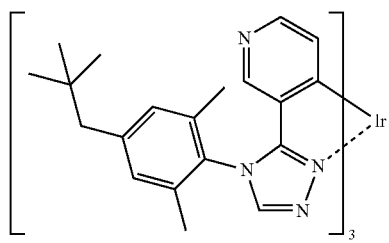
Ir-17 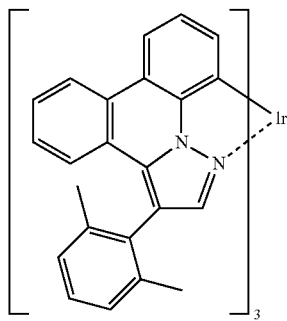 Ir-18 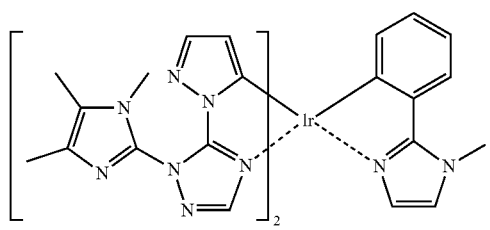
Ir-19 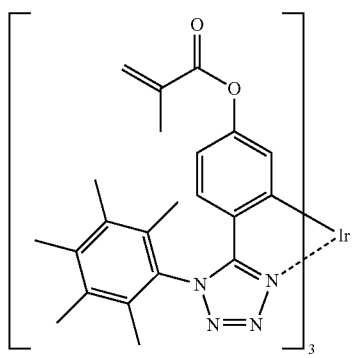 Ir-20
Ir-21 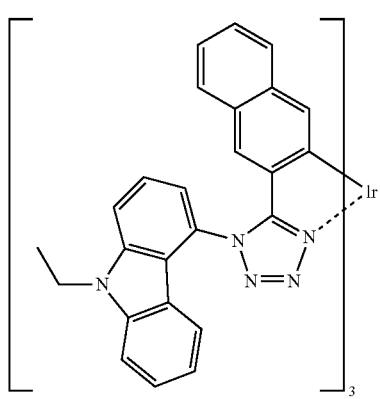 Pt-1 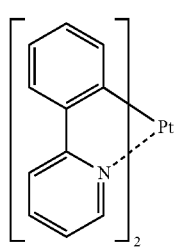

-continued
Pt-2 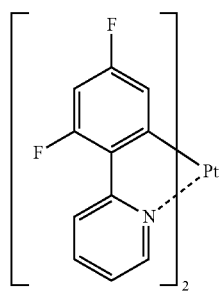
Pt-3 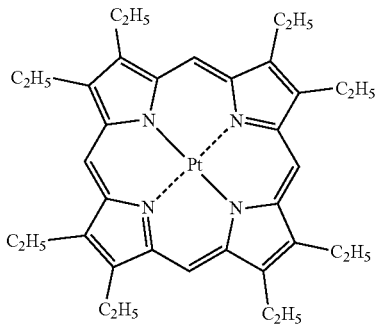
A-1 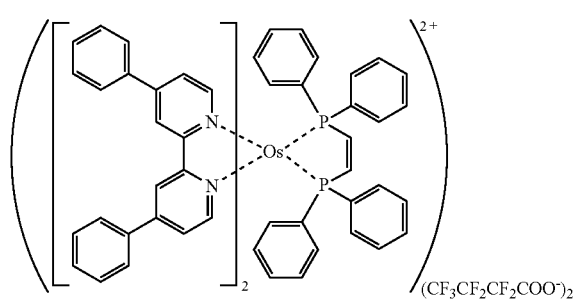
D-1 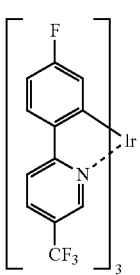
D-2 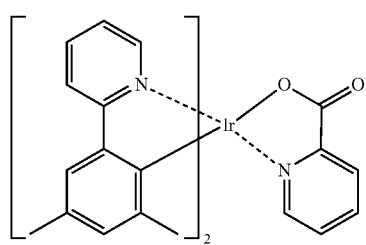
D-3 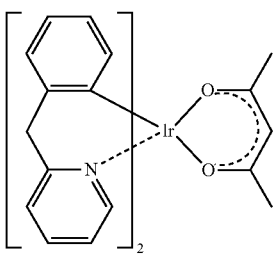
D-4 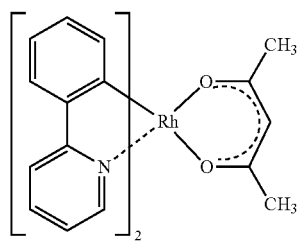
D-5 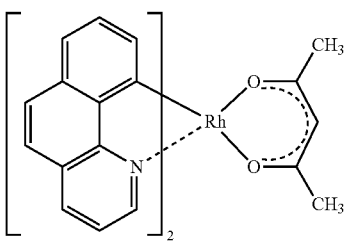
D-6 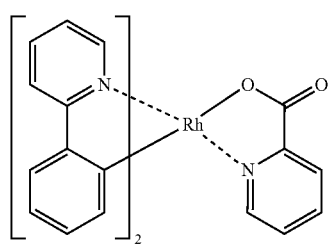
Pd-1

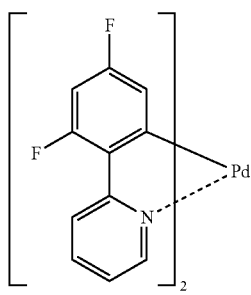
Pd-2

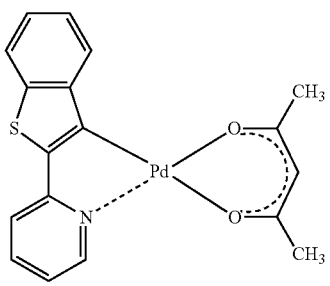
Pd-3

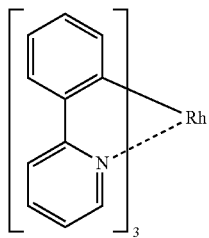
Rh-1

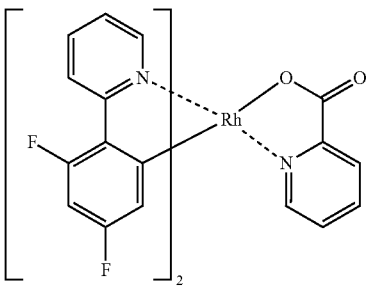
Rh-2

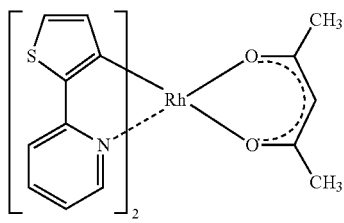
Rh-3

(Fluorescent Dopant)

As fluorescent dopants, listed are coumarin based dyes, pyran based dyes, cyanine based dyes, croconium based dyes, squarylium based dyes, oxobenzanthracene based dyes, fluorescein based dyes, Rhodamine based dyes, pyrylium based dyes, perylene based dyes, stilbene based dyes, polythiophene based dyes, or rare earth complex based fluorescent materials.

An injection layer, an inhibition layer, and an electron transport layer, which are employed as a constituting layer of the organic EL element of the present invention will now be described.

(Electron Transport Layer)

An electron transfer layer is composed of a material having a function to transfer an electron, and an electron injection layer and a hole inhibition layer are included in an electron transfer layer in a broad meaning. A single layer or plural layers of an electron transfer layer may be provided.

Heretofore, when an electron transport layer is composed of single layer and a plurality of layers, electron transport materials (also functioning as a hole inhibition material) employed in the electron transport layer adjacent to the cathode side with respect to the light emitting layer, electrons ejected from the cathode may be transported to the light emitting layer. As such materials, any of the conventional compounds may be selected and employed.

Examples of these compounds include such as a nitro-substituted fluorene derivative, a diphenylquinone derivative, a thiopyradine oxide derivative, carbodiimide, a fluorenylidenemethane derivative, anthraquinonedimethane, an anthraquinone derivative, an anthrone derivative and an oxadiazole derivative.

Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material.

Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emitting layer, can be also utilized as an electron transfer material, and, similarly to the case of a hole injection layer and a hole transfer layer, an inorganic semiconductor such as an n-type-Si and an n-type-SiC can be also utilized as an electron transfer material.

This electron transport layer can be prepared by forming a film made of the above-described electron transport material according to a method known in the art such as a vacuum evaporation method, a spin coating method, a cast method, a printing method including an inkjet method and a LB method.

The layer thickness of an electron transport layer is not specifically limited; however, it is generally 5 nm to 5 μm, and preferably 5 nm to 200 nm. This electron transport layer may have a single layer structure composed of one or not less than two types of the above described materials.

Further, it is possible to employ an electron transport layer doped with impurities, which exhibits high n property. Examples thereof include those, described in JP-A Nos. H04-297076, 1110-270172, 2000-196140, 2001-102175, as well as J. Appl. Phys., 95, 5773 (2004).

The present invention is preferable since by employing an electron transport layer of such a high n property electron transport layer, it is possible to preparer an element of further lowered electric power consumption.

(Inhibition Layer: Hole Inhibition Layer, Electron Inhibition Layer)

An inhibition layer is appropriately provided in addition to the basic constitution layers composed of organic films as described above. Examples are described in such as JP-A Nos. H11-204258 and H11-204359 and p. 273 of "Organic Electroluminescent Elements and Industrialization Front Thereof (Nov. 30 (1998), published by N. T. S Corp.)" is applicable to a hole inhibition (hole block) layer according to the present invention.

A hole inhibition layer, in a broad meaning, is provided with a function of electron transport layer, being composed of a material having a function of transporting an electron but a very small ability of transporting a hole, and can improve the recombination probability of an electron and a hole by inhibiting a hole while transporting an electron.

Further, a constitution of an electron transport layer described later can be appropriately utilized as a hole inhibition layer according to the present invention according to needs.

The hole inhibition layer of the organic EL element of the present invention is preferably arranged adjacent to the light emitting layer.

Further, in the present intention, in the case in which a plurality of light emitting layers which differ in a plurality of different emitted light colors, it is preferable that the light emitting layer which results in the shortest wavelength of the emitted light maximum wavelength is nearest to the anode in all light emitting layers. However, in such a case, it is preferable to additionally arrange the hole inhibition layer between the aforesaid shortest wavelength layer and the light emitting layer secondly near the anode.

Further, at least 50% by weight of the compounds incorporated in the hole inhibition layer arranged in the aforesaid position preferably exhibits the ionization potential which is greater by at least 0.3 eV than that of the host compounds of the aforesaid shortest wavelength light emitting layer.

The ionization potential is defined as energy which is necessary to release electrons in the HOMO (being the highest occupied molecular orbital) to the vacuum level, and may be determined via, for example, the method described below.

(1) By employing Gaussian 98 (Gaussian 98, Revision A. 11. 4, M. J. Frisch, et al. Gaussian 98 (Gaussian 98, Revision A. 11. 4, M. J. Frisch, et al, Gaussian, Inc., Pittsburgh Pa., 2002), which is a molecular orbital calculation software, produced by Gaussian Co. in the United State of America, and by employing B3LYP/6-31G* as a key word, the value (in terms of corresponding eV unit) was computed, and it is possible to obtain the ionization potential by rouging off the second decimal point. The background, in which the resulting calculated values are effective, is that the calculated values obtained by the above method exhibit high relationship with the experimental values.

(2) It is possible to determine the ionization potential via a method in which ionization potential is directly determined employing a photoelectron spectrometry. For example, by employing a low energy electron spectrophotometer "Model AC-1", produced by Riken Keiki Co., or appropriately employ a method known as an ultraviolet light electron spectrometry.

On the other hand, the electron inhibition layer, as described herein, has a function of the hole transport layer in a broad sense, and is composed of materials having markedly small capability of electron transport, while having capability of transporting holes and enables to enhance the recombination probability of electrons and holes by inhibiting electrons, while transporting electrons.

Further, it is possible to employ the constitution of the hole transport layer, described below, as an electron inhibition layer when needed. The thickness of the hole inhibition layer and the electron transport layer according to the present invention is preferably 3 to 100 nm, but is more preferably 5 to 30 nm.

(Anode)

As an anode according to an organic electroluminescent element of the present invention, those comprising metal, alloy, a conductive compound, which is provided with a large work function (not less than 4 eV), and a mixture thereof as an electrode substance are preferably utilized.

Specific examples of such an electrode substance include a conductive transparent material such as metal like Au, CuI, indium tin oxide (ITO), $SnO_2$ and ZnO.

Further, a material such as IDIXO ($In_2O_3$—ZnO), which can prepare an amorphous and transparent electrode, may be also utilized. As for an anode, these electrode substances may be made into a film by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. Alternatively, when materials capable of coating such as organic electrically conductive compounds are employed, it is possible to employ a wet system filming method such as a printing system or a coating system.

When emission is taken out of this anode, the transmittance is preferably set to not less than 10% and the sheet resistance as an anode is preferably not more than a few hundreds Ω/58. Further, although the layer thickness depends on a material, it is generally selected in a range of 10 to 1,000 nm and preferably of 10 to 200 nm.

(Cathode)

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a film by a method such as evaporation or spattering.

Further, the sheet resistance as a cathode is preferably not more than a several hundreds $\Omega/\square$ and the layer thickness is generally selected in a range of 10 nm to 5 µm and preferably of 10 to 200 nm. Herein, to transmit emission, either one of an anode or a cathode of an organic electroluminescent element is preferably transparent or translucent to improve the mission luminance.

Further, after forming, on the cathode, the above metals at a film thickness of 1 to 20 nm, it is possible to prepare a transparent or translucent cathode in such a manner that electrically conductive transparent materials are prepared thereon. By applying the above, it is possible to produce an element in which both anode and cathode are transparent.

(Substrate)

A substrate according to an organic electroluminescent element of the present invention is not specifically limited to a specific type of substrate such as glass and plastics. They may be transparent or opaque. However, a transparent substrate is preferable when the emitting light is taken from the side of substrate.

Substrates preferably utilized includes such as glass, quartz and transparent resin film. A specifically preferable substrate is resin film capable of providing an organic electroluminescent element with a flexible property.

Resin film includes such as: polyesters such as polyethylene terephthalate (PET) and polyethylene naphthalate (PEN); polyethylene, polypropylene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornane resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefin resins such as ARTON (produced by JSR Co. Ltd.) and APEL (produce by Mitsui Chemicals, Inc.)

On the surface of a resin film, formed may be a film incorporating inorganic and organic compounds or a hybrid film of both. Barrier films are preferred at a water vapor permeability (25±0.5° C., and relative humidity (90±2) % RH) of at most 0.01 g/(m$^2$·24 h), determined based on JIS K 7129-1992. Further, high barrier films are preferred at an oxygen permeability of at most $1\times10^{-3}$ ml/(m$^2$·24 h·MPa), and at a water vapor permeability of at most $10^{-5}$ g/(m$^2$·24 h), determined based on JIS K 7126-1987.

As materials forming a barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel, films, opaque resin substrates, and ceramic substrates.

The external extraction efficiency of light emitted by the organic EL element of the present invention is preferably at least 1% at room temperature, but is more preferably at least 5%. External extraction quantum yield (%)=the number of photons emitted by the organic EL element to the exterior/the number of electrons fed to organic EL element Further, even by simultaneously employing color hue improving filters such as a color filter, simultaneously employed may be color convention filters which convert emitted light color from the organic EL element to multicolor by employing fluorescent materials. When the color conversion filters are employed, it is preferable that λmax of light emitted by the organic EL element is at least 480 nm.

(Sealing)

As sealing means employed in the present invention, listed may be, for example, a method in which sealing members, electrodes, and a supporting substrate are subjected to adhesion via adhesives.

The sealing members may be arranged to cover the display region of an organic EL element, and may be an engraved plate or a flat plate. Neither transparency nor electrical insulation is limited.

Specifically listed are glass plates, polymer plate-films, metal plates, and films. Specifically, it is possible to list, as glass plates, soda-lime glass, barium-strontium containing glass, lead glass, aluminosilicate glass, borosilicate glass, barium borosilicate glass, quartz and the like. Further, listed as polymer plates may be polycarbonate, acryl, polyethylene terephthalate, polyether sulfide, and polysulfone. As a metal plate, listed are those composed of at least one metal selected from the group consisting of stainless steel, iron, copper, aluminum magnesium, nickel, zinc, chromium, titanium, molybdenum, silicon, germanium, and tantalum, or alloys thereof.

In the present invention, since it is possible to convert the element to a thin film, it is possible to preferably employ a metal film. Further, the oxygen permeability of the polymer film is preferably at most $1\times10^{-3}$ ml/(m$^2$·24 h·MPa), determined by the method based on JIS K 7126-1987, while its water vapor permeability (at 25±0.5° C. and relative humidity (90±2) % RH) is at most $10^{-5}$ g/(m$^2$·24 h), determined by the method based on JIS K 7129-1992.

Processing the sealing member into concave is carried out employing a sand blast process or a chemical etching process.

In practice, as adhesives, listed may be photo-curing and heat-curing types having a reactive vinyl group of acrylic acid based oligomers and methacrylic acid, as well as moisture curing types such as 2-cyanoacrylates.

Further listed may be thermal and chemical curing types (mixtures of two liquids) such as epoxy based ones. Still further listed may be hot-melt type polyamides, polyesters, and polyolefins. Yet further listed may be canonically curable type ultraviolet radiation curable type epoxy resin adhesives.

In addition, since an organic EL element is occasionally deteriorated via a thermal process, those are preferred which enable adhesion and curing between room temperature and 80° C. Further, desiccating agents may be dispersed into the aforesaid adhesives. Adhesives may be applied onto sealing portions via a commercial dispenser or printed on the same in the same manner as screen printing.

Further, it is appropriate that on the outside of the aforesaid electrode which interposes the organic layer and faces the support substrate, the aforesaid electrode and organic layer are covered, and in the form of contact with the support substrate, inorganic and organic material layers are formed as a sealing film. In this case, as materials forming the aforesaid film may be those which exhibit functions to retard penetration of those such as moisture or oxygen which results in deterioration. For example, it is possible to employ silicon oxide, silicon dioxide, and silicon nitride. Still further, in order to improve brittleness of the aforesaid film, it is preferable that a laminated layer structure is formed, which is composed of these inorganic layers and layers composed of organic materials. Methods to form these films are not particularly limited.

It is possible to employ, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In a gas phase and a liquid phase, it is preferable to inject inert gases such as nitrogen or argon, and inactive liquids such as fluorinated hydrocarbon or silicone oil into the space between the sealing member and the surface region of the organic EL element. Further, it is possible to form vacuum. Still further, it is possible to enclose hygroscopic compounds in the interior.

Examples of hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In sulfates, metal halides, and perchlorates, suitably employed are anhydrides.

<<Protective Film and Protective Plate>>

The aforesaid sealing film on the side which nips the organic layer and faces the support substrate or on the outside of the aforesaid sealing film, a protective or a protective plate may be arranged to enhance the mechanical strength of the element.

Specifically, when sealing is achieved via the aforesaid sealing film, the resulting mechanical strength is not always high enough, whereby it is preferable to arrange the protective film or the protective plate described above. Usable materials for these include glass plates, polymer plate-films, and metal plate-films which are similar to those employed for the aforesaid sealing. However, in terms of light weight and a decrease in thickness, it is preferable to employ polymer films.

(Light Extraction)

It is generally known that an organic EL element emits light in the interior of the layer exhibiting the refractive index (being about 1.7 to about 2.1) which is greater than that of air, whereby only about 15 to about 20% of light generated in the light emitting layer is extracted.

This is due to the fact that light incident to an interface (being an interface of a transparent substrate to air) at an angle of $\theta$ which is at least critical angle is not extracted to the exterior of the element due to the resulting total reflection, or light is totally reflected between the transparent electrode or the light emitting layer and the transparent substrate, and light is guided via the transparent electrode or the light emitting layer, whereby light escapes in the direction of the element side surface.

Means to enhance the efficiency of the aforesaid light extraction include, for example, a method in which roughness is formed on the surface of a transparent substrate, whereby total reflection is minimized at the interface of the transparent substrate to air (U.S. Pat. No. 4,774,435), a method in which efficiency is enhanced in such a manner that a substrate results in light collection (JP-A No. S63-314795), a method in which a reflection surface is formed on the side of the element (JP-A No. H01-220394), a method in which a flat layer of a middle refractive index is introduced between the substrate and the light emitting body and an antireflection film is formed (JP-A No. S62-172691), a method in which a flat layer of a refractive index which is equal to or less than the substrate is introduced between the substrate and the light emitting body (JP-A No. 2001-202827), and a method in which a diffraction grating is formed between the substrate and any of the layers such as the transparent electrode layer or the light emitting layer (including between the substrate and the outside) (JP-A No. H11-283751).

In the present invention, it is possible to employ these methods while combined with the organic EL element of the present invention. Of these, it is possible to appropriately employ the method in which a flat layer of a refractive index which is equal to or less than the substrate is introduced between the substrate and the light emitting body and the method in which a diffraction grating is formed between the substrate and any of the layers such as the transparent electrode layer or the light emitting layer (including between the substrate and the outside).

By combining these means, the present invention enables the production of elements which exhibit higher luminance or excel in durability.

When a low refractive index medium of a thickness, which is greater than the wavelength of light, is formed between the transparent electrode and the transparent substrate, the extraction efficiency of light emitted from the transparent electrode to the exterior increases as the refractive index of the medium decreases.

As materials of the low refractive index layer, listed are, for example, aerogel, porous silica, magnesium fluoride, and fluorine based polymers. Since the refractive index of the transparent substrate is commonly about 1.5 to about 1.7, the refractive index of the low refractive index layer is preferably at most approximately 1.5, but is more preferably at most 1.35.

Further, thickness of the low refractive index medium is preferably at least two times the wavelength in the medium. The reason is that when the thickness of the low refractive index medium reaches nearly the wavelength of light so that electromagnetic waves oozed via evanescent enter into the substrate, effects of the low refractive index layer are lowered.

The method in which the interface which results in total reflection or a diffraction grating is introduced in any of the media is characterized in that light extraction efficiency is significantly enhanced.

The above method works as follows. By utilizing properties of the diffraction grating capable of changing the light direction to the specific direction different from diffraction via so-called Bragg diffraction such as primary diffraction or secondary diffraction of the diffraction grating, of light emitted from the light emitting layer, light, which is not emitted to the exterior due to total reflection between layers, is diffracted via introduction of a diffraction grating between any layers or in a medium (in the transparent substrate and the transparent electrode) so that light is extracted to the exterior.

It is preferable that the introduced diffraction grating exhibits a two-dimensional periodic refractive index. The reason is as follows. Since light emitted in the light emitting layer is randomly generated to all directions, in a common one-dimensional diffraction grating exhibiting a periodic refractive index distribution only in a certain direction, light which travels to the specific direction is only diffracted, whereby light extraction efficiency is not sufficiently enhanced. However, by changing the refractive index distribution to a two-dimensional one, light, which travels to all directions, is diffracted, whereby the light extraction efficiency is enhanced.

As noted above, a position to introduce a diffraction grating may be between any layers or in a medium (in a transparent substrate or a transparent electrode). However, a position near the organic light emitting layer, where light is generated, is desirous. In this case, the cycle of the diffraction grating is preferably about ½ to about 3 times the wavelength of light in the medium.

The preferable arrangement of the diffraction grating is such that the arrangement is two-dimensionally repeated in the form of a square lattice, a triangular lattice, or a honeycomb lattice.

(Light Collection Sheet)

Via a process to arrange a structure such as a micro-lens array shape on the light extraction side of the organic EL element of the present invention or via combination with a so-called light collection sheet, light is collected in the specific direction such as the front direction with respect to the light emitting element surface, whereby it is possible to enhance luminance in the specific direction.

In an example of the micro-lens array, square pyramids to realize a side length of 30 μm and an apex angle of 90 degrees are two-dimensionally arranged on the light extraction side of the substrate. The side length is preferably 10 to 100 μm. When it is less than the lower limit, coloration occurs due to generation of diffraction effects, and when it exceeds the upper limit, the thickness increases undesirably.

It is possible to employ, as a light collection sheet, for example, one which is put into practical use in the LED backlight of liquid crystal display devices. It is possible to employ, as such a sheet, for example, the luminance enhancing film (BEF), produced by Sumitomo 3M Limited. As shapes of a prism sheet employed may be, for example, pyramid shaped stripes of an apex angle of 90 degrees and a pitch of 50 μm formed on a base material, a shape in which the apex angle is rounded, a shape in which the pitch is randomly changed, and other shapes.

Further, in order to control the light radiation angle from the light emitting element, simultaneously employed may be a light diffusion plate-film. For example, it is possible to employ the diffusion film (LIGHT-UP), produced by Kimoto Co., Ltd.

(Preparation Method of Organic EL Element)

As one example of the preparation method of the organic EL element of the present invention, the preparation method of the organic EL element composed of anode/hole injection layer/positive hole transport layer/light emitting layer/electron transport layer/electron injection layer/cathode will be described.

Initially, a thin film composed of desired electrode substances, for example, anode substances is formed on an appropriate base material to reach a thickness of at most 1 μm, preferably 10 to 200 nm, employing a method such as vapor deposition or sputtering, whereby an anode is prepared.

Subsequently, on the above, formed are organic compound films including a positive hole injection layer, a positive hole transport layer, a light emitting layer, a positive hole inhibition layer, an electron transport layer, and an electron injection layer, which are organic EL element materials.

Methods to form each of these layers include, as described above, a vapor deposition method and a wet process (a spin coating method, a casting method, an ink-jet method, and a printing method). In the present invention, in view of easy formation of a homogeneous film and rare formation of pin holes, preferred is film formation via the coating method such as the spin coating method, the ink-jet method, or the printing method.

The hole transport layer in relation to the invention is preferably formed by subjecting to polymerization reaction via heat or ultra violet ray after forming the layer by a coating method described above. A polymerization initiator may be added to the hole transport material, if required, when the polymerization reaction does not progress sufficiently.

It is preferable that 50% or more layers of the total number of layers s between the anode and the cathode in layer arrangement of an organic EL element, provided that total number of layers is designated as 100%.

This means that it is preferable that, for example, at least three layers are formed by a coating method among six layers as a total of hole injection layer/hole transport layer/light-emitting layer/hole blocking layer/electron transport layer/electron injection layer in the organic EL element composed of anode/hole injection layer/hole transport layer/light-emitting layer/hole blocking layer/electron transport layer/electron injection layer/cathode described above as an example.

As liquid media which are employed to dissolve or disperse organic metal complexes according to the present invention, employed may be, for example, ketones such as methyl ethyl ketone or cyclohexanone; fatty acid esters such as ethyl acetate; halogenated hydrocarbons such as dichlorobenzene; aromatic hydrocarbons such as toluene, xylene, mesitylene and cyclohexylbenzene; aliphatic hydrocarbons such as cyclohexane, decaline and dodecane; and organic solvents such as DMF or DMSO.

Further, with regard to dispersion methods, it is possible to achieve dispersion employing dispersion methods such as ultrasonic waves, high shearing force dispersion or media dispersion.

After forming these layers, a film composed of cathode materials is formed on the above layers via a method such as vapor deposition or sputtering so that the film thickness reaches at most 1 μm, but is preferably in the range of 50 to 200 nm, whereby a cathode is arranged, and the desired organic EL element is prepared.

Further, by reversing the preparation order, it is possible to achieve preparation in order of a cathode, an electron injection layer, an electron transport layer, a light emitting layer, a hole transport layer, a hole injection layer, and an anode.

When direct current voltage is applied to the multicolor display device prepared as above, the anode is employed as + (positive) polarity, while the cathode is employed as − (negative) polarity. When 2 to 40 V is applied, it is possible to observe light emission. Further, alternating current voltage may be applied. The wave form of applied alternating current voltage is not specified.

(Application)

It is possible to employ the organic EL element of the present invention as display devices, displays, and various types of light emitting sources. Examples of light emitting sources include, but are not limited to lighting apparatuses (home lighting and car lighting), clocks, backlight for liquid crystals, sign advertisements, signals, light sources of light memory media, light sources of electrophotographic copiers, light sources of light communication processors, and light sources of light sensors. Particularly it is used effectively for backlight for liquid crystals and source for lighting apparatuses.

If needed, the organic EL element of the present invention may undergo patterning via a metal mask or an ink-jet printing method during film formation.

When the patterning is carried out, only an electrode may undergo patterning, an electrode and a light emitting layer may undergo patterning, or all element layers may undergo patterning. During preparation of the element, it is possible to employ conventional methods.

Figure 4:
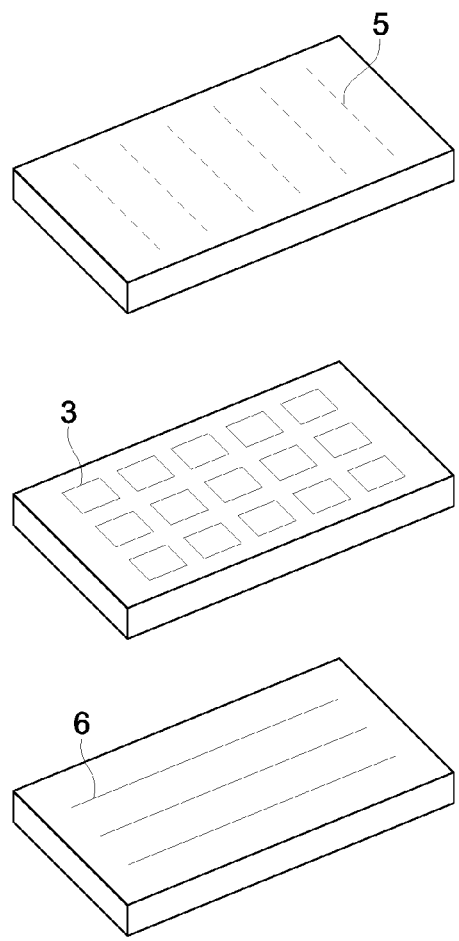
FIG. 4: A schematic view of passive matrix type full color a display device.

Color of light emitted by the organic EL element of the present invention and compounds according to the present invention is specified as follows. In Fig. 4.16 on page 108 of "Shinpen Shikisai Kagaku Handbook (New Edition Color Science Handbook)" (edited by The Color Science Association of Japan, Tokyo Daigaku Shuppan Kai, 1985), values determined via a spectroradiometric luminance meter CS-1000 (produced by Konica Minolta Sensing Inc.) are applied to the CIE chromaticity coordinate, whereby the color is specified.

Further, when the organic EL element of the present invention is a white element, "white", as described herein, means that when 2-degree viewing angle front luminance is determined via the aforesaid method, chromaticity in the CIE 1931 Color Specification System is within the region of $X=0.33\pm0.07$ and $Y=0.33\pm0.07$.

(Display Device)

Display device according to the invention is described. The display device according to the invention is provided with an organic EL element of the invention.

The display device according to the invention includes mono-color and full color, the description is made for the multi-color display device here. In the multicolor display of the present invention, the light emitting layer only is formed using a shadow mask, and the other layers are formed employing a vacuum deposition method, a casting method, a spin coat method or a printing method on one side. When the light emitting layer only is formed by patterning, the layer formation, although not specifically limited, is carried out preferably according to a vacuum deposition method, an ink jet method or a printing method.

The constitution of the organic EL element provided to a display device is selected from constitution examples of the constitutions of the organic EL element if necessary. A manufacturing method of the organic EL element is the same as an embodiment of the manufacturing method of the organic EL element of the invention.

When a direct current voltage of 2 to 40 V is applied to thus obtained multicolor display, setting the anode as a + (positive) polarity and the cathode as a − (negative) polarity, light emission occurs. When the direct current voltage is applied in a reverse polarity, current does not observed and light emission does not occur at all. When an alternative current is applied, light emission occurs only at a state in which anode is positive and cathode is negative. The waveform of the alternative current is optional.

The multi-color display can be used as a display device, a display, or various light emission sources. The display device or the display, which employs three kinds of organic EL elements emitting a blue light, a red light and a green light can present a full color image.

Examples of the display device or the display include a television, a personal computer, a mobile device or an AV device, a display for text broadcasting, and an information display used in a car. The display device may be used as specifically a display for reproducing a still image or a moving image. When the display device is used as a display for reproducing a moving image, the driving method may be either a simple matrix (passive matrix) method or an active matrix method.

Examples of an illuminator include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, however, are not limited thereto.

An example of the display device containing the organic EL element of the present invention will be explained below employing drawings.

FIG. 1 is a schematic drawing of one example of a display containing an organic EL element. It is a schematic drawing of a display such as a mobile phone which displays an image information by emission of the organic EL element.

A display 1 contains a display section A having plural pixels and a control section B carrying out image scanning based on image information to display an image in the display section A.

The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
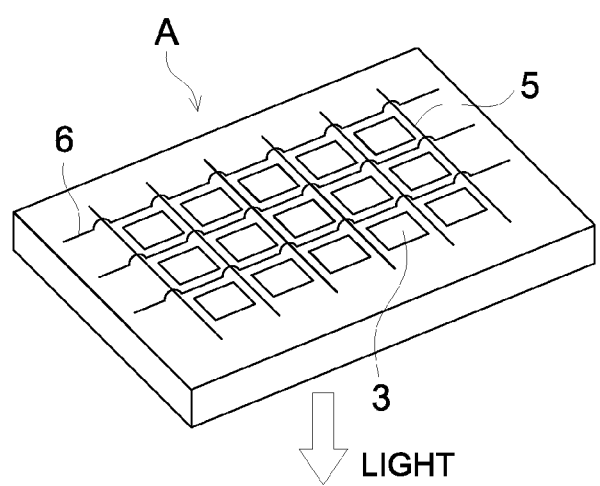
FIG. 2: A schematic view of display part A.

FIG. 2 is a schematic drawing of a display section A.

The display section A contains a substrate, plural pixels 3, and a wiring section containing plural scanning lines 5 and plural data lines 6. The main members of the display section A will be explained below.

In FIG. 2, light from pixels 3 is emitted in the direction of an arrow.

The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated in detail).

The plural pixels 3, when the scanning signal is applied from the scanning lines 5, receive the data signal from the data lines 6, and emit light corresponding to the image data received.

Provision of red light emitting pixels, green light emitting pixels, and blue light emitting pixels side by side on the same substrate can display a full color image.

Next, an emission process of pixels will be explained.

Figure 3:
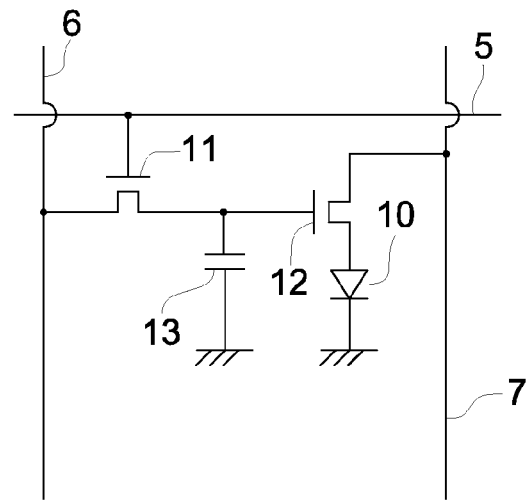
FIG. 3: A schematic view of pixel.

FIG. 3 is a schematic drawing of a pixel.

The pixel contains an organic EL element 10, a switching transistor 11, a driving transistor 12, and a capacitor 13. When a pixel with a red light emitting organic EL element, a pixel with a green light emitting organic EL element, and a pixel with a blue light emitting organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, or emission due to on-off according to a binary value of the image data signals. The electric potential of the capacitor 13 may maintain till the next application of the scanning signal, or may be discharged immediately before the next scanning signal is applied.

In the present invention, light emission may be carried out employing a passive matrix method as well as the active matrix method as described above. The passive matrix method is one in which light is emitted from the organic EL element according to the data signal only when the scanning signals are scanned.

FIG. 4 is a schematic drawing of a display employing a passive matrix method. In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal.

The passive matrix method has no active element in the pixel 3, which reduces manufacturing cost of a display.

(Lighting Device)

The lighting device is described. The lighting device of the invention contains the above described organic EL element.

The organic EL element of the present invention may be used as an organic EL element having a resonator structure therein. Such the organic EL element having resonator structure can be used as, for example, a light source of light memory medium, a light source of electrophotographic copying machine, a light source of light communication apparatus and a light source for light sensor but the use of that is not limited to the above-mentioned. The element can be used for the above-mentioned use by oscillating a laser.

The organic EL element of the present invention may be used as a kind of lamp such as the illumination light source and the exposing light source and as a projection apparatus for projecting an image or a display for directly watching a still or a moving image.

The organic EL material in relation to the invention can be applied to an organic EL element generating substantially white light as a lighting device. Plural colors are allowed to emit simultaneously by plural emitting materials and white light is obtained by color mixture. Combination of color emissions may be one containing three emission maximum wavelengths of the elementary colors of blue, green and red, or one containing two emission maximum wavelengths utilizing complementary colors such as blue and yellow, blue-green and orange and the like.

Combination of emitting material to obtain plural emitting color lights includes those in which plural materials emitting fluorescent or phosphorescent emissions are combined, and those in which a material emitting fluorescent or phosphorescent emissions and dye material emitting light by the light from the emitting material as an excitation light. It is sufficient to mix plural emitting dopants in combination in the white light organic EL element.

In this instance it is sufficient to use a mask only when the light emitting layer, hole transport layer or electron transport layer is formed, and dispose simply by coating separately employing the mask. The other layers does not require the pattering such as mask since they are common, and, for example, an electrode film can be formed by an evaporation deposition method, a casting method, a spin coating method, an ink jet method, a printing method and the like on one side, and therefore, improved productivity can be obtained.

The element emitting white light emission as itself is obtained, different from the white light organic EL device having plural emitting elements arranged in array format by this method.

Materials used for the light emitting layer are not specifically limited, and, for example, in the case of preparing a backlight of a liquid crystal display, arbitrary materials may be selected and combined from the metal complexes of the present invention or known light emitting materials to generate white light emission to adjust the wavelength range corresponding to the CF (color filter) property.

(Example of Lighting Device of the Invention)

An example of lighting devices of the invention providing the organic EL element of the invention is described.

Figure 5:
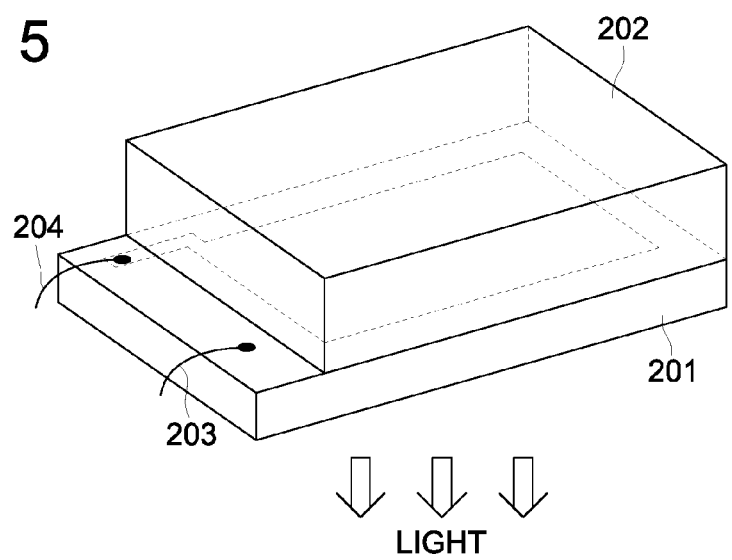
FIG. 5: A sketch of a lighting device.
Figure 6:
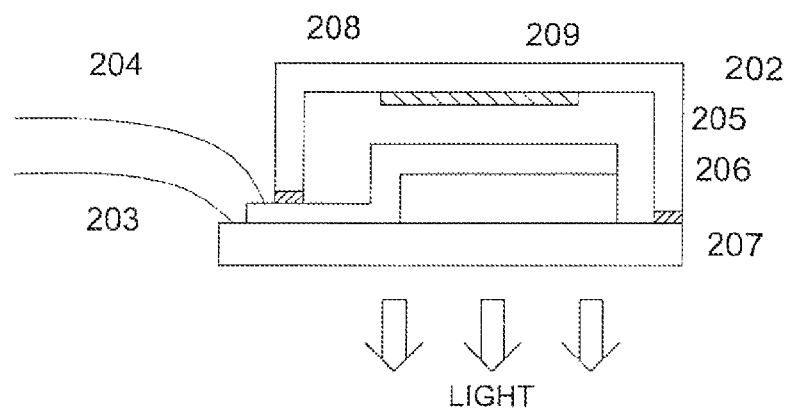
FIG. 6: A schematic view of a lighting device.
Figure 7A:
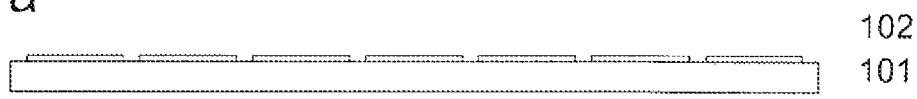
FIG. 7: Outline of composition of an organic EL full color a display device.
Figure 7B:
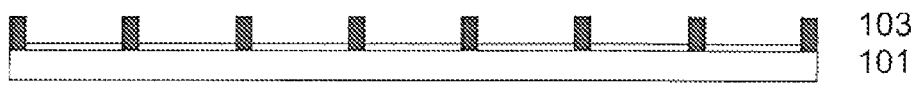
Figure 7C:
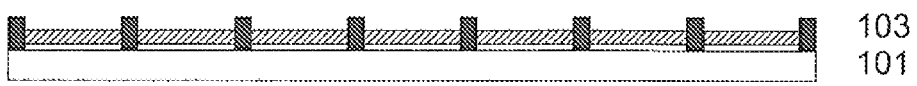
Figure 7D:
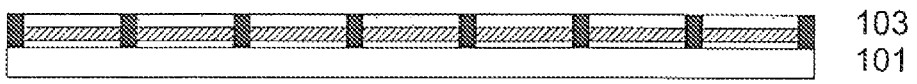
Figure 7E:
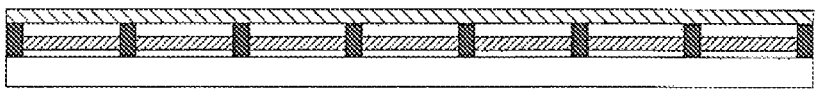

The non-light-emitting face of each of the devices was covered with a glass case and a sealing glass plate having a thickness of 300 μm was piled on the cathode so as to be contacted with the transparent substrate using an epoxy type photo curable adhesive, Laxtruck LC0629B manufactured by To a Gosei Co., Ltd., as a sealing material and sealed by curing the adhesive by irradiating UV rays from the glass plate side so as to form a lighting apparatus as shown in FIGS. 5 and 6.

FIG. 5 shows a schematic drawing of a lighting apparatus in which an organic EL element 201 was covered with a glass cover 202. The sealing operation by the glass cover was performed in a globe box under atmosphere of highly purified nitrogen of not less than 99.999% so that the organic EL element 201 was not exposed to air.

FIG. 6 shows a cross section of the lighting apparatus. In FIG. 6, 205 is a cathode, 206 is an organic EL layer, and 207 is a glass substrate having a transparent electrode. In the glass cover 202, nitrogen gas 208 was charged and a moisture capturing agent 209 was provided.

EXAMPLES

The present invention will now be described with reference to examples, however the present invention is not limited thereto. Designation "%" means "mass %" other than specified.

Example 1

(Preparation of Organic EL Film 1-1)

A 30 mm×30 mm×1.1 mm quartz substrate was subjected to ultrasonic cleaning employing isopropyl alcohol, followed by drying via desiccated nitrogen gas and cleaning via UV ozone for 5 minutes, then was set on a spin coater obtained in the market. A solution, which was prepared by dissolving 60 mg of Compound HT-007 in 10 ml of toluene, was applied onto the substrate at 1,000 rpm for 30 seconds via a spin coating method, was dried via vacuum drying at 25° C. for one hour and a film having around 25 nm was prepared.

UV ray was irradiated to the obtained film for 150 seconds and formed film of the polymer compound having structural unit of Compound HT-007 (Organic EL Film 1-1).

(Preparation of Organic EL Films 1-2 to 1-43)

Organic EL Films 1-2 to 1-43 were prepared in the same manner as preparation of Organic EL Films 1-1, except that 60 mg of Compound HT-007 was replaced by compound listed in Table 1.

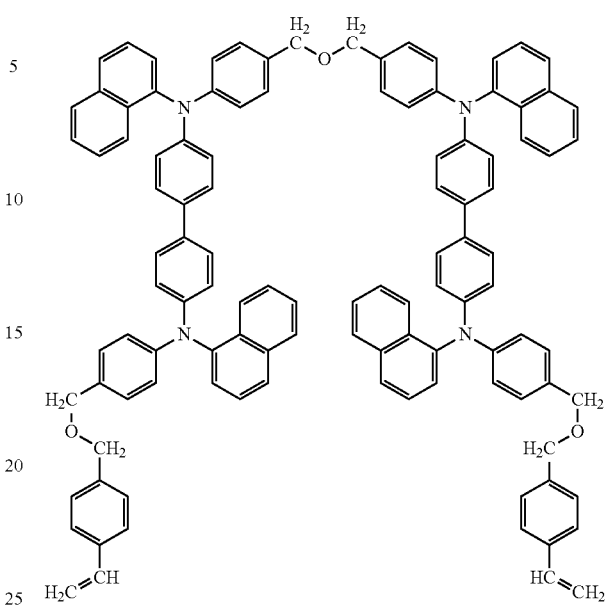

(Smoothness Evaluation of Organic EL Films)

Arithmetic mean roughness (Ra) in 50 μm square at center part of the Organic EL Films 1-1 to 1-43 before and after UV ray irradiation was measured by employing an interatomic force microscope (AFM), and ranked by the criteria shown below. The arithmetic mean roughness in relation to the invention is surface roughness defined in accordance with JIS-B 0601-1994.

A: Not more than 0.44 nm
B: 0.44 nm to 0.49 nm
C: more than 0.49 nm to 0.54 nm
D: more than 0.54 nm

TABLE 1

| Organic EL Film | Compound | Component Ratio (mass) | Surface Smoothness | Remarks |
|---|---|---|---|---|
| ** 1-1 | HT-007 | 60 mg | D | Comparative |
| ** 1-2 | EX-01 | 60 mg | D | Comparative |
| ** 1-3 | EX-02 | 60 mg | D | Comparative |
| ** 1-4 | EX-03 | 60 mg | C | Comparative |
| ** 1-5 | EX-01/EX-02 | 20 mg/40 mg | C | Comparative |
| ** 1-6 | EX-02/EX-03 | 30 mg/30 mg | D | Comparative |
| ** 1-7 | EX-01/EX-03 | 30 mg/30 mg | D | Comparative |
| ** 1-8 | HT-009 | 60 mg | D | Comparative |
| ** 1-9 | HT-010 | 60 mg | D | Comparative |
| ** 1-10 | HT-017 | 60 mg | D | Comparative |
| ** 1-11 | HT-034 | 60 mg | D | Comparative |
| ** 1-12 | HT-042 | 60 mg | D | Comparative |
| ** 1-13 | HT-044 | 60 mg | D | Comparative |
| ** 1-14 | HT-047 | 60 mg | D | Comparative |
| ** 1-15 | HT-048 | 60 mg | D | Comparative |
| ** 1-16 | HT-049 | 60 mg | D | Comparative |
| ** 1-17 | HT-050 | 60 mg | D | Comparative |
| ** 1-18 | HT-051 | 60 mg | D | Comparative |
| ** 1-19 | HT-052 | 60 mg | D | Comparative |
| ** 1-20 | HT-079 | 60 mg | D | Comparative |
| ** 1-21 | HT-115 | 60 mg | D | Comparative |
| ** 1-22 | HT-119 | 60 mg | D | Comparative |
| ** 1-23 | EX-01/HT-047 | 20 mg/40 mg | C | Comparative |
| ** 1-24 | EX-02/HT-007 | 50 mg/10 mg | D | Comparative |
| ** 1-25 | EX-03/HT-009 | 30 mg/30 mg | C | Comparative |
| ** 1-26 | EX-02/HO-010 | 30 mg/30 mg | D | Comparative |
| ** 1-27 | EX-03/HT-017 | 30 mg/30 mg | C | Comparative |
| ** 1-28 | HT-009/HT-007 | 40 mg/20 mg | A | Invention |

TABLE 1-continued

| Organic EL Film | Compound | Component Ratio (mass) | Surface Smoothness | Remarks |
|---|---|---|---|---|
| ** 1-29 | HT-010/HT-007 | 40 mg/20 mg | B | Invention |
| ** 1-30 | HT-017/HT-007 | 50 mg/10 mg | A | Invention |
| ** 1-31 | HT-034/HT-007 | 30 mg/30 mg | B | Invention |
| ** 1-32 | HT-042/HT-010 | 40 mg/20 mg | A | Invention |
| ** 1-33 | HT-044/HT-007 | 50 mg/10 mg | A | Invention |
| ** 1-34 | HT-047/HT-007 | 54 mg/6 mg | A | Invention |
| ** 1-35 | HT-048/HT-007 | 30 mg/30 mg | A | Invention |
| ** 1-36 | HT-049/HT-017 | 48 mg/12 mg | A | Invention |
| ** 1-37 | HT-050/HT-034 | 45 mg/15 mg | B | Invention |
| ** 1-38 | HT-051/HT-007 | 43 mg/17 mg | A | Invention |
| ** 1-39 | HT-052/HT-033 | 42 mg/18 mg | A | Invention |
| ** 1-40 | HT-079/HT-007 | 53 mg/7 mg | A | Invention |
| ** 1-41 | HT-115/HT-034 | 30 mg/30 mg | A | Invention |
| ** 1-42 | HT-117/HT-007 | 30 mg/30 mg | A | Invention |
| ** 1-43 | HT-119/HT-007 | 54 mg/6 mg | B | Invention |

** Organic EL Film

The organic EL films of the invention give layers exhibiting higher smoothness than the comparisons as shown above.

Example 2

(Preparation of Organic EL Element 2-1)

An anode was formed by patterning on a glass substrate, NA-45 manufactured by NH Techno Glass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by desiccated nitrogen gas and subjected to ozone cleaning for 5 minutes.

The substrate was moved to nitrogen ambient, hole injection layer was provided thereon by such manner that a solution of 10 mg of Hole Injection Material 1 described in WO06/19270 dissolved in 10 ml of acetonitrile was applied via spin coating method at 1,500 rpm for 30 seconds and vacuum dried at 100° C. for one hour. Then a solution of 60 mg of Compound HT-007 dissolved in 10 ml of toluene was applied on the hole transport layer via spin coating method at 1,500 rpm for 30 seconds in nitrogen ambient to form a layer. Photo polymerization/cross linking was conducted by UV ray irradiation at 150° C. for 30 seconds and a hole transport layer having around 20 nm thickness was formed.

A solution of 100 mg of Host Compound 1 and 15 mg of D-038 dissolved in 10 ml of toluene was applied on the hole transport layer via spin coating method at 1,000 rpm for 30 seconds to form a layer. A light emitting layer having around 50 nm was obtained by vacuum drying at 120° C. for one hour.

A solution of 50 mg of Electron Transport Material 1 dissolved in 10 ml of 1-butanol was applied on the light emitting layer via spin coating method at 5,000 rpm for 30 seconds to form a layer. An electron transport layer having around 15 nm was obtained by vacuum drying at 60° C. for one hour.

The substrate was fixed on a substrate holder of the vacuum evaporator, and pressure in the vacuum chamber was reduced to $4\times10^{-4}$ Pa, then lithium fluoride and aluminum were deposited by evaporation to form a cathode buffer layer having 1.0 nm thickness and a cathode having 110 nm, respectively, and thus Organic EL Element 2-1 was prepared.

<<Preparation of Organic EL Elements 2-2 through 2-43>>

Organic EL Elements 2-2 through 2-43 were prepared in the same way as the preparation of Organic EL element 2-1 except that, 50 mg of Compound HT-007 was replaced by Compounds shown in Table 2.

Each of the hole transport layers in Organic EL Elements 2-1 through 2-43 has the same chemical components as Example 1, and the surface of the hole transport layer in Organic EL elements 2-1 through 2-43 correspond to those in Organic EL Films 1-1 through 1-43.

Hole Transport Material 1

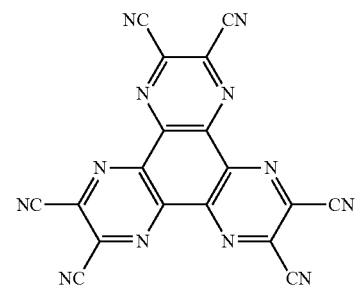

Host Compound 1

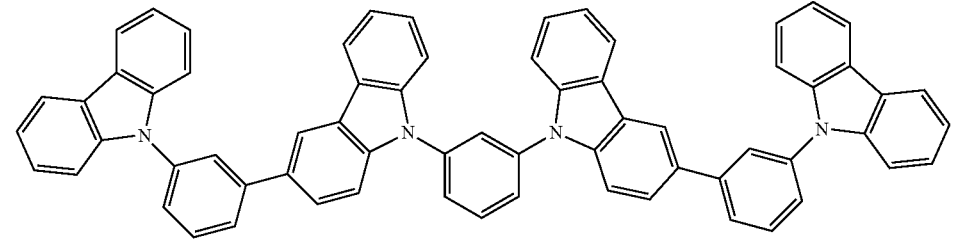

Electron Transport Material 1

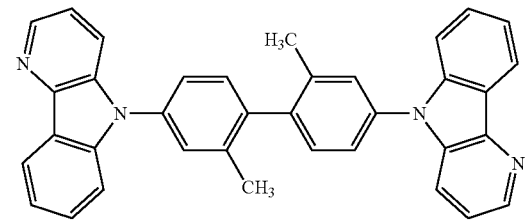

Each of non-light emitting surface of the prepared Organic EL Elements was covered with a glass case, and a sealing glass substrate having a thickness of 300 μm was superposed as a sealing substrate on the cathode so as to be contacted with the transparent substrate, an epoxy type photocurable adhesive, Laxtruck LC0629B (manufactured by To a Gousei Co., Ltd.) being applied as a sealing material onto the periphery of the glass plate, and then the adhesive was cured by UV ray irradiation from the glass plate to seal. Thus, a lighting device as shown in FIG. 5 or 6 was prepared and evaluated.

External quantum efficiency and emission life time were measured in the following way.
(External Quantum Efficiency)

External quantum efficiency (%) was measured in the prepared Organic EL Element by applying a constant current of 2.5 mA/cm$^2$ in dry nitrogen gas atmosphere at 23° C.

A spectrum radiation luminance meter CS-1000, manufactured by Konica Minolta Sensing Inc., was used for the measurement. The measured results are each expressed by relative values when the results of Organic EL Element 2-1 are set at 100, respectively.
(Lifetime)

The organic EL element is driven by applying a constant electric current of 2.5 mA/cm$^2$ under desiccated nitrogen atmosphere and the time ($\tau^{0.5}$) necessary for decreasing the luminance of emitted light by ½ of that at the initial time of emission of light was measured and defined as indicator of the lifetime. The spectrum radiation luminance meter CS-1000, manufactured by Konica Minolta Sensing Inc., was also used for the measurement.

The measured results are each expressed by relative values when the results of Organic EL Element 2-1 are set at 100, respectively.

TABLE 2

|  | Compound | Composing ratio (mass) | External Quantum Efficiency | Lifetime | Remarks |
|---|---|---|---|---|---|
| **2-1 | HT-007 | 60 mg | 100 | 100 | Comparative |
| **2-2 | EX-01 | 60 mg | 99 | 122 | Comparative |
| **2-3 | EX-02 | 60 mg | 107 | 135 | Comparative |
| **2-4 | EX-03 | 60 mg | 114 | 141 | Comparative |
| **2-5 | EX-01/EX-02 | 20 mg/40 mg | 129 | 154 | Comparative |
| **2-6 | EX-02/EX-03 | 30 mg/30 mg | 121 | 136 | Comparative |
| **2-7 | EX-01/EX-03 | 30 mg/30 mg | 123 | 138 | Comparative |
| **2-8 | HT-009 | 60 mg | 104 | 115 | Comparative |
| **2-9 | HT-010 | 60 mg | 117 | 113 | Comparative |
| **2-10 | HT-017 | 60 mg | 127 | 106 | Comparative |
| **2-11 | HT-034 | 60 mg | 121 | 105 | Comparative |
| **2-12 | HT-042 | 60 mg | 129 | 132 | Comparative |
| **2-13 | HT-044 | 60 mg | 150 | 122 | Comparative |
| **2-14 | HT-047 | 60 mg | 143 | 128 | Comparative |
| **2-15 | HT-048 | 60 mg | 141 | 115 | Comparative |
| **2-16 | HT-049 | 60 mg | 144 | 122 | Comparative |
| **2-17 | HT-050 | 60 mg | 143 | 121 | Comparative |
| **2-18 | HT-051 | 60 mg | 136 | 132 | Comparative |
| **2-19 | HT-052 | 60 mg | 150 | 114 | Comparative |
| **2-20 | HT-079 | 60 mg | 146 | 121 | Comparative |
| **2-21 | HT-115 | 60 mg | 129 | 123 | Comparative |
| **2-22 | HT-119 | 60 mg | 137 | 129 | Comparative |
| **2-23 | EX-01/HT-047 | 20 mg/40 mg | 150 | 122 | Comparative |
| **2-24 | EX-02/HT-007 | 50 mg/10 mg | 129 | 115 | Comparative |
| **2-25 | EX-03/HT-009 | 30 mg/30 mg | 149 | 122 | Comparative |
| **2-26 | EX-02/HO-010 | 30 mg/30 mg | 121 | 128 | Comparative |
| **2-27 | EX-03/HT-017 | 30 mg/30 mg | 151 | 124 | Comparative |
| **2-28 | HT-009/HT-007 | 40 mg/20 mg | 204 | 551 | Invention. |
| **2-29 | HT-010/HT-007 | 40 mg/20 mg | 203 | 538 | Invention. |
| **2-30 | HT-017/HT-007 | 50 mg/10 mg | 200 | 615 | Invention. |
| **2-31 | HT-034/HT-007 | 30 mg/30 mg | 214 | 769 | Invention. |
| **2-32 | HT-042/HT-010 | 40 mg/20 mg | 191 | 462 | Invention. |
| **2-33 | HT-044/HT-007 | 50 mg/10 mg | 207 | 603 | Invention. |
| **2-34 | HT-047/HT-007 | 54 mg/6 mg | 239 | 1282 | Invention. |
| **2-35 | HT-048/HT-007 | 30 mg/30 mg | 229 | 1154 | Invention. |
| **2-36 | HT-049/HT-017 | 48 mg/12 mg | 233 | 987 | Invention. |
| **2-37 | HT-050/HT-034 | 45 mg/15 mg | 216 | 667 | Invention. |
| **2-38 | HT-051/HT-007 | 43 mg/17 mg | 230 | 962 | Invention. |
| **2-39 | HT-052/HT-033 | 42 mg/18 mg | 217 | 654 | Invention. |
| **2-40 | HT-079/HT-007 | 53 mg/7 mg | 257 | 1090 | Invention. |
| **2-41 | HT-115/HT-034 | 30 mg/30 mg | 224 | 795 | Invention. |
| **2-42 | HT-117/HT-007 | 30 mg/30 mg | 213 | 641 | Invention. |
| **2-43 | HT-119/HT-007 | 54 mg/6 mg | 233 | 810 | Invention. |

**Organic EL Element

Table 2 demonstrates the elements exhibiting high performance of external quantum efficiency and life time were obtained according to the invention.

Example 3

(Preparation of Organic EL Element 3-1: Preparation of Full Color a Display Device)

FIG. 7 shows an outline of composition of an organic EL full color a display device. An anode was formed by patterning with a pitch of 100 μm on a glass substrate 101, (NA-45 manufactured by NH Techno Glass Co., Ltd.), on which ITO transparent electrodes 102 of 100 nm was previously formed. Then non-photosensitive polyimide partitions 103 (width of 20 μm, thickness of 2.0 μm) were formed by photolithography between the ITO transparent electrodes on the glass substrate.

Hole transport layer composition described below was deposited by injection employing an ink jet head (MJ800C, manufactured by Seiko Epson Corp.) between the polyimide partitions on the ITO transparent electrodes, UV ray was irradiated for 120 seconds, and dried at 60° C. for 10 minutes, whereby hole transport layer 104 having a thickness of 40 nm was prepared.

Blue light-emitting layer composition, green light-emitting layer composition and red light-emitting layer composition described below were similarly deposited on the hole injection layer by injection employing the ink jet head. Each light-emitting layer (105B, 105G, 105R) was formed by drying process at 60° C. for 10 minutes.

Finally aluminum cathode 106 was deposited via vacuum evaporation to cover the light-emitting layer (105B, 105G, 105R), and thus a full color display device organic EL element 3-1 was prepared.

Organic EL element 3-1 exhibited blue, green and red light emission by applying voltage to each electrode and showed that it was utilized as a full color display device.

| (Composition for Hole Transport Layer) | |
|---|---|
| (Hole Transport Layer Composition) | |
| Compound HT-047 | 15 parts by mass |
| Compound HT-007 | 5 parts by mass |
| cyclohexyl benzene | 50 parts by mass |
| isopropyl biphenyl | 50 parts by mass |
| (Blue Light-Emitting Layer Composition) | |
| Host Compound 2 | 0.7 parts by mass |
| D-049 | 0.04 parts by mass |
| cyclohexyl benzene | 50 parts by mass |
| isopropyl biphenyl | 50 parts by mass |
| (Green Light-Emitting Layer Composition) | |
| Host compound 2 | 0.7 parts by mass |
| Ir-1 | 0.04 parts by mass |
| cyclohexyl benzene | 50 parts by mass |
| isopropyl biphenyl | 50 parts by mass |
| (Red Light-Emitting Layer Composition) | |
| Host Compound 2 | 0.7 parts by mass |
| Ir-14 | 0.04 parts by mass |
| cyclohexyl benzene | 50 parts by mass |
| isopropyl biphenyl | 50 parts by mass |
| (Electron Transport Layer Composition) | |
| Electron Transport Layer Composition 1 | 20 parts by mass |
| 1-butanol | 50 parts by mass |
| Isopropyl biphenyl | 50 parts by mass |

Example 4

(Preparation of White Light Emitting Organic EL Element 4-1)

Hole injection layer was provided on the substrate used in the Example 3 by such manner that a solution of 10 mg of Hole Injection Material 1 described in WO06/19270 dissolved in 10 ml of acetonitrile was applied via spin coating method at 1,500 rpm for 30 seconds and vacuum dried at 100° C. for one hour under nitrogen atmosphere. Then a solution of 40 mg of Compound HT-079 and 10 mg of Compound HT-007 were dissolved in 10 ml of toluene was applied on the hole transport layer via spin coating method at 1,500 rpm for 30 seconds in nitrogen ambient to form a layer.

Photo polymerization/cross linking was conducted by UV ray irradiation at 150° C. for 30 seconds and a hole transport layer having around 20 nm thickness was formed under nitrogen atmosphere. A solution of 100 mg of Host Compound 2, 10 mg of D-038 and 0.1 mg of Ir-9 dissolved in 10 ml of toluene was applied on the hole transport layer via spin coating method at 1,000 rpm for 30 seconds under nitrogen atmosphere to form a light emitting layer. A light emitting layer having around 50 nm was obtained by vacuum drying at 120° C. for one hour.

Then electron transport layer, lithium fluoride layer and aluminum cathode were formed in the same way as Example 2 to form white light emitting Organic EL Element 4-1, and was sealed in the same way as Example 2.

Almost white light emitting was observed by applying electric power to obtained Organic EL Element 4-1, and showed that it was utilized as a lighting device. Similarly white light emitting was observed when the host compound was replaced by other compound according to the invention.

Example 5

(Preparation of Organic EL Film 5-1)

A 30 mm×30 mm×1.1 mm quartz substrate was subjected to ultrasonic cleaning employing isopropyl alcohol, followed by drying via desiccated nitrogen gas and cleaning via UV ozone for 5 minutes, then was set on a spin coater obtained in the market. A solution, which was prepared by dissolving 100 mg of Ex-04 in 10 ml of toluene, was applied onto the substrate at 1,500 rpm for 30 seconds via a spin coating method, was dried via vacuum drying at 25° C. for one hour and a film was prepared.

UV ray was irradiated to the obtained film at 80° C. for 90 seconds and formed film of the polymer compound having structural unit of Ex-04 (Organic EL Film 5-1).

Absorbing spectrum was measured by a spectrometer U-3300 manufactured by Hitachi Ltd., for the obtained Organic EL Film 5-1.

Host Compound 2

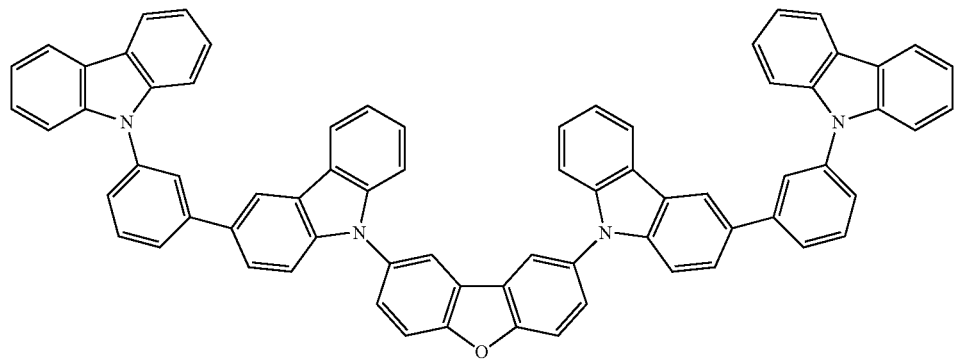

(Preparation of Organic EL Films 5-2 through 5-4

Organic EL Films 5-2 through 5-4 were prepared in the same manner as Organic EL Film 5-1 preparation except that compounds shown in Table 3 were employed in place of EX-04.

(Preparation of Organic EL Films 5-5 through 5-8)

Organic EL Films 5-5 through 5-8 were prepared in the same manner as Organic EL Film 5-1 preparation except that compounds shown in Table 3 were employed in place of EX-04.

EX-04

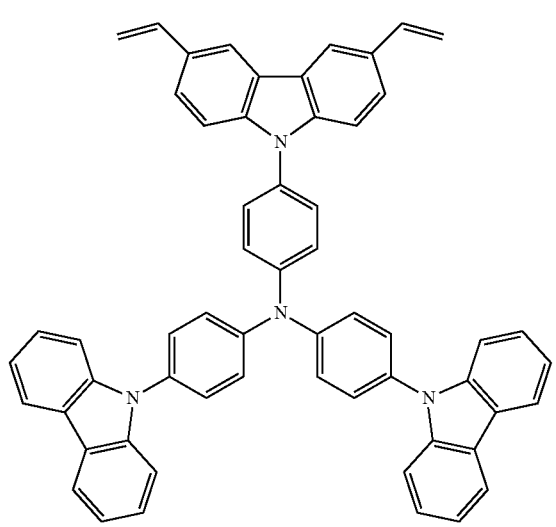

(Evaluation of Durability of Organic EL Element Against Solvent): Hardening Property of the Organic EL Material Durability of the films against solvent was evaluated for the obtained organic EL film to evaluate the hardening property of the organic EL materials.

Each of obtained organic EL films 5-1 through 5-8 was immersed vertically in toluene, allowed to stand for 3 seconds in a state being immersed, then pulled out, and vacuum dried at 25° C. for one hour.

Absorbing spectrum of each of organic EL films 5-1 through 5-8 before and after immersion was measured, and absorbance at the maximum wavelength in the range of 200 to 250 nm before and after the immersion was compared. They were ranked shown below.

A: Value of (absorbance after immersion/absorbance before immersion) is 0.98 or more.
B: Value of (absorbance after immersion/absorbance before immersion) is more than 0.94 and not more than 0.98.
C: Value of (absorbance after immersion/absorbance before immersion) is more than 0.90 and not more than 0.94.
D: Value of (absorbance after immersion/absorbance before immersion) is not more than 0.90.

The organic EL films of the invention prefer to the comparative sample in durability against solvent, as described above.

Example 6

(Preparation of Organic EL Element 6-1)

An anode was fanned by patterning on a glass substrate, NA-45 manufactured by NH Techno Glass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by desiccated nitrogen gas and subjected to ozone cleaning for 5 minutes.

Solution of poly(3,4-ethylenedioxythiophene)-polystyrene sulfonate (PEDOT/PSS, BAYTRON P Al 4083, manufactured by Bayer AG) diluted with deionized water to 70% was applied on the transparent substrate via spin coating method at 3,500 rpm for 30 seconds and dried at 200° C. for one hour, and a hole transport layer having 20 nm thickness was formed.

The substrate was moved to nitrogen ambient, solution prepared by dissolving 50 mg of EX-04 in 10 ml of toluene was applied on the hole transport layer via spin coating method at 1,500 rpm for 30 seconds to form a layer.

Photo polymerization/cross linking was conducted by UV ray irradiation at 120° C. for 60 seconds and a second hole transport layer having around 20 nm thickness was formed under nitrogen atmosphere.

A solution of 100 mg of Host Compound 2 and 10 mg of Ir-15 dissolved in 10 ml of toluene was applied on the second hole transport layer via spin coating method at 1,000 rpm for 30 seconds. A light emitting layer having around 50 nm was obtained by vacuum drying at 1.20° C. for one hour.

A solution of 50 mg of Electron Transport Material 2 dissolved in 10 ml of 1-butanol was applied on the light emitting layer via spin coating method at 5,000 rpm for 30 seconds to form a layer. An electron transport layer having around 15 nm was obtained by vacuum drying at 60° C. for one hour.

The substrate was fixed on a substrate holder of the vacuum evaporator, and pressure in the vacuum chamber was reduced to $4\times10^{-4}$ Pa, then lithium fluoride and aluminum were deposited by evaporation to form a cathode buffer layer having 1.0 nm thickness and a cathode having 110 nm, respectively, and thus Organic EL Element 6-1 was prepared.

TABLE 3

| Organic EL Film | Compound | Component Ratio (mass) | Durability | Remarks |
|---|---|---|---|---|
| Organic EL Film 5-1 | EX-04 | 100 mg | D | Comparative |
| Organic EL Film 5-2 | HT-008 | 100 mg | C | Comparative |
| Organic EL Film 5-3 | HT-139 | 100 mg | C | Comparative |
| Organic EL Film 5-4 | HT-140 | 100 mg | D | Comparative |
| Organic EL Film 5-5 | EX-04/HT-140 | 40 mg/60 mg | D | Comparative |
| Organic EL Film 5-6 | HT-008/HT-140 | 40 mg/60 mg | B | Invention |
| Organic EL Film 5-7 | HT-139/HT-140 | 40 mg/60 mg | B | Invention |
| Organic EL Film 5-8 | HT-008/HT-041 | 40 mg/60 mg | A | Invention |

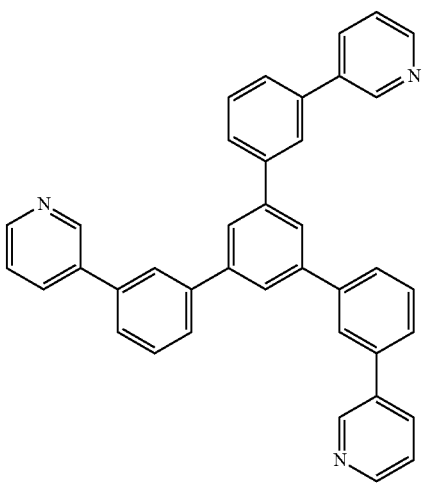

Electron Transport Material

The measured results are each expressed by relative values when the results of Organic EL Element 6-1 are set at 100, respectively.

(Lifetime)

The organic EL element is driven by applying a constant electric current of 2.5 mA/cm$^2$ under desiccated nitrogen atmosphere and the time ($\tau^{0.5}$) necessary for decreasing the luminance of emitted light by ½ of that at the initial time of emission of light was measured and defined as indicator of the lifetime. The spectrum radiation luminance meter CS-1000, manufactured by Konica Minolta Sensing Inc., was also used for the measurement.

The measured results are each expressed by relative values when the results of Organic EL Element 2-1 are set at 100, respectively.

The result was shown in the following table.

TABLE 4

| | Compound | Component Ratio (mass) | External Quantum Efficiency | Lifetime | Remarks |
|---|---|---|---|---|---|
| Organic EL Element 6-1 | EX-04 | 100 mg | 100 | 100 | Comparative |
| Organic EL Element 6-2 | HT-008 | 100 mg | 117 | 125 | Comparative |
| Organic EL Element 6-3 | HT-139 | 100 mg | 113 | 117 | Comparative |
| Organic EL Element 6-4 | HT-140 | 100 mg | 106 | 110 | Comparative |
| Organic EL Element 6-5 | EX-04/HT-140 | 40 mg/60 mg | 104 | 105 | Comparative |
| Organic EL Element 6-6 | HT-008/HT-140 | 40 mg/60 mg | 169 | 280 | Invention |
| Organic EL Element 6-7 | HT-139/HT-140 | 40 mg/60 mg | 154 | 240 | Invention |
| Organic EL Element 6-8 | HT-008/HT-041 | 40 mg/60 mg | 186 | 330 | Invention |
| Organic EL Element 6-9 | HT-008/HT-041 | 8 mg/92 mg | 184 | 360 | Invention |

(Preparation of Organic EL Elements 6-2 Through 6-9)

Organic EL Elements 6-2 through 6-9 were prepared in the same manner as Organic EL Elements 6-1 preparation except that compounds shown below were employed in place of EX-04.

Each of non-light emitting surface of the prepared Organic EL Elements was covered with a glass case, and a sealing glass substrate having a thickness of 300 μm was superposed as a sealing substrate on the cathode so as to be contacted with the transparent substrate, an epoxy type photocurable adhesive, Laxtruck LC0629B (manufactured by To a Gousei Co., Ltd.) being applied as a sealing material onto the periphery of the glass plate, and then the adhesive was cured by UV ray irradiation from the glass plate to seal. Thus, a lighting device as shown in FIG. 5 or 6 was prepared and evaluated.

External quantum efficiency and emission life time were measured in the following way.

(External Quantum Efficiency)

External quantum efficiency (%) was measured in the prepared Organic EL Element by applying a constant current of 2.5 mA/cm$^2$ in dry nitrogen gas atmosphere at 23° C.

A spectrum radiation luminance meter CS-1000, manufactured by Konica Minolta Sensing Inc., was used for the measurement.

Table 4 demonstrates the elements exhibiting high performance of external quantum efficiency and life time were obtained according to the invention.

Example 7

(Preparation of Organic EL Film 7-1)

A 30 mm×30 mm×1.1 mm quartz substrate was subjected to ultrasonic cleaning employing isopropyl alcohol, followed by drying via desiccated nitrogen gas and cleaning via UV ozone for 5 minutes, then was set on a spin coater obtained in the market. A solution, which was prepared by dissolving 60 mg of HT-142 in 10 ml of toluene, was applied onto the substrate at 900 rpm for 30 seconds via a spin coating method, was dried via vacuum drying at 25° C. for one hour and a film having a thickness of around 25 nm was prepared.

UV ray was irradiated to the obtained film at 130° C. for 40 seconds and formed film of the polymer compound having structural unit of HT-142 (Organic EL Film 7-1).

(Preparation of Organic EL Films 7-2)

Organic EL Films 7-2 through 7-4 were prepared in the same manner as Organic EL Film 7-1 preparation except that mixture of 40 mg of HT-142 and 20 mg of bis[2-(1propenyloxy)ethyl]fumarate were employed in place of HT-142.

(Preparation of Organic EL Films 7-3 through 7-6)

Organic EL Films 7-3 through 7-6 were prepared in the same manner as Organic EL Film 5-1 preparation except that compounds shown in Table 5 were employed in place of HT-142.

(Smoothness Evaluation of Organic EL Films): Smoothness Evaluation Before and After Immersion into Solvent Average roughness (Ra) at center part of 50 μm square was measured via an interatomic force microscope (AFM) as for each of the films after UV irradiation of the obtained Organic EL films 7-3 through 7-6. The average surface roughness in relation to the invention is surface roughness defined by JIS-B 0601-1994.

Then each of the Organic EL films 7-3 through 7-6 was immersed vertically in toluene, allowed to stand for 3 seconds in a state being immersed, then pulled out, and vacuum dried at 25° C. for one hour.

Average roughness (Ra) of each film after immersion was measured in the same way as before immersion, and was ranked shown below.
A: Less than 0.44 nm
B: Not less than 0.44 nm and less than 0.49 nm
C: Not less than (149 nm and less than 0.54 nm
D: Not less than 0.54 nm The result as obtained is shown below.

TABLE 5

| Organic EL Film | Compound | Component Ratio (mass) | Average roughness (before immersion) | Average roughness (after immersion) | Remarks |
| --- | --- | --- | --- | --- | --- |
| Organic EL Film 7-1 | HT-142 | 60 mg | C | D | Comparative |
| Organic EL Film 7-2 | HT-142/bis[2-(1-propenyloxy)ethyl] fumarate | 40 mg/20 mg | C | C | Comparative |
| Organic EL Film 7-3 | EX-01/bis[2-(1-propenyloxy)ethyl] fumarate | 30 mg/30 mg | C | D | Comparative |
| Organic EL Film 7-4 | HT-142/HT-143 | 30 mg/30 mg | A | B | Invention |
| Organic EL Film 7-5 | HT-142/HT-057 | 10 mg/50 mg | A | A | Invention |
| Organic EL Film 7-6 | HT-014/HT-057 | 5 mg/55 mg | A | A | Invention |

It is apparent that the organic EL films of the invention give films having high surface smoothness in both of films before and after immersion in solvent, and keep high surface smoothness after exposure to solvent, in comparison with the comparative organic EL films.

Example 8

(Preparation of Organic EL Element 8-1)

An anode was formed by patterning on a glass substrate, NA-45 manufactured by NH Techno Glass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by desiccated nitrogen gas and subjected to ozone cleaning for 5 minutes.

Solution of poly(3,4-ethylenedioxythiophene)-polystyrene sulfonate (PEDOT/PSS, BAYTRON P Al 4083, manufactured by Bayer AG) diluted with deionized water to 70% was applied on the transparent substrate via spin coating method at 3,000 rpm for 30 seconds and dried at 200° C. for one hour, and a hole transport layer having 20 nm thickness was formed.

The substrate was moved to nitrogen ambient, solution prepared by dissolving 50 mg of HT142 in 10 ml of toluene was applied on the hole transport layer via spin coating method at 1,500 rpm for 30 seconds to form a layer.

Photo polymerization/cross linking was conducted by UV ray irradiation at 140° C. for 40 seconds and a second hole transport layer having around 20 nm thickness was formed under nitrogen atmosphere.

A solution of 100 mg of Host Compound 3 and 10 mg of Ir-12 dissolved in 10 ml of toluene was applied on the second hole transport layer via spin coating method at 1,000 rpm for 30 seconds. A light emitting layer having around 50 nm was obtained by vacuum drying at 120° C. for one hour.

The substrate was fixed on a substrate holder of the vacuum evaporator, and pressure in the vacuum chamber was reduced to $4 \times 10^{-4}$ Pa, Electron Transport Material 3 was deposited by evaporation in 20 nm thickness to form a first electron transport layer.

Consequently, Electron Transport Material 4 was deposited by evaporation in 10 nm thickness to form a second electron transport layer.

Cathode buffer layer of lithium fluoride layer having thickness of 0.5 nm and aluminum cathode of 110 nm were deposited by evaporation to prepare Organic EL Element 8-1.

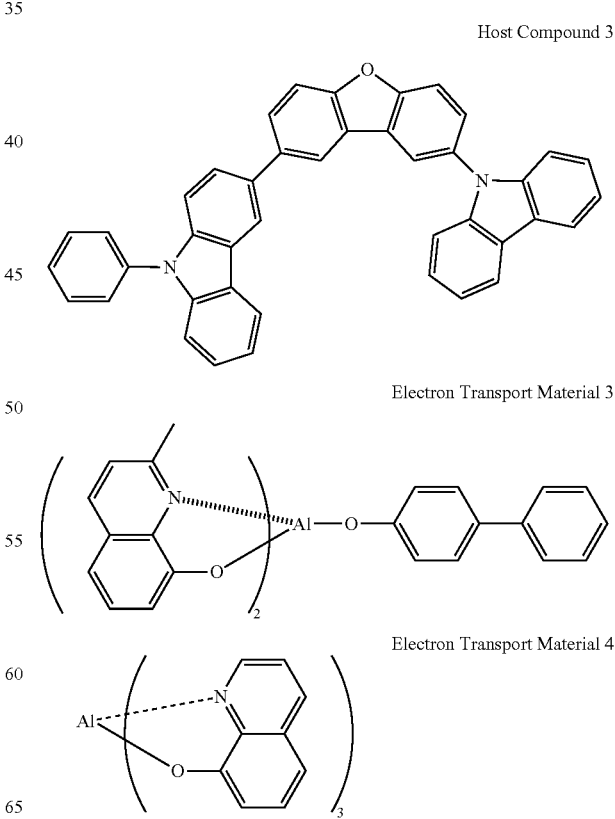

(Preparation of Organic EL Elements 8-2 Through 8-6)

Organic EL Elements 8-2 through 8-6 were prepared in the same manner as Organic EL Element 8-1 preparation except that compounds shown in Table 6 were employed in place of HT-142.

Each of non-light emitting surface of the prepared Organic EL Elements was covered with a glass case, and a sealing glass substrate having a thickness of 300 μm was superposed as a sealing substrate on the cathode so as to be contacted with the transparent substrate, an epoxy type photocurable adhesive, Laxtruck LC0629B (manufactured by Toa Gousei Co., Ltd.) being applied as a sealing material onto the periphery of the glass plate, and then the adhesive was cured by UV ray irradiation from the glass plate to seal. Thus, a lighting device as shown in FIG. 5 or 6 was prepared and evaluated.

The obtained Organic EL Elements were evaluated and the result is shown in Table 6.

(External Quantum Efficiency and Lifetime)

Evaluation was conducted in the same way as Example 2. External quantum efficiency and lifetime were shown in terms of relative values when the results of Organic EL Element 8-1 are set at 100, respectively.

(Voltage Rise-Up Ratio)

Voltage at initial stage and after 150 hours driven at constant current of 6 mA/cm² was measured, respectively. Relative value of voltage after 100 hors to initial voltage was set as the voltage rise-up ratio.

The result is shown below.

202: glass cover
208: nitrogen gas
209: moisture capturing agent

The invention claimed is:

1. An organic electroluminescent element comprising plural organic compound layers including a light-emitting layer and a hole transport layer interposed between an anode and a cathode, a phosphorescent light-emitting compound contained in the light-emitting layer emitting light, wherein,
the hole-transport layer contains two or more polymerizable compounds represented by Formula (1) which are different from each other or a polymer compound having a structural unit derived from two or more of the polymerizable compounds represented by Formula (1) which are different from each other,

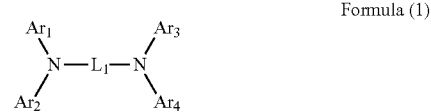

Formula (1)

in Formula (1), $L_1$ represents a divalent bonding group containing an aromatic ring which is selected from the group consisting of a phenylene group, a biphenylene group, a fluorenylene group, a terphenylene group, a quarterphenylene group, a dibenzofuranylene group, a dibenzothiophenylene and a thiophene group, $Ar_1$ through $Ar_4$ represent an aromatic group, provided that at least two of $Ar_1$ through $Ar_4$ contain a polymerizable group as a substituent.

TABLE 6

| | Compound | Component Ratio (mass) | External Quantum Efficiency | Lifetime | Voltage Rise-Up Ratio | Remarks |
|---|---|---|---|---|---|---|
| Organic EL Film 8-1 | HT-142 | 60 mg | 100 | 100 | 122 | Comparative |
| Organic EL Film 8-2 | HT-142/bis [2-(1-propenyloxy)ethyl] fumarate | 40 mg/20 mg | 70 | 64 | 138 | Comparative |
| Organic EL Film 8-3 | EX-01/bis [2-(1-propenyloxy)ethyl] fumarate | 50 mg/10 mg | 79 | 83 | 131 | Comparative |
| Organic EL Film 8-4 | HT-142/HT-143 | 20 mg/40 mg | 190 | 320 | 113 | Invention |
| Organic EL Film 8-5 | HT-142/HT-057 | 5 mg/55 mg | 182 | 370 | 109 | Invention |
| Organic EL Film 8-6 | HT-014/HT-057 | 4 mg/56 mg | 188 | 421 | 106 | Invention |

It is understood that element having much better performance in any of external quantum efficiency, lifetime and voltage rise-up ratio according to the invention as shown in Table 6.

DESCRIPTION OF SYMBOLS

1: display
3: pixel
5: scanning line
6: data line
7: electric source line
10: organic EL element
11: switching transistor
12: driving transistor
13: capacitor
A: display section
B: control section
101: glass substrate
102: ITO transparent electrode
103: partition
104: hole transport layer
105B, 105G, 105R: light-emitting layer
207: glass substrate having transparent electrode
206: organic EL layer
205: cathode 2. The organic electroluminescent element of claim 1, wherein the polymerizable group is represented by any one of Formulas (a-1) through (a-3),

Formula (a-1)

Formula (a-2)

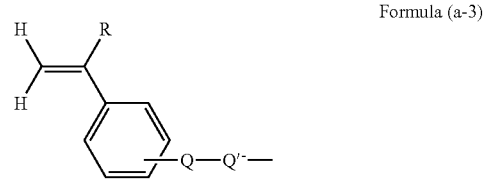

Formula (a-3)

in Formulas (a-1) through (a-3), R represents a hydrogen atom or a methyl group; Q represents a single bond, a bonding group represented by —(CH$_2$)— or —O—, or a 2-valent bonding group composed of plural groups of —$(CH_2)_n$— or —O—; and Q' represents a bonding group of —$(CH_2)_n$— or —O—, or a 2-valent bonding group composed of plural groups of —$(CH_2)$— or —O—, wherein n represents an integer of 1 or more.

3. The organic electroluminescent element of claim 2, wherein the polymerizable group is represented by Formula (a-1).

4. The organic electroluminescent element of claim 2, wherein Q in the Formula (a-1) is a single bond.

5. The organic electroluminescent element of claim 1, wherein $L_1$ in Formula (1) is a biphenylene group.

6. The organic electroluminescent element of claim 3, wherein Formula (1) is represented by Formula (3),

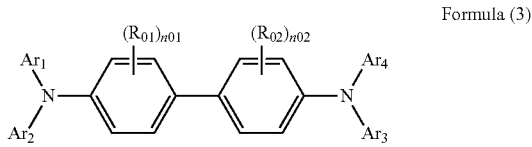

Formula (3)

in Formula (3), $Ar_1$ to $Ar_4$ represents an aromatic group; $R_{01}$ and $R_{02}$ represent a substituent; and n01 and n02 each represent an integer of 0 to 4, provided that at least two of $Ar_1$ to $Ar_4$ have a polymerizable group as a substituent.

7. The organic electroluminescent element of claim 6, wherein $Ar_1$ and $Ar_3$ represent an aromatic group having a polymerizable group as a substituent in the Formula (3).

8. The organic electroluminescent element of claim 1, wherein $L_1$ in Formula (1) is a phenylene group.

9. The organic electroluminescent element of claim 1, wherein Formula (1) is represented by Formula (6),

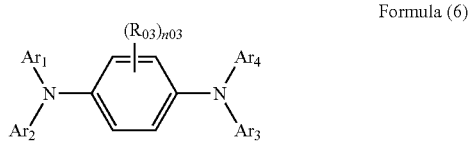

Formula (6)

in Formula (6), $Ar_1$ to $Ar_4$ represent an aromatic group, provided that at least two of $Ar_1$ to $Ar_4$ have a polymerizable group as a substituent; $R_{03}$ represents a substituent; and n03 represent an integer of 0 through 4.

10. The organic electroluminescent element of claim 9, wherein $Ar_1$ and $Ar_3$ represent an aromatic group having a polymerizable group as a substituent in the Formula (6).

11. The organic electroluminescent element of claim 1, wherein $Ar_1$ and $Ar_3$ represent an aromatic group having a polymerizable group as a substituent in Formula (1).

12. The organic electroluminescent element of claim 1, wherein the aromatic group having a polymerizable group as a substituent among $Ar_1$ to $Ar_4$ is a phenyl group.

13. The organic electroluminescent element of claim 1, wherein the hole transport layer is manufactured via a wet process forming a film.

14. The organic electroluminescent element of claim 1, wherein the hole transport layer is manufactured via processes in which after film forming by two or more polymerizable compounds represented by Formula (1) by a wet process, the polymerizable compounds are polymerized to form the hole transport layer.

15. The organic electroluminescent element of claim 1, wherein the light-emitting layer is manufactured via a wet process forming a film.

16. The organic electroluminescent element of claim 1, wherein at least one of the phosphorescent light-emitting compounds contained in the light-emitting layer is represented by Formula (2),

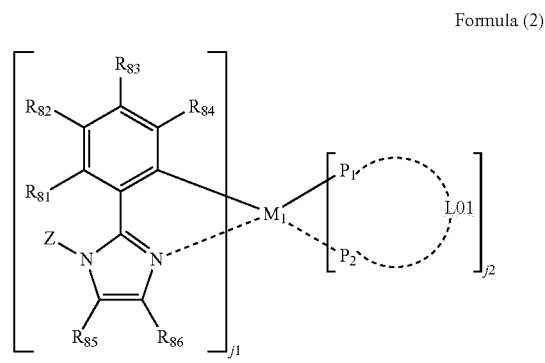

Formula (2)

in the Formula, Z represents a hydrocarbon ring group, an aromatic heterocyclic ring group or a heterocyclic group; $R_{81}$ through $R_{86}$ represent a hydrogen atom or a substituent; $P_1$-L01-$P_2$ represents a 2-dentate ligand, $P_1$ and $P_2$ being independently a carbon atom, a nitrogen atom or oxygen atom; L01 represents an atomic group forming a 2-dentate ligand together with $P_1$ and $P_2$; j1 represents an integer of 1 to 3, and j2 represent an integer of 0 to 2 wherein j1+j2 is 2 or 3; and $M_1$ is a metal element of 8 to 10 group in the periodic table.

17. The organic electroluminescent element of claim 1, wherein the phosphorescent light-emitting compound is an iridium complex.

18. The organic electroluminescent element of claim 1, which emits white light.

19. A lighting device comprising the organic electroluminescent element of claim 1.

20. A display device comprising the organic electroluminescent element of claim 1.

* * * * *